US012733355B2

(12) United States Patent
Park et al.

(10) Patent No.: US 12,733,355 B2
(45) Date of Patent: Sep. 8, 2026

(54) DISPLAY PANEL, DISPLAY DEVICE, AND METHOD OF MANUFACTURING DISPLAY PANEL WITH HOLE IN INSULATION FILM ABOVE CHANNEL FOR TOP ELECTRODE PLACEMENT

(71) Applicant: LG Display Co., Ltd., Seoul (KR)

(72) Inventors: JeeHo Park, Seoul (KR); Sohyung Lee, Paju-si (KR); JungHyun Lee, Seoul (KR)

(73) Assignee: LG Display Co., Ltd., Seoul (KR)

(*) Notice: Subject to any disclaimer, the term of this patent is extended or adjusted under 35 U.S.C. 154(b) by 395 days.

(21) Appl. No.: 18/236,245

(22) Filed: Aug. 21, 2023

(65) Prior Publication Data

US 2024/0107827 A1 Mar. 28, 2024

(30) Foreign Application Priority Data

Sep. 26, 2022 (KR) ........................ 10-2022-0121318
Jun. 14, 2023 (KR) ........................ 10-2023-0076380

(51) Int. Cl.
*H10K 59/126* (2023.01)
*H10K 59/12* (2023.01)
(Continued)

(52) U.S. Cl.
CPC ....... *H10K 59/126* (2023.02); *H10K 59/1213* (2023.02); *H10K 59/1216* (2023.02);
(Continued)

(58) Field of Classification Search
CPC ............. H10K 59/126; H10K 59/1213; H10K 59/1216; H10K 59/123; H10K 59/124;
(Continued)

(56) References Cited

U.S. PATENT DOCUMENTS

2012/0007084 A1* 1/2012 Park .................... H10D 86/423 257/E33.012
2012/0280238 A1* 11/2012 Kimura ................. H10D 30/67 438/34

(Continued)

FOREIGN PATENT DOCUMENTS

EP 4283682 A1 11/2023
KR 2008-0046446 A 5/2008

(Continued)

OTHER PUBLICATIONS

Combined Search and Examination Report dated Sep. 23, 2025 issued in UK Patent Application No. 2503497.6.

(Continued)

*Primary Examiner* — John P. Dulka
(74) *Attorney, Agent, or Firm* — PnK IP LLC

(57) ABSTRACT

Aspects of the present disclosure are directed to displayed devices wherein the characteristics of the transistor(s) may be maintained. In one aspect, a display panel includes a substrate; a first active layer on the substrate and including a channel, a first region positioned at a first side of the channel, and a second region positioned at a second side of the channel; a gate insulating film on the first active layer; a first electrode on the gate insulating film and electrically connected to the first region; a second electrode on the gate insulating film and electrically connected to the second (Continued)

region; a first insulating film on the gate insulating film and including a first hole overlapping at least a portion of the channel; and a third electrode overlapping the first hole.

21 Claims, 57 Drawing Sheets

(51) Int. Cl.

| | |
|---|---|
| ***H10K 59/121*** | (2023.01) |
| ***H10K 59/123*** | (2023.01) |
| ***H10K 59/124*** | (2023.01) |
| ***H10K 102/00*** | (2023.01) |

(52) U.S. Cl.
CPC ......... *H10K 59/123* (2023.02); *H10K 59/124* (2023.02); *H10K 59/1201* (2023.02); *H10K 2102/351* (2023.02)

(58) Field of Classification Search
CPC ......... H10K 59/1201; H10K 2102/351; H10K 59/122; H10D 86/481; H10D 86/60
See application file for complete search history.

(56) References Cited

U.S. PATENT DOCUMENTS

| | | | | |
|---|---|---|---|---|
| 2013/0037818 | A1 | 2/2013 | Lee et al. | |
| 2014/0312320 | A1 | 10/2014 | Yang et al. | |
| 2016/0274394 | A1* | 9/2016 | Yamazaki | G02F 1/1368 |
| 2016/0293771 | A1 | 10/2016 | Long et al. | |
| 2021/0050432 | A1 | 2/2021 | Chen | |
| 2022/0199718 | A1 | 6/2022 | Lee et al. | |
| 2023/0411409 | A1* | 12/2023 | Yun | H10D 30/6739 |

FOREIGN PATENT DOCUMENTS

| | | | |
|---|---|---|---|
| KR | 20210145107 | A | 12/2021 |
| KR | 10-2022-0090088 | A | 6/2022 |

OTHER PUBLICATIONS

GB Office Action dated Feb. 20, 2024 issued in Patent Application No. 2312843.2 (11 pages).

* cited by examiner

OLED
570
690
680
602
602b
602c
602a
T2
601
601b
601a
600
NEA
EA
NEA
NEA
F
E
D
C
B
A
Cst
Cst
530
510
552
522a
522b
522
523
520
521b
521a
521
670
563b
563a
563
CH2
604
603
T1
551
CH1

OLED
680
690
570
602
602a
602b
602c
670
563c
563b
563a
563
CH2
604
603
T1
551
CH1
521a
521b
521
523
520
522b
522a
522
552
510
530
Cst
570c
570b
570a
570
T2
601b
601a
601
600
A
B
C
D
E
F
NEA
EA

Figure 9A:
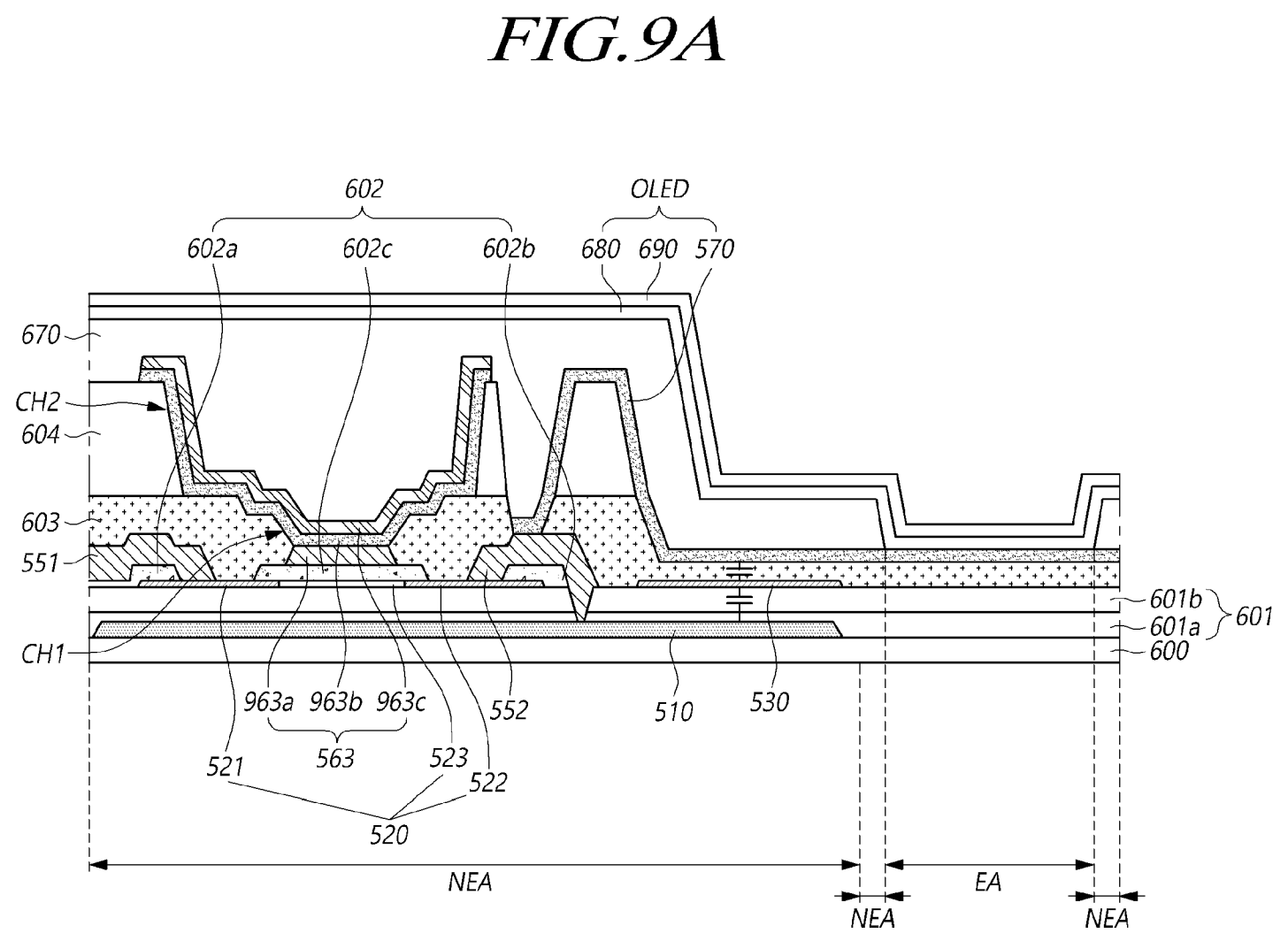

OLED 570 690 680 602 602b 602c 602a 601b 601a 600 601 NEA EA NEA NEA 530 510 552 522 523 963c 963b 963a 563 521 520 670 CH2 604 603 551 CH1

FIG.9B 601
601b
601a
600
NEA
EA
NEA
NEA
OLED
570
680
690
552
530
510
563
602b
602c
602
522
523
520
521
620a
W3
W2
W1
670
604
CH2
551
603
CH1

601b
601a
600
601
NEA
EA
NEA
NEA
OLED
570
680
690
530
510
570
1071b
1071a
563
602c
522
523
520
521
W3
W2
W1
563
1063a
1063b
670
604
CH2
1051b
1051a
551

601
601b
601a
600
NEA
EA
NEA
NEA
OLED
570
680
690
530
510
570
1071b
1071a
563
602c
522
523
520
521
W3
W2
W1
1063d
1063b
1063a
563
670
604
CH2
1051b
1051a
551

FIG.11
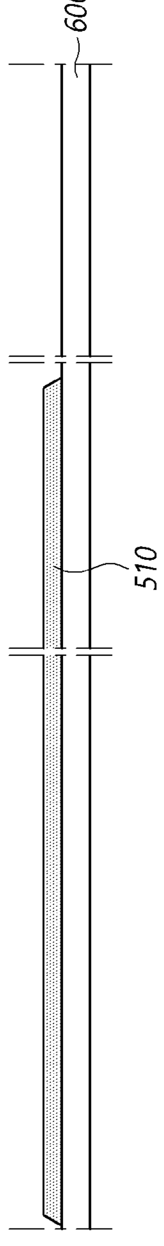
600
510

FIG.12
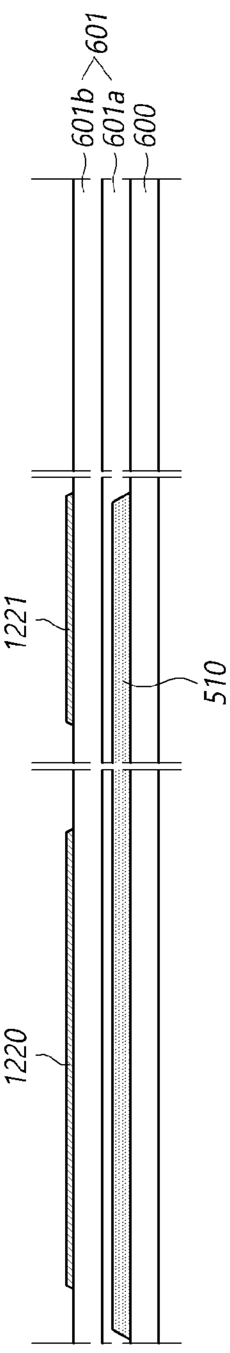
601b
601
601a
600
1221
510
1220

T2
601
601b
601a
600
530
510
602b
552
522
602
602c
523
520
602a
521
A
CH2
604
603
551
CH1

602
602a
602c
602b
563
CH2
604
603
551
CH1
A
521
523
522
520
552
510
530
600
601a
601b
601
T2

570
602
602b
602c
602a
670
563
CH2
604
603
551
CH1
T1
T2
601
601b
601a
600
Cst
Cst
530
510
552
522
523
520
521
A
B
C
D
E
F
NEA
EA
NEA
NEA 602
602b
602c
602a
563
563a
563b
570
510
552
522
523
520
521
CH2
604
603
551
CH1
T1
T2
601
601b
601a
600
A
B
C
D
E
F
NEA
EA
NEA
NEA

T2
601
601b
601a
600
NEA
EA
NEA
F
E
D
C
B
A
570
510
602b
552
602
522
602c
523
520
602a
521
563
563a
563b
CH2
604
603
551
CH1
T1
NEA 570
570c
570b
570a
T2
601
601b
601a
600
NEA
EA
NEA
NEA
A
B
C
D
E
F
602
602a
602b
602c
510
552
522a
522b
522
523
520
521b
521a
521
563c
563b
563a
563
CH2
604
603
551
CH1
T1

570
570c
570b
570a
T2
601
601b
601a
600
NEA
EA
NEA
F
E
D
C
B
A
670
570
510
552
522a
522
522b
523
520
521b
521
521a
602
602b
602c
602a
563c
563b
563a
563
CH2
604
603
T1
551
CH1
NEA 601b
601a
601
600
2854
751
530
510
1452
552
522a
522b
522
523
520
1451
521a
521b
521
551

601b
601a
601
600
530
751
510
552
522a
522b
522
523
520
521b
521a
521
551

601b
601a
601
600
530
510
751
552
522a
522b
522
523
520
521b
521a
521
CH2
604
CH1
603
551

570
601b
601a
601
600
NEA
EA
570
530
510
751
552
522a
522b
522
NEA
523
520
563
563a
563b
521b
521a
521
CH2
604
CH1
603
551

670
570
563
563a
563b
CH2
604
CH1
603
551
552
751
510
530
570
601b
601a
601
600
522a
522b
522
523
521a
521b
521
520
NEA
EA
NEA

FIG. 40

601b
601a
600
601
NEA
EA
NEA
NEA
530
510
604
603
602c
522
523
520
521
CH1

601
601b
601a
600
NEA
EA
NEA
NEA
570
530
510
570
1071b 1071a
563
602c
522
523
520
521
563
1063a 1063b
670
604
CH2
1051b
1051a
551

570
1071c
1071b
1071a
601
601b
601a
600
NEA
EA
NEA
530
510
NEA
570
1071b
1071a
563
602
522
523
520
521
563
1063a
1063b
1063d
1063c
604
CH2
1051b
1051a
551
CH1

DISPLAY PANEL, DISPLAY DEVICE, AND METHOD OF MANUFACTURING DISPLAY PANEL WITH HOLE IN INSULATION FILM ABOVE CHANNEL FOR TOP ELECTRODE PLACEMENT

CROSS-REFERENCE TO RELATED APPLICATIONS

This application claims priority to Korean Patent Application No. 10-2022-0121318, filed on Sep. 26, 2022, and Korean Patent Application No. 10-2023-0076380, filed on Jun. 14, 2023, which is hereby incorporated by reference for all purposes as if fully set forth herein.

BACKGROUND

Field of the Disclosure

Aspects of the present disclosure relate to a display panel, a display device, and a method of manufacturing a display panel.

Description of the Background

Transistors are widely used as switching devices or driving devices in the field of electronic devices.

In particular, thin film transistors may be manufactured on glass substrates or plastic substrates and thus may be widely used as driving devices or switching devices in display devices such as liquid crystal display devices, organic light-emitting display devices, etc.

In a display device including such a thin film transistor, there is often a problem that characteristics of the transistor are degraded due to internal light, parasitic capacitance increases, or an aperture ratio decreases.

SUMMARY

The present disclosure is directed to display panels, display devices, and a method of manufacturing a display panel that address the above-mentioned shortcomings of conventional display devices in which characteristics of a transistor are degraded by internal light, driving characteristics are degraded by parasitic capacitance, and an area of an emission area decreases due to a decrease in aperture ratio.

An aspect of the present disclosure is to provide a display panel, a display device, and a method of manufacturing a display panel in which characteristics of a transistor are prevented from being degraded due to internal light being incident on an active layer.

Another aspect of the present disclosure is to provide a display panel, a display device, and a method of manufacturing a display panel of which driving characteristics are prevented from being degraded due to an increase in parasitic capacitance.

Another aspect of the present disclosure is to provide a display panel, a display device, and a method of manufacturing a display panel in which a wide area of an opening (emission area) may be secured due to a structure capable of increasing capacity of a storage capacitor positioned in a small area.

In one aspect, a display panel includes a substrate; a first active layer on the substrate and including a channel, a first region positioned at a first side of the channel, and a second region positioned at a second side of the channel; a gate insulating film on the first active layer; a first electrode on the gate insulating film and electrically connected to the first region; a second electrode on the gate insulating film and electrically connected to the second region; a first insulating film on the gate insulating film and including a first hole overlapping at least a portion of the channel; and a third electrode overlapping the first hole.

In another aspect, a region of the first active layer not overlapping the gate insulating film is a conductive region.

In another aspect, the first region and the second region include conductive regions.

In another aspect, the gate insulating film includes a first gate insulator overlapping a portion of the first region; a second gate insulator overlapping a portion of the second region; and a third gate insulator overlapping an entirety of the channel region.

In another aspect, at least a portion of an upper surface of the third gate insulator overlaps the first hole.

In another aspect, the first insulating film includes at least one stepped portion in the first hole.

In another aspect, the third electrode overlaps at least a portion of each of the first region and the second region.

In another aspect, each of the first electrode and the second electrode is one of a source electrode and a drain electrode; and the third electrode is a gate electrode.

In another aspect, the display panel further includes a second insulating film on the first insulating film and having a second hole overlapping at least a portion of the first hole, wherein the third electrode is inside the first hole and the second hole and covers a portion of an upper surface of the second insulating film.

In another aspect, the third electrode includes a first gate electrode layer, a second gate electrode layer, and a third gate electrode layer; the first gate electrode layer is on the gate insulating film overlapping the channel; the second gate electrode layer is on the first gate electrode layer, in the first hole and the second hole, and covers the upper surface of the second insulating film; and the third gate electrode layer is on the second gate electrode layer.

In another aspect, the first gate electrode layer and the third gate electrode layer are made of a metal material; and the second gate electrode layer is made of a transparent conductive material.

In another aspect, the display panel further includes a pixel electrode on the second insulating film, wherein the pixel electrode is coplanar with the second gate electrode layer.

In another aspect, the display panel further includes a light shield below the first active layer, wherein: the light shield overlaps a conductive region of a second active layer spaced apart from the first active layer; the display panel includes a pixel electrode overlapping the light shield and the conductive region of the second active layer; and the light shield, the conductive region of the second active layer, and the pixel electrode overlap each other to form a storage capacitor.

In another aspect, the pixel electrode extends to an emission area of the display panel; and in the emission area, the display panel further includes an organic layer including an emission layer and a common electrode on the pixel electrode.

In another aspect, the pixel electrode is electrically connected to the second electrode.

In another aspect, the first electrode, the second electrode, and the third electrode are on the first insulating film; the second insulating film includes a contact hole exposing a portion of an upper surface of the second electrode; and the second electrode is electrically connected to a pixel electrode through the contact hole.

In another aspect, the display panel further includes a first auxiliary electrode and a second auxiliary electrode on the first active layer; wherein the first auxiliary electrode is on the first region; the second auxiliary electrode is on the second region; and the first auxiliary electrode and the second auxiliary electrode include a metal material or a transparent conductive material.

In another aspect, the first active layer includes conductive regions between the first region and the channel and between the second region and the channel.

In another aspect, the display panel further includes a second active layer that is coplanar with the first active layer; a third auxiliary electrode on a portion of an upper surface of the second active layer; a metal layer on the third auxiliary electrode; a pixel electrode on the metal layer; and a light shield below the second active layer, wherein the light shield, the third auxiliary electrode, and the metal layer constitute a first storage capacitor.

In another aspect, the display panel further includes a fourth auxiliary electrode on the second active layer and spaced apart from the third auxiliary electrode; and a pixel electrode on the fourth auxiliary electrode, wherein the light shield, the fourth electrode, and the pixel electrode constitute a second storage capacitor.

In another aspect, the first storage capacitor and the second storage capacitor are connected in parallel.

In another aspect, the display device includes a substrate; an active layer on the substrate; a gate insulating film on the active layer; a first electrode on the gate insulating film and electrically connected to the active layer; a second electrode disposed on the gate insulating film and electrically connected to the active layer; an insulating film having a first thickness in a non-emission area and a second thickness in an emission area, wherein the insulating film overlaps the gate insulating film in a first region, and the first thickness has a larger value than the second thickness; and a third electrode positioned in a hole within the insulating film and partially overlapping the active layer in the hole.

BRIEF DESCRIPTION OF THE DRAWINGS

The above and other aspects, features and advantages of the present disclosure will be more apparent from the following detailed description taken in conjunction with the accompanying drawings, in which:

FIGS. 6A to 6E are cross-sectional views along lines A-B, C-D, and E-F of FIG. 5 according to some aspects of the present disclosure;

FIGS. 7A TO 7C are a schematic cross-sectional views of a display devices according to some aspects of the present disclosure;

FIGS. 9A and 9B are views illustrating cross-sectional structures of display devices according to some aspects of the present disclosure;

FIGS. 11 to 21 are schematic views illustrating processes of manufacturing the display device shown in FIG. 6C;

FIGS. 39 and 40 are schematic views illustrating processes of forming a third electrode, a pixel electrode, and a bank of the display device shown in FIG. 7C;

DETAILED DESCRIPTION

Figure 1:
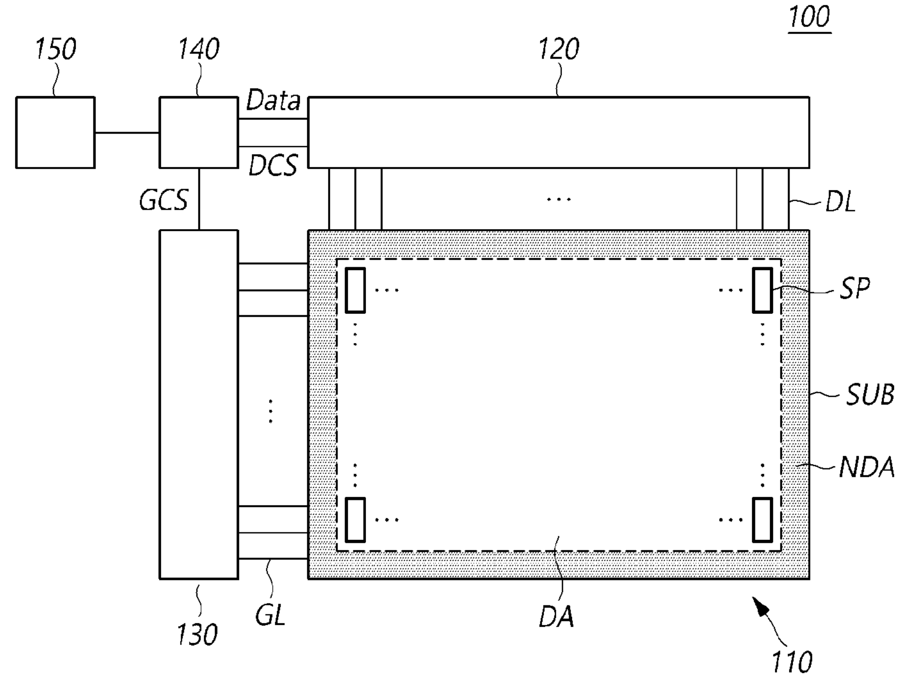
FIG. 1 is a system configuration diagram of a display device according to some aspects of the present disclosure.

Various examples of the present disclosure are discussed in detail below. While specific implementations are discussed, it should be understood that this is done for illustration purposes only. A person skilled in the relevant art will recognize that other components and configurations may be used without parting from the spirit and scope of the disclosure. Thus, the following description and drawings are illustrative and are not to be construed as limiting. Numerous specific details are described to provide a thorough understanding of the disclosure. However, in certain instances, well-known or conventional details are not described in order to avoid obscuring the description. References to one or an example embodiment in the present disclosure can be references to the same example embodiment or any example embodiment; and, such references mean at least one of the example embodiments The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as “including”, “having”, “containing”, “constituting” “make up of”, and “formed of” used herein are generally intended to allow other components to be added unless the terms are used with the term “only”. As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only may the first element "be directly connected or coupled to" or "directly contact or overlap" the second element, but a third element may also be "interposed" between the first and second elements, or the first and second elements may "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e. g., level, range, etc.) include a tolerance or error range that may be caused by various factors (e. g., process factors, internal or external impact, noise, etc.) even when a relevant description is not specified. Further, the term "may" fully encompasses all the meanings of the term "may".

When the position relation between two parts is described using the terms such as "on", "above", "below", and "next", one or more parts may be positioned between the two parts unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various examples of the present disclosure may be partially or entirely adhered to or combined with each other and may be interlocked and operated in technically various ways, and the example embodiments may be carried out independently of or in association with each other.

Hereinafter, various examples of the present disclosure will be described in detail with reference to the accompanying drawings.

FIG. 1 is a system configuration diagram of a display device according to some aspects of the present disclosure.

Referring to FIG. 1, the display device 100 according to examples of the present disclosure may include a display panel 110 and a driving circuit for driving the display panel 110.

The driving circuit may include a data driving circuit 120 and a gate driving circuit 130 and may further include a controller 140 for controlling the data driving circuit 120 and the gate driving circuit 130.

The display panel 110 may include a substrate SUB and signal lines such as a plurality of data lines DL and a plurality of gate lines GL disposed on the substrate SUB. The display panel 110 may include a plurality of subpixels SP connected to the plurality of data lines DL and the plurality of gate lines GL.

The display panel 110 may include a display area DA in which an image is displayed and a non-display area NDA in which an image is not displayed. In the display panel 110, the plurality of subpixels SP for displaying an image may be disposed in the display area DA. In the non-display area NDA, the driving circuits 120 and 130 and the controller 140 may be electrically connected or mounted, and a pad portion to which an integrated circuit (IC) or a printed circuit is connected may also be disposed.

The data driving circuit 120 may be a circuit for driving the plurality of data lines DL and may supply data signals to the plurality of data lines DL. The gate driving circuit 130 may be a circuit for driving the plurality of gate lines GL and may supply gate signals to the plurality of gate lines GL. The controller 140 may supply a data control signal DCS to the data driving circuit 120 to control an operation timing of the data driving circuit 120. The controller 140 may supply a gate control signal GCS to the gate driving circuit 130 to control an operation timing of the gate driving circuit 130.

The controller 140 may perform control such that a scanning operation is started according to a timing implemented in each frame. The controller 140 may convert input image data input from an external device to be suitable for a data signal format used by the data driving circuit 120, may supply converted image data Data to the data driving circuit 120, and may perform control such that data driving is performed at an appropriate time according to a scanning timing.

To control the gate driving circuit 130, the controller 140 may output various gate control signals GCS including gate start pulse (GSP), gate shift clock (GSC), and gate output enable (GOE) signals.

To control the data driving circuit 120, the controller 140 may output various data control signals DCS including source start pulse (SSP), source sampling clock (SSC), and source output enable (SOE) signals.

The controller 140 may be implemented as a separate component from the data driving circuit 120 or may be integrated with the data driving circuit 120 and implemented as an integrated circuit.

The data driving circuit 120 receives the image data Data from the controller 140 and supplies data voltages to the plurality of data lines DL to drive the plurality of data lines DL. Here, the data driving circuit 120 is also referred to as a source driving circuit.

The data driving circuit 120 may include one or more source driver integrated circuits (SDICs).

For example, each SDIC may be connected to the display panel 110 as a tape automated bonding (TAB) type, may be connected to a bonding pad of the display panel 110 as a chip-on-glass (COG) or chip-on-panel (COP) type, or may be implemented as a chip-on-film (COF) type and connected to the display panel 110.

The gate driving circuit 130 may output a gate signal having a turn-on level voltage or a gate signal having a turn-off level voltage under the control of the controller 140. The gate driving circuit 130 may sequentially drive the plurality of gate lines GL by sequentially supplying a gate signal having a turn-on level voltage to the plurality of gate lines GL.

The gate driving circuit 130 may be connected to the display panel 110 as a TAB type, may be connected to a bonding pad of the display panel 110 as a COG or COP type, or may be connected to the display panel 110 as a COF type. Alternatively, the gate driving circuit 130 may be formed in the non-display area NDA of the display panel 110 as a gate-in-panel (GIP) type. The gate driving circuit 130 may be disposed on or connected to the substrate SUB. That is, when the gate driving circuit 130 is the GIP type, the gate driving circuit 130 may be disposed in the non-display area NDA of the substrate SUB. When the gate driving circuit 130 is the COG type, the COF type, or the like, the gate driving circuit 130 may be connected to the substrate SUB.

Meanwhile, at least one driving circuit of the data driving circuit 120 and the gate driving circuit 130 may be disposed in the display area DA. For example, at least one driving circuit of the data driving circuit 120 and the gate driving circuit 130 may be disposed to not overlap the subpixels SP or may be disposed such that a portion or the entirety thereof overlaps the subpixels SP.

When a specific gate line GL is activated by the gate driving circuit 130, the data driving circuit 120 may convert the image data Data received from the controller 140 into an analog data voltage and may supply the analog data voltage to the plurality of data lines DL.

The data driving circuit 120 may be connected to one side (for example, an upper or lower side) of the display panel 110. According to a driving method, a panel design method, or the like, the data driving circuit 120 may be connected to two sides (for example, the upper and lower sides) of the display panel 110 or may be connected to two or more sides of four sides of the display panel 110.

The gate driving circuit 130 may be connected to one side (for example, a left side or a right side) of the display panel 110. According to a driving method, a panel design method, or the like, the gate driving circuit 130 may be connected to two sides (for example, the left and right sides) of the display panel 110 or may be connected to two or more sides of the four sides of the display panel 110.

The controller 140 may be a timing controller used in typical display technology, may be a control device, which may include the timing controller, to further perform other control functions, may be a control device different from the timing controller, or may be a circuit inside a control device. The controller 140 may be implemented with various circuits or electronic components such as an IC, a field programmable gate array (FPGA), an application specific integrated circuit (ASIC), and a processor.

The controller 140 may be mounted on a printed circuit board, a flexible printed circuit, or the like and may be electrically connected to the data driving circuit 120 and the gate driving circuit 130 through the printed circuit board or the flexible printed circuit.

The display device 100 according to examples of the present disclosure may be a display including a backlight unit such as a liquid crystal display or may be a self-luminous display such as an organic light-emitting diode (OLED) display, a quantum dot display, or a micro light-emitting diode (micro LED) display.

When the display device 100 according to examples of the present disclosure is the OLED display, each subpixel SP may include an OLED, which emits light by itself, as a light-emitting element. When the display device 100 according to examples of the present disclosure is the quantum dot display, each subpixel SP may include a light-emitting element made of quantum dots which are a semiconductor crystal that emits light by itself. When the display device 100 according to examples of the present disclosure is a micro LED display, each subpixel SP may include a micro LED, which emits light by itself and is made of an inorganic material, as a light-emitting element.

Figure 2:
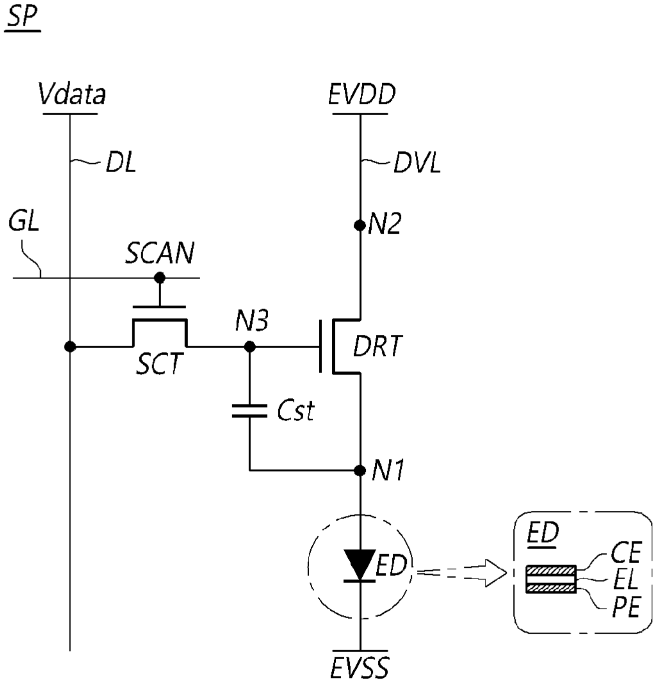
FIG. 2 is an equivalent circuit of a subpixel of a display device according to some aspects of the present disclosure.
Figure 3:
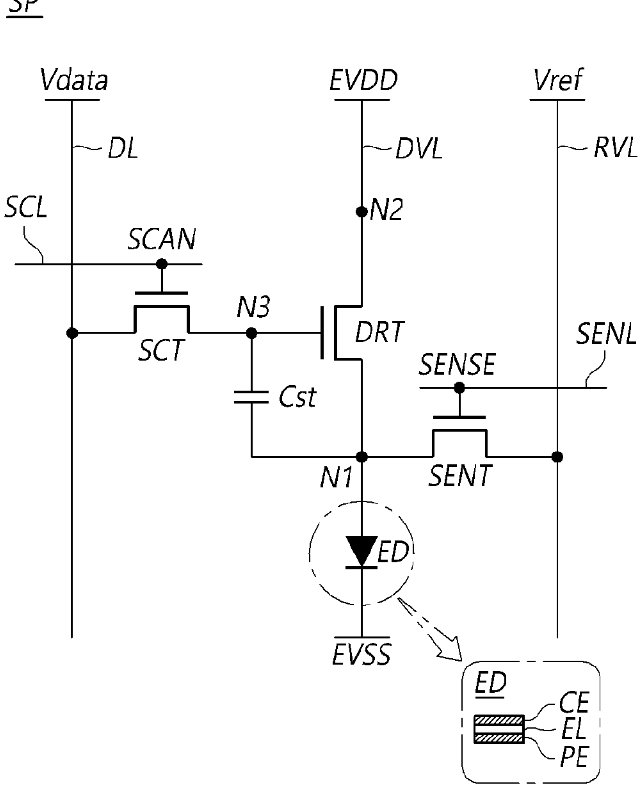
FIG. 3 is an equivalent circuit of a subpixel of a display device according to some aspects of the present disclosure.

FIG. 2 is an equivalent circuit of a subpixel SP of a display device according to some aspects of the present disclosure. FIG. 3 is equivalent circuit of a subpixel SP of a display device 100 according to some aspects of the present disclosure.

Referring to FIG. 2, each of a plurality of subpixels SP disposed on a display panel 110 of the display device 100 according to examples of the present disclosure may include a light-emitting element ED, a driving transistor DRT, a scanning transistor SCT, and a storage capacitor Cst.

Referring to FIG. 2, the light-emitting element ED may include a pixel electrode PE and a common electrode CE and may include an emission layer EL positioned between the pixel electrode PE and the common electrode CE.

The pixel electrode PE of the light-emitting element ED may be an electrode disposed in each subpixel SP, and the common electrode CE may be an electrode commonly disposed in all the subpixels SP. Here, the pixel electrode PE may be an anode, and the common electrode CE may be a cathode. In contrast, the pixel electrode PE may be a cathode, and the common electrode CE may be an anode.

For example, the light-emitting element ED may be an OLED, an LED, or a quantum dot light-emitting element.

The driving transistor DRT may be a transistor for driving the light-emitting element ED and may include a first node N1, a second node N2, and a third node N3.

The first node N1 of the driving transistor DRT may be a source node (source electrode) or a drain node (drain electrode) of the driving transistor DRT and may also be electrically connected to the common electrode CE of the light-emitting element ED. The common electrode CE of the light-emitting element ED may be connected with a base voltage EVSS. The second node N2 of the driving transistor DRT may be the drain node (drain electrode) or the source node (source electrode) of the driving transistor DRT and may also be electrically connected to a driving voltage line DVL for supplying a driving voltage EVDD. The third node N3 of the driving transistor DRT may be a gate node of the driving transistor DRT and may be electrically connected to a source node or a drain node of the scanning transistor SCT.

The scanning transistor SCT may be controlled by a scanning gate signal SCAN which is a type of a gate signal and may be connected between the third node N3 of the driving transistor DRT and a data line DL. In other words, the scanning transistor SCT may be turned on or turned off according to the scanning gate signal SCAN supplied from a scanning gate line SCL, which is a type of a gate line GL, to control a connection between the data line DL and the third node N3 of the driving transistor DRT.

The scanning transistor SCT may be turned on by the scanning gate signal SCAN having a turn-on level voltage to transmit a data voltage Vdata supplied from the data line DL to the third node N3 of the driving transistor DRT.

Here, when the scanning transistor SCT is an n-type transistor, the turn-on level voltage of the scanning gate signal SCAN may be a high level voltage. When the scanning transistor SCT is a p-type transistor, the turn-on level voltage of the scanning gate signal SCAN may be a low level voltage.

The storage capacitor Cst may be connected between the third node N3 and the first node N1 of the driving transistor DRT. The storage capacitor Cst is charged with a quantity of electric charge corresponding to a voltage difference between both ends thereof and serves to maintain the voltage difference between both ends for a set period of time. Accordingly, for the set period of time time, the corresponding subpixel SP may emit light.

Referring to FIG. 3, each of a plurality of subpixels SP disposed on a display panel 110 of the display device 100 according to examples of the present disclosure may further include a sensing transistor SENT.

The sensing transistor SENT may be controlled by a sensing gate signal SENSE which is a type of a gate signal and may be connected between a first node N1 of a driving transistor DRT and a reference voltage line RVL. In other words, the sensing transistor SENT may be turned on or turned off according to the sensing gate signal SENSE supplied from a sensing gate line SENL, which is another type of a gate line GL, to control a connection between the reference voltage line RVL and the first node N1 of the driving transistor DRT.

The sensing transistor SENT may be turned on by the sensing gate signal SENSE having a turn-on level voltage to transmit a reference voltage Vref supplied from the reference voltage line RVL to the first node N1 of the driving transistor DRT.

In addition, the sensing transistor SENT may be turned on by the sensing gate signal SENSE having a turn-on level voltage to transmit a voltage of the first node N1 of the driving transistor DRT to the reference voltage line RVL.

Here, when the sensing transistor SENT is an n-type transistor, the turn-on level voltage of the sensing gate signal SENSE may be a high level voltage. When the sensing transistor SENT is a p-type transistor, the turn-on level voltage of the sensing gate signal SENSE may be a low level voltage.

A function in which the sensing transistor SENT transmits the voltage of the first node N1 of the driving transistor DRT to the reference voltage line RVL may be used during driving for sensing a characteristic value of the subpixel SP. In this case, the voltage transmitted to the reference voltage line RVL may be a voltage for calculating the characteristic value of the subpixel SP or a voltage reflecting the characteristic value of the subpixel SP.

Each of the driving transistor DRT, a scanning transistor SCT, and the sensing transistor SENT may be an n-type transistor or a p-type transistor. In the present disclosure, for convenience of description, an example in which each of the driving transistor DRT, the scanning transistor SCT, and the sensing transistor SENT is an n-type will be described.

A storage capacitor Cst is not a parasitic capacitor (for example, Cgs or Cgd) which is an internal capacitor that may be present between a gate node and a source node (or a drain node) of the driving transistor DRT and may be an external capacitor which is intentionally designed outside the driving transistor DRT.

A scanning gate line SCL and the sensing gate line SENL may be different gate lines GL. In this case, a scanning gate signal SCAN and the sensing gate signal SENSE may be separate gate signals, and in one subpixel SP, an on/off timing of the scanning transistor SCT may be independent from an on/off timing of the sensing transistor SENT. That is, in one subpixel SP, the on/off timing of the scanning transistor SCT may be the same as or different from the on/off timing of the sensing transistor SENT.

Alternatively, the scanning gate line SCL and the sensing gate line SENL may be the same gate line GL. That is, a gate node of the scanning transistor SCT and a gate node of the sensing transistor SENT in one subpixel SP may be connected to one gate line GL. In this case, the scanning gate signal SCAN and the sensing gate signal SENSE may be the same gate signal, and in one subpixel SP, the on/off timing of the scanning transistor SCT may be the same as the on/off timing of the sensing transistor SENT.

Structures of the subpixels SP shown in FIGS. 2 and 3 are merely exemplary and non-limiting. Known or to be developed modifications to these structures are within the scope of the present disclosure. For example, these structures may be modified by further including one or more transistors or one or more capacitors.

In addition, in FIGS. 2 and 3, the structures of the subpixels have been described on the assumption that the display device 100 is a self-emitting display device. However, when the display device 100 is a liquid crystal display device, each subpixel SP may include a transistor, a pixel electrode, and the like.

Figure 4:
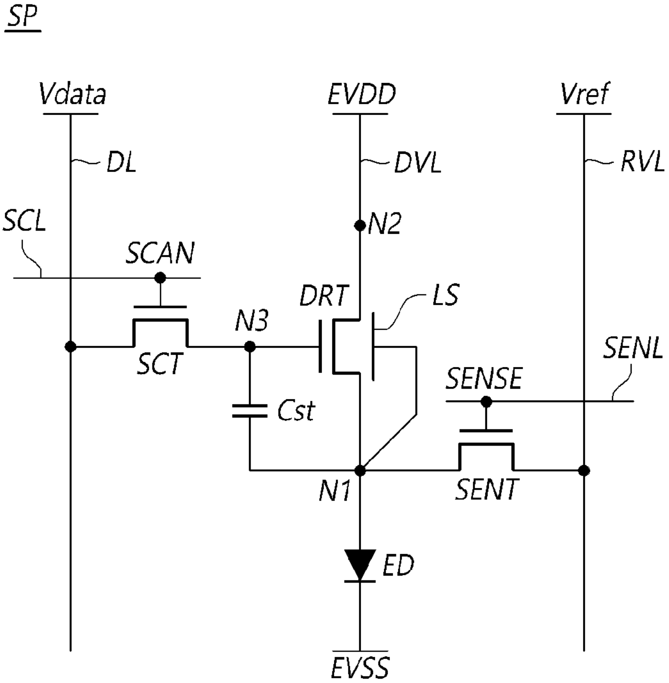
FIG. 4 is a diagram illustrating a light shield in a subpixel of a display device according to some aspects of the present disclosure.

FIG. 4 is a diagram illustrating a light shield (LS) in a subpixel SP of a display device according to some aspects of the present disclosure.

Referring to FIG. 4, in the subpixel SP of the display device 100 according to examples of the present disclosure, a driving transistor DRT may have property values such as a threshold voltage and mobility. When the property values of the driving transistor DRT change, the current driving capability (current supply capability) of the driving transistor DRT may change, and thus emission characteristics of the corresponding subpixel SP may also change.

Element characteristics (for example, the threshold voltage and the mobility) of the driving transistor DRT may change as a driving time of the driving transistor DRT passes. In addition, when light is radiated onto the driving transistor DRT, in particular, when light is radiated onto a channel region of the driving transistor DRT, the element characteristics (for example, the threshold voltage and the mobility) of the driving transistor DRT may change.

Therefore, as shown in FIG. 4, to reduce a change in element characteristics (for example, a change in threshold voltage or a change in mobility) of the driving transistor DRT, the light shield LS may be formed near the driving transistor DRT. For example, the light shield LS may be formed below the channel region of the driving transistor DRT.

Meanwhile, the light shield LS may be formed below the channel region of the driving transistor DRT to block light and also serve as a body of the driving transistor DRT.

A body effect may occur in the driving transistor DRT, and to reduce the body effect, the light shield LS serving as the body of the driving transistor DRT may be electrically connected to a first node N1 of the driving transistor DRT. Here, the first node N1 of the driving transistor DRT may be a source node of the driving transistor DRT.

Meanwhile, the light shield LS may be disposed not only below the channel region of the driving transistor DRT but also below a channel region of each of other transistors (for example, SCT and SENT).

In a display area DA of the display panel 110 according to examples of the present disclosure, transistors DRT, SCT, and SENT may be disposed in each subpixel SP. When a gate driving circuit 130 is formed as a GIP type in a non-display area NDA of the display panel 110 according to examples of the present disclosure, a plurality of transistors included in the gate driving circuit 130 of the GIP type may be disposed in the non-display area NDA of the display panel 110.

As described above, the plurality of transistors may be disposed in the display panel 110 according to examples of the present disclosure. Light may enter the transistors, and thus the characteristics of the transistors may be degraded. For example, while a portion of light emitted from an organic light-emitting element included in an organic light-emitting display device is emitted toward a front surface of a display panel, another portion of the light emitted from the organic light-emitting element may be transmitted toward a lower substrate, on which a plurality of transistors are disposed, to enter the transistors. In this case, bright spots or dark spots of the display panel 110 may be caused.

Various experiments and related analyses have confirmed that internal light entering a transistor degrades the characteristics of a display panel. The present disclosure proposes a structure and process method capable of preventing internal light from entering the transistor.

Hereinafter, a display panel, a display device, and a method of manufacturing a display panel will be described in more detail in which light emitted from an organic light-emitting element may be prevented from entering a transistor and the characteristics of the transistor may be maintained.

Figure 5:
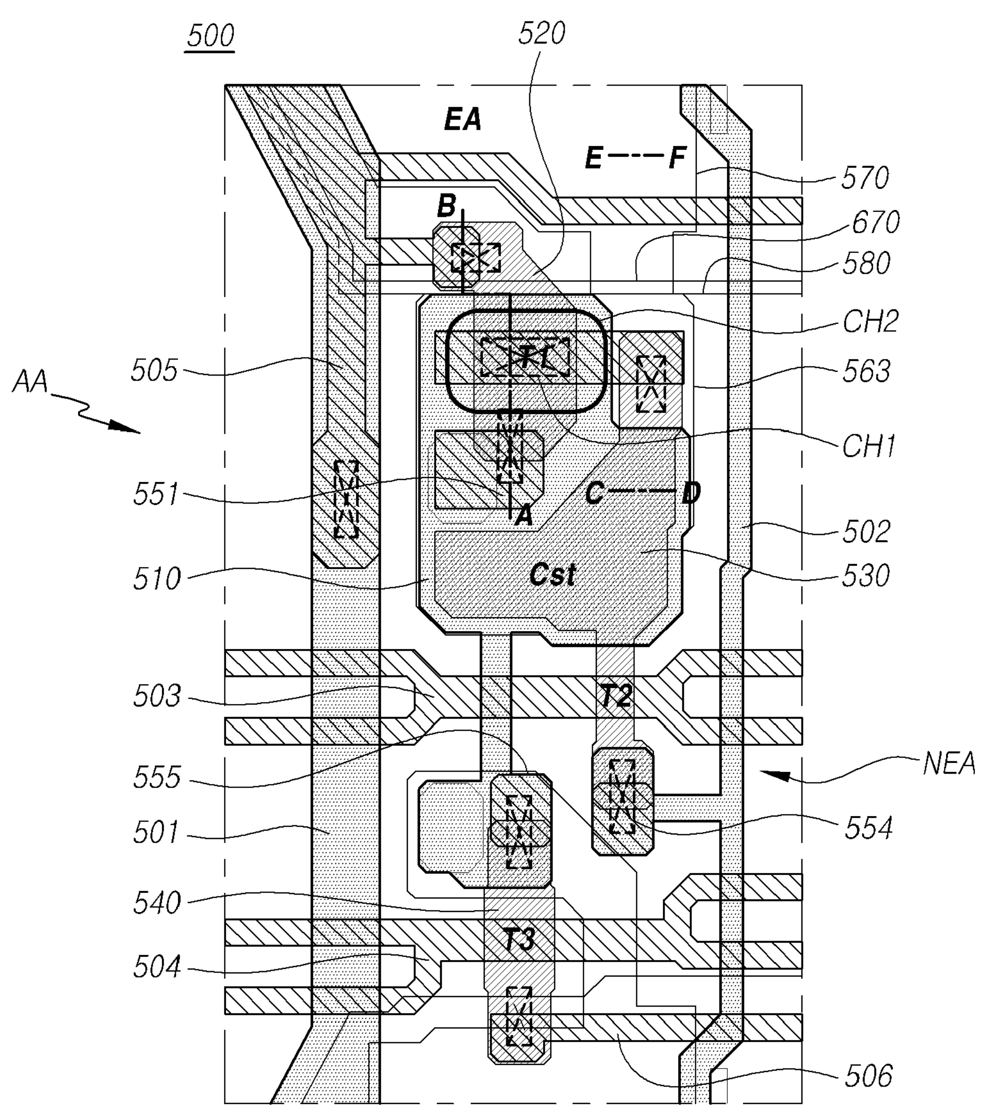
FIG. 5 is a diagram illustrating a portion of an active region in a display panel according to some aspects of the present disclosure.

FIG. 5 is a diagram illustrating a portion of an active region in a display panel according to some aspects of the present disclosure.

Referring to FIG. 5, at least one subpixel of the display panel 500 according to examples of the present disclosure may include an emission area EA and a non-emission area which are distinguished by a bank.

In an active region of the display panel, the emission area EA may be an area that does not overlap the bank, and the non-emission area may be an area that overlaps the bank.

An organic light-emitting element OLED, which includes an anode 570, an organic layer including an emission layer, and a cathode, may be disposed in the emission area EA. A color filter 580 may be disposed to overlap the emission area EA in which the organic light-emitting element OLED is disposed, but the present disclosure is not limited thereto. For example, the color filter 580 may be disposed on only some subpixels among a plurality of subpixels included in a display device, and the color filter 580 may not be disposed on all subpixels included in the display device 100.

At least one transistor may be disposed in one subpixel. For example, as shown in FIG. 5, a first transistor T1, a second transistor T2, and a third transistor T3 may be disposed in one subpixel.

A first signal line 501 and a second signal line 502 disposed to be coplanar with an LS 510 and extending in a first direction may be disposed on a substrate. Here, the first signal line 501 may be the driving voltage line DVL of FIGS. 2 to 4, and the second signal line 502 may be the data line DL (see FIGS. 2 to 4), but the present disclosure is not limited thereto. For example, each of the first and second signal lines 501 and 502 may be a data line.

However, for convenience of description, the following description will focus on a structure in which the first signal line 501 is a driving voltage line and the second signal line 502 is a data line.

The light shield LS 510 may be disposed to be coplanar with the first and second signal lines 501 and 502.

A first active layer 520, a second active layer 530, and a third active layer 540 may be disposed on the substrate on which the first and second signal lines 501 and 502 and the light shield LS 510 are disposed.

Here, at least one active layer may include an oxide semiconductor material. The oxide semiconductor material may be a semiconductor material formed by controlling conductivity of an oxide material and adjusting a band gap thereof through doping and may be generally a transparent semiconductor material having a wide band gap. For example, oxide semiconductor materials include indium gallium zinc oxide (IGZO), zinc oxide (ZnO), indium gallium oxide (IGO), indium zinc oxide (IZO), cadmium oxide (CdO), indium oxide (InO), zinc tin oxide (ZTO), zinc indium tin oxide (ZITO), indium gallium zinc tin oxide (IGZTO), and the like.

For example, when the first to third active layers 520, 530, and 540 include the oxide semiconductor material, transistors including the first to third active layers 520, 530, and 540 are referred to as oxide thin film transistors.

The first active layer 520 may be included in the first transistor T1, the second active layer 530 may be included in the second transistor T2, and the third active layer 540 may be included in the third transistor T3.

Referring to FIG. 5 the second active layer 530 may serve as an electrode of a storage capacitor Cst disposed in the subpixel.

Specifically, the storage capacitor Cst may include at least two storage capacitor electrodes. For example, as shown in FIG. 5, the light shield LS 510 and the second active layer 530 may be included as electrodes of the storage capacitor Cst.

A plurality of signal lines 503, 504, 505, and 506 and a plurality of conductive layers 551 and 552 (see FIG. 6A) may be disposed on the substrate on which the first to third active layers 520, 530, and 540 are disposed.

Specifically, the plurality of signal lines may include a third signal line 503, a fourth signal line 504, a fifth signal line 505, and a sixth signal line 506.

The third and fourth signal lines 503 and 504 may extend in a direction intersecting the first and second signal lines 501 and 502. The third signal line 503 may be a first gate line, and the fourth signal line 504 may be a second gate line.

The fifth signal line 505 may be disposed to overlap at least a portion of the first signal line 501. The fifth signal line 505 and the first signal line 501 may be electrically connected through a contact hole formed in an insulating film disposed below the fifth signal line 505. Thus, resistance of the first signal line 501 may be lowered.

Also, the fifth signal line 505 may include an extension portion extending in a direction intersecting an extending direction of the first signal line 501. The plurality of subpixels may receive a driving voltage through the extension portion of the fifth signal line 505, but the present disclosure is not limited thereto. For example, when the first signal line 501 is a data line, the fifth signal line 505 may not be disposed on the first signal line 501.

The sixth signal line 506 may extend in a direction intersecting the first and second signal lines 501 and 502. The sixth signal line 506 may be electrically connected to the third active layer 540. Here, the sixth signal line 506 may be a signal line connected to a reference voltage line, but the present disclosure is not limited thereto.

The plurality of conductive layers 551 and 552 disposed to be coplanar with the third to sixth signal lines 503, 504, 505, and 506 may include a first electrode 551 and a second electrode 552.

Here, each of the first electrode 551 and the second electrode 552 may serve as one of a source electrode and a drain electrode of the first transistor T1.

A third electrode 563 may be disposed on the substrate on which the first electrode 551 and the second electrode 552 are disposed.

The third electrode 563 may serve as a gate electrode of the first transistor T1.

The third electrode 563 may be disposed to not be coplanar with the first electrode 551 and the second electrode 552.

Referring to FIG. 5, the third electrode 563 may be disposed in a contact hole formed in at least one insulating film disposed below the third electrode 563.

For example, the third electrode 563 may be disposed in a first hole CH1 and a second hole CH2 of insulating films disposed between the first active layer 520 and the third electrode 563.

Here, the third electrode 563 may overlap a portion of the first active layer 520. In particular, the third electrode 563 may overlap a channel region of the first active layer 520 of the first transistor T1 as well as a portion of each of the first and second regions 521 and 522 of the first active layer 520, thereby preventing the characteristics of the first transistor T1 from being degraded due to light being incident on the first active layer 520 of the first transistor T1.

Referring to FIG. 5, the first transistor T1 may include the first active layer 520, the first electrode 551, the second electrode 552, and the third electrode 563.

The first electrode 551 of the first transistor T1 may be electrically connected to the light shield LS 510, and the first active layer 520 of the first transistor T1 may be electrically connected to the second electrode 552 formed integrally with the fifth signal line 505.

The second transistor T2 may include the second active layer 530, the third electrode 563, a fourth electrode 554, and the third signal line 503. The fourth electrode 554 may be disposed to be coplanar with the third signal line 503. Each of the third electrode 563 and the fourth electrode 554 included in the second transistor T2 may serve as one of a source electrode and a drain electrode of the second transistor T2.

As shown in FIG. 5, the fourth electrode 554 may be electrically connected to the second signal line 502, and the third electrode 563 may be electrically connected to the second active layer 530.

Referring to FIG. 5, the third transistor T3 may include the third active layer 540, a fifth electrode 555, the sixth signal line 506, and the fourth signal line 504. Each of the fifth electrode 555 and the sixth signal line 506 of the third transistor T3 may serve as one of a source electrode and a drain electrode of the third transistor T3.

The first transistor T1 may be a driving transistor, and as shown in FIG. 5, at least one storage capacitor Cst may be disposed in one subpixel.

The storage capacitor Cst may include a plurality of storage capacitor electrodes. For example, as shown in FIG. 5, the storage capacitor Cst may include the light shield LS 510, the second active layer 530, and a pixel electrode 570 as the storage capacitor electrodes.

Such a pixel structure will be described in detail with reference to FIGS. 6A to 6E as follows.

FIGS. 6A to 6E are cross-sectional views along lines A-B, C-D, and E-F of FIG. 5 according to some aspects of the present disclosure.

FIGS. 6A to 6E are cross-sectional views illustrating transistor structures according to some aspects of the present disclosure.

A display panel 110 according to examples of the present disclosure may include a display area DA in which an image is displayed and a non-display area NDA different from the display area DA. A plurality of transistors and a plurality of capacitors may be disposed in the display area DA and/or the non-display area NDA.

Transistors disposed on the display panel 110 according to examples of the present disclosure may be transistors DRT, SCT, and SENT disposed in each subpixel SP in the display area DA.

Also, the transistor disposed on the display panel 110 according to examples of the present disclosure may be a transistor included in a driving circuit 130 of a GIP type formed in the non-display area NDA.

In addition, the capacitor disposed on the display panel 110 according to examples of the present disclosure may be a storage capacitor Cst included in each subpixel SP in the display area DA or may be a capacitor included in the gate driving circuit 130 of the GIP type formed in the non-display area NDA.

Hereinafter, an example of a driving transistor DRT in each subpixel SP in the display area DA will be described as a transistor for describing a transistor structure according to examples of the present disclosure, and an example of the storage capacitor Cst in the subpixel SP will be described as a capacitor for describing a capacitor structure according to examples of the present disclosure.

Referring to FIGS. 6A to 6E, one subpixel may include the emission area EA and the non-emission area NEA.

The plurality of transistors and at least one storage capacitor Cst may be disposed in the non-emission area NEA.

An organic light-emitting element OLED including a pixel electrode 570 (or an anode), an organic layer 680, and a common electrode 690 (or a cathode) may be disposed in the emission area EA.

Referring to FIGS. 6A to 6E, the display panel 110 of a display device 100 according to examples of the present disclosure may include a substrate 600, a buffer layer 601 on the substrate 600, a first active layer 520 on the buffer layer 601, first and second electrodes 551 and 552 on the first active layer 520, a gate insulating film 602 on the first active layer 520, and a third electrode 563 on the gate insulating film 602 and may further include an LS 510 disposed below the first active layer 520. The light shield LS 510 may overlap a conductive region of the second active layer 530 spaced apart from the first active layer 520.

Although FIGS. 6A to 6E illustrate a structure in which the light shield LS 510 is disposed below the first active layer 520, a structure of the display device 100 according to examples of the present disclosure is not limited thereto, and the light shield LS 510 may not be disposed below the first active layer 520.

A transistor disposed on the display panel 110 according to examples of the present disclosure may be the driving transistor DRT but is not limited thereto.

For example, a transistor described herein may be a scanning transistor SCT or a sensing transistor SENT disposed in the display area DA or may be a transistor disposed in the non-display area NDA.

Referring to FIGS. 6A to 6E, the transistor TR may include the first electrode 551, the second electrode 552, the third electrode 563, and the first active layer 520. Here, each of the first electrode 551 and the second electrode 552 may be one of a source electrode and a drain electrode of the transistor TR.

Figure 6A:
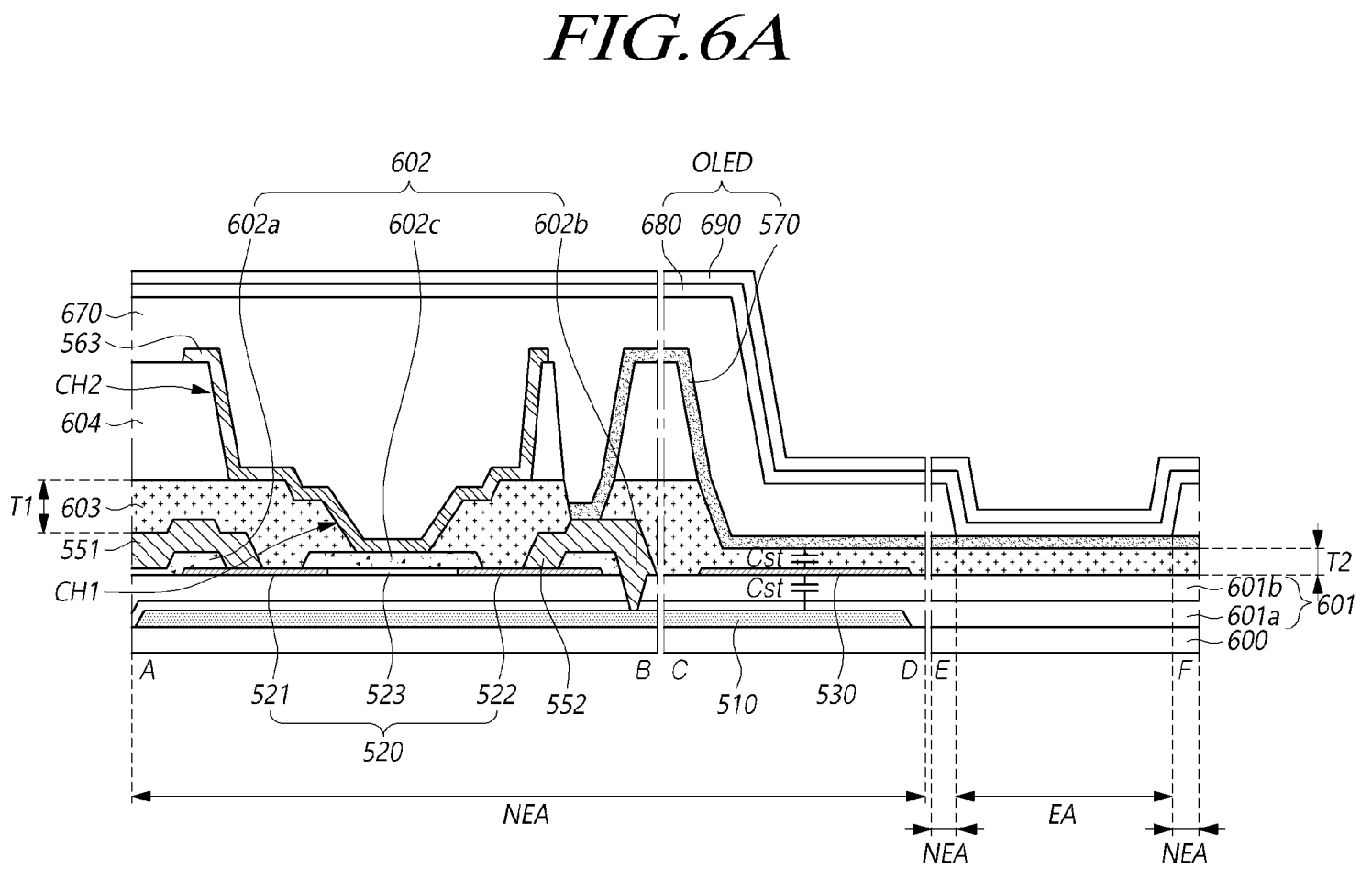
Figure 6B:
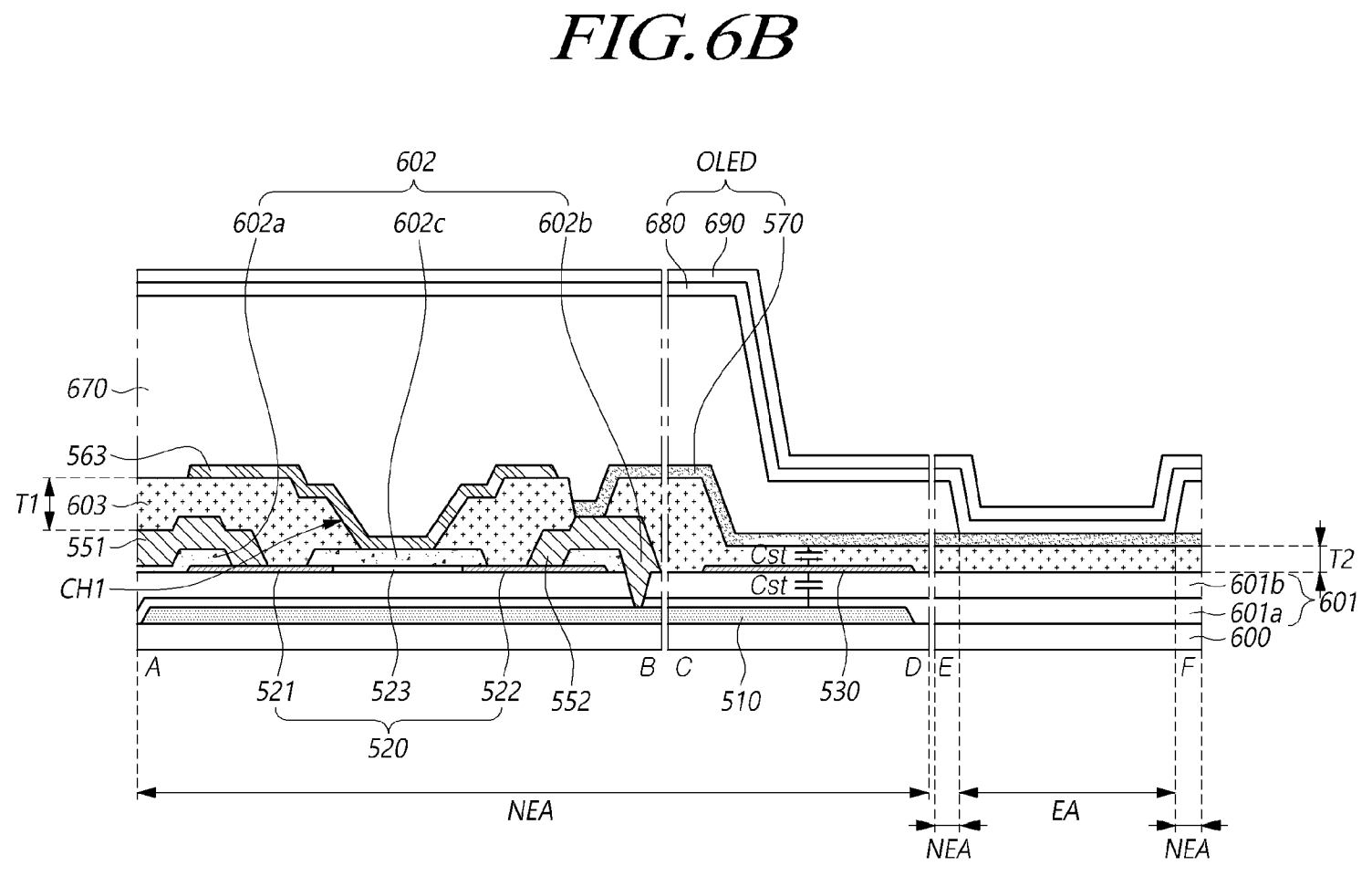

Referring to FIGS. 6A and 6B, the first active layer 520 of the transistor TR may include a first region 521, a second region 522, and a channel region 523.

Specifically, the first active layer 520 may include the channel region 523 overlapping the third electrode 563 and the gate insulating film 602, the first region 521 positioned at a first side of the channel region 523, and the second region 522 positioned at a second side of the channel region 523.

The first and second regions 521 and 522 of the first active layer 520 may include conductive regions, and the channel region 523 may be a non-conductive region. A region of the first active layer 520 not overlapping the gate insulating film 602 may be a conductive region. The conductive regions of the first active layer 520 may be between the first region 521 and the channel region 523 and between the second region 522 and the channel region 523.

For example, referring to FIGS. 6A and 6B, the entirety of each of the first and second regions 521 and 522 of the first active layer 520 may be a conductive region.

However, a structure of the first active layer 520 according to embodiments of the present disclosure is not limited thereto.

Figure 6C:
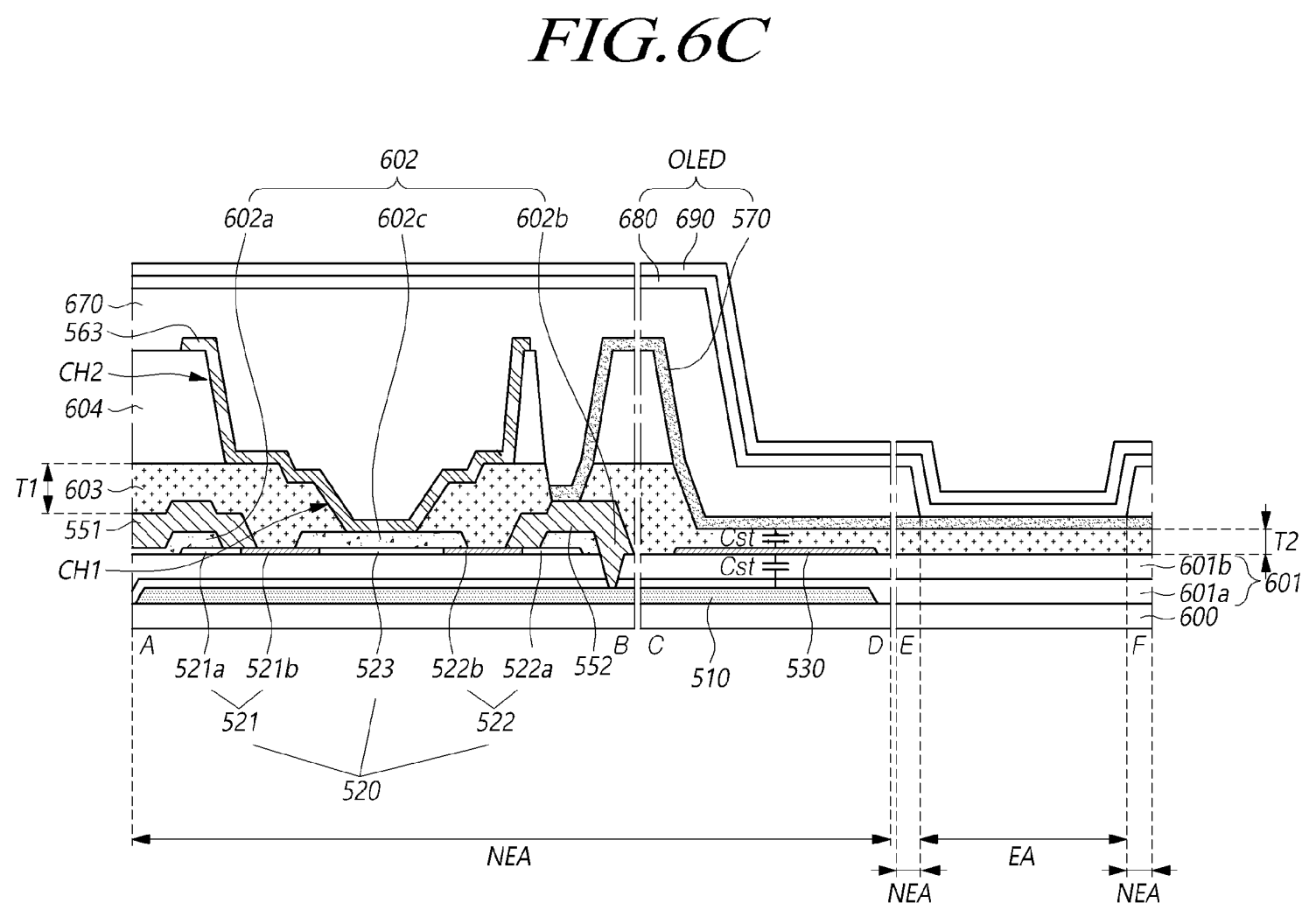
Figure 6D:
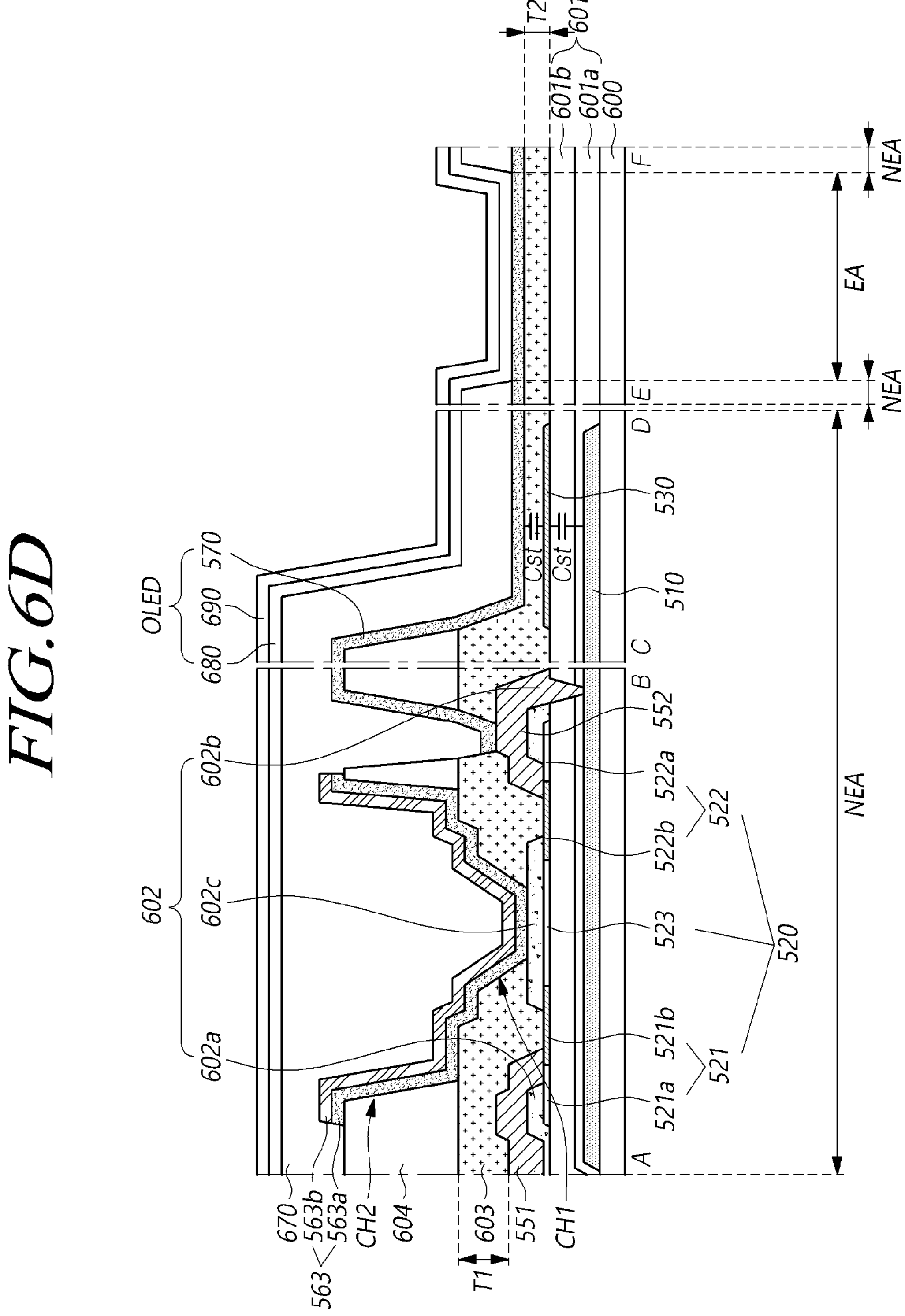
Figure 6E:
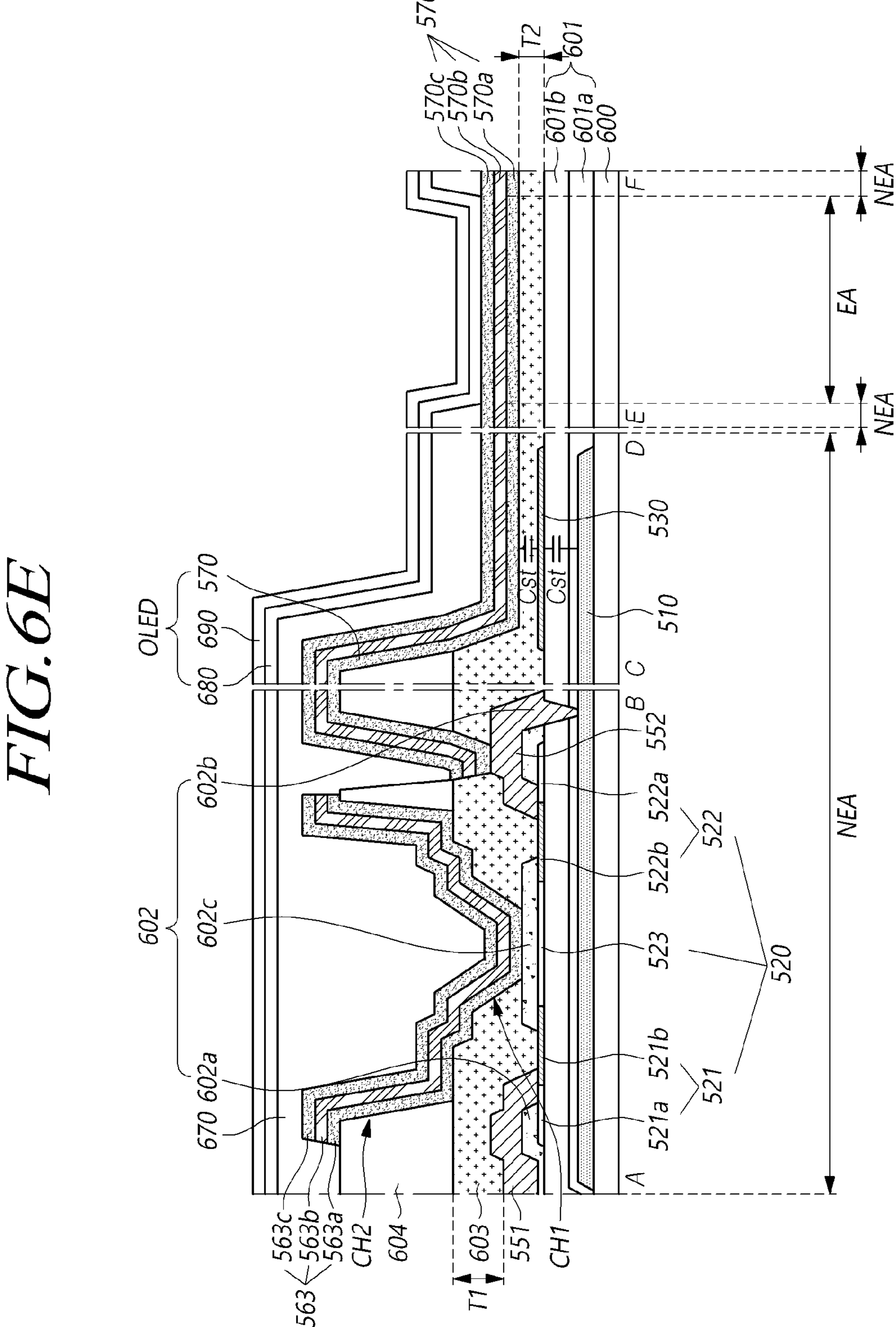

Referring to FIGS. 6C to 6E, the first region 521 of the first active layer 520 may include a first auxiliary region 521*a* and a second auxiliary region 521*b*, and the second region 522 may include a third auxiliary region 522*a* and a fourth auxiliary region 522*b*.

Here, the first auxiliary region 521*a* and the third auxiliary region 522*a* may be non-conductive regions, and the second auxiliary region 521*b* and the fourth auxiliary region 522*b* may be conductive regions.

Referring to FIGS. 6C to 6E, the second auxiliary region 521*b* may be a region disposed between the channel region 523 and the first auxiliary region 521*a*, and the fourth auxiliary region 522*b* may be a region disposed between the channel region 523 and the third auxiliary region 523*a*.

Referring to FIGS. 6C to 6E, a portion of an upper surface of each of the second auxiliary region 521*b* and the fourth auxiliary region 522*b* may be in contact with a first insulating film 603. FIG. 6C illustrates an example of a structure in which a portion of the upper surface of the second auxiliary region 521*b* overlaps the first electrode 551 and the gate insulating film 602, and a portion of the upper surface of the fourth auxiliary region 522*b* overlaps the second electrode 552 and the gate insulating film 602, but a structure of the transistor TR according to embodiments of the present disclosure is not limited thereto. For example, the entire upper surface of each of the second auxiliary region 521*b* and the fourth auxiliary region 522*b* may have a structure in contact with the first insulating film 603.

In addition, the entire upper surfaces of the first auxiliary region 521*a* and the third auxiliary region 522*a* may be in contact with components other than the first insulating film 603. Specifically, referring to FIG. 6C, a portion of the upper surface of the first auxiliary region 521*a* may be in contact with the gate insulating film 602, and the remaining portion thereof may be in contact with the first electrode 551. A portion of the upper surface of the third auxiliary region 522*a* may be in contact with the gate insulating film 602, and the remaining portion thereof may be in contact with the second electrode 552.

The first active layer 520 shown in FIGS. 6A to 6E may include an oxide semiconductor material. The oxide semiconductor material may be a semiconductor material formed by controlling conductivity of an oxide material and adjusting a band gap thereof through doping or ion implanting and may be generally a transparent semiconductor material having a wide band gap. For example, oxide semiconductor materials include IGZO, IGO, IZO, ZnO, CdO, InO, ZTO, ZITO, IGZTO, and the like. When the first active layer 520 is made of the oxide semiconductor material, the transistor including the first active layer 520 is referred to as an oxide thin film transistor.

The first active layer 520 may have conductivity during a dry etching process of the gate insulating film 602 rather than during a doping process, and conductivity of the first active layer 520 may be controlled through various processes.

FIGS. 6A to 6E illustrate only a structure in which the first active layer 520 is a single layer, but a structure of the transistor according to examples of the present disclosure is not limited thereto. The first active layer 520 may be multiple layers. For example, when the first active layer 520 is multiple layers, the multiple layers may be made of the same semiconductor material or may be made of two or more different semiconductor materials.

Referring to FIGS. 6A to 6E, the gate insulating film 602 may be disposed on a portion of an upper surface of the first active layer 520. The gate insulating film 602 may include a first gate insulating film portion (first gate insulator) 602*a* which may overlap a portion of the first region 521, a second gate insulating film portion (second gate insulator) 602*b* which may overlap a portion of the second region 522, and a third gate insulating film portion (third gate insulator) 602*c* which may overlap an entirety of the channel region 523.

Referring to FIGS. 6A to 6E, among a first end portion and a second end portion of the first active layer 520, the first gate insulating film portion 602*a* may be disposed on the first end portion of the first active layer 520. For example, the first gate insulating film portion 602*a* may be disposed to cover the first end portion of the first active layer 520.

The second gate insulating film portion 602*b* may be disposed on the second end portion of the first active layer 520. For example, the second gate insulating film portion 602*b* may be disposed to cover the second end portion of the first active layer 520.

Referring to FIGS. 6A to 6E, the first gate insulating film portion 602*a* and the second gate insulating film portion 602*b* may not overlap the channel region 523 of the first active layer 520. The third gate insulating film portion 602*c* may be positioned on the channel region 523 of the first active layer 520.

In a process of forming the first to third gate insulating film portions 602*a*, 602*b*, and 602*c*, a partial region of the first active layer 520 may have conductivity.

Specifically, in the process of forming the first to third gate insulating film portions 602*a*, 602*b*, and 602*c* shown in FIGS. 6A to 6E, a region of the first active layer 520 which does not overlap the first to third gate insulating film portions 602*a*, 602*b*, and 602*c* may have conductivity.

In addition, a structure of the first active layer 520 according to examples of the present disclosure is not limited thereto, and at least a partial region of the first active layer 520 which overlaps the first to third gate insulating film portions 602*a*, 602*b*, and 602*c* may also have conductivity.

In other words, the first active layer 520 according to examples of the present disclosure may have a structure in which a region not overlapping the gate insulating film 602 has conductivity or may have a structure in which a region not overlapping the gate insulating film 602 and a partial region overlapping the gate insulating film 602 also have conductivity.

A conductive region of the first active layer 520 may have conductivity through a process of patterning the gate insulating film 602. However, the first active layer 520 according to examples of the present disclosure may have conductivity through a doping (or ion implanting) process rather than a patterning process.

For example, in a state in which a photoresist remains on patterns of the gate insulating film 602 shown in FIGS. 6A to 6E and a photoresist does not remain in the remaining regions, while a material of the gate insulating film 602 in the regions in which the photoresist is not present may be removed through a dry etching process, a partial region of the first active layer 520 may have conductivity.

A height of the above-described photoresist may be adjusted in each region using a halftone mask, and after a partial region of the first active layer 520 has conductivity, the photoresist remaining on a substrate 600 may be removed.

The first active layer 520 may include the channel region 523 that does not have conductivity, and the channel region 523 may be an entire region or a partial region which overlaps the gate insulating film 602 and the third electrode 563 but does not overlap the first and second electrodes 551 and 552.

The gate insulating film 602 positioned on the channel region 523 of the first active layer 520 may have a structure patterned on the first active layer 520 as shown in FIGS. 6A to 6E, but the present disclosure is not limited thereto. The gate insulating film 602 may be disposed on an entire surface of the first active layer 520.

Hereinafter, for convenience of description, a description will be provided based on the gate insulating film 602 disposed on the first active layer 520 having a structure patterned as shown in FIGS. 6A to 6E.

Referring to FIGS. 6A to 6E, the first electrode 551 and the second electrode 552 may be disposed on the substrate 600 on which the gate insulating film 602 is disposed.

The first electrode 551 may be electrically connected to the first region 521 of the first active layer 520. The second electrode 552 may be electrically connected to the second region 522 of the first active layer 520.

Each of the first electrode 551, the second electrode 552, and the third electrode 563 may be a single layer or multiple layers. For example, each of the first electrode 551, the second electrode 552, and the third electrode 563 may include copper (Cu), aluminum (Al), molybdenum (Mo), titanium (Ti), molybdenum-titanium (MoTi), or the like.

When at least one of the first electrode 551, the second electrode 552, and the third electrode 563 is multiple layers, at least one of the first electrode 551, the second electrode 552, and the third electrode 563 may include a lower electrode and an upper electrode electrically connected to each other.

The lower electrode may include a first metal, and the upper electrode may include a second metal different from the first metal. For example, the first metal may include molybdenum (Mo), titanium (Ti), molybdenum-titanium (MoTi), or the like. The second metal may include copper (Cu), aluminum (Al), or the like. Hereinafter, an example in which the first metal is molybdenum-titanium (MoTi) and the second metal is copper (Cu) will be described.

Referring to FIGS. 6A to 6E, the first electrode 551 may be positioned on at least a portion of an upper surface and a portion of a side surface of the first gate insulating film portion 602*a*. The second electrode 552 may be positioned on at least a portion of an upper surface and a portion of a side surface of the second gate insulating film portion 602*b*.

Referring to FIGS. 6A to 6E, a buffer layer 601 disposed on the substrate 600 may be a single layer or multiple layers. For example, the buffer layer 601 may include various insulating film materials such as silicon nitride ($SiN_x$) and silicon dioxide ($SiO_2$).

When the buffer layer 601 is multiple layers, the buffer layer 601 may include a first buffer layer 601*a* and a second buffer layer 601*b* disposed on the first buffer layer 601*a*. In this case, for example, the first buffer layer may be made of silicon nitride ($SiN_x$), and the second buffer layer 601*b* may be made of silicon dioxide ($SiO_2$). Alternatively, the first buffer layer 601*a* may be made of silicon dioxide ($SiO_2$), and the second buffer layer 601*b* may be made of silicon nitride ($SiN_x$).

The first active layer 520, the first electrode 551, the second electrode 552, and the third electrode 563 of the transistor TR may be disposed on the buffer layer 601.

Referring to FIGS. 6A to 6E, in the display panel 110 of the display device 100 according to examples of the present disclosure, the light shield LS 510 may be positioned between the substrate 600 and the buffer layer 601 and may overlap the channel region 523 of the first active layer 520.

Each of the light shield LS 510, the first electrode 551, the second electrode 552, and the third electrode 563 may include copper (Cu), aluminum (Al), molybdenum (Mo), titanium (Ti), molybdenum-titanium (MoTi), or the like.

The light shield LS 510 may be a single layer or multiple layers.

As shown in FIGS. 6A to 6E, when the light shield LS 510 is multiple layers, the light shield LS 510 may include a lower LS and an upper LS disposed on the lower LS.

The lower LS may include the first metal (for example, MoTi) included in the first lower electrode, the second lower electrode, and/or the third lower electrode. The upper LS may include the second metal (for example, Cu) included in the first upper electrode, the second upper electrode, and/or the third upper electrode. For example, the first metal may include molybdenum (Mo), titanium (Ti), molybdenum-titanium (MoTi), or the like. The second metal may include copper (Cu), aluminum (Al), or the like.

Referring to FIGS. 6A to 6E, the first electrode 551 or the second electrode 552 may be connected to the light shield LS 510 through through-holes of the buffer layer 601 and the gate insulating film 602. Accordingly, the light shield LS 510 may be electrically connected to a first node N1 of the driving transistor DRT (see FIG. 4). For example, the second electrode 552 may be electrically connected to the LS 510.

A first insulating film 603 may be disposed on the substrate 600 on which the first and second electrodes 551 and 552 of the transistor TR are disposed.

The first insulating film 603 may include various insulating film materials such as silicon nitride ($SiN_x$) and silicon dioxide ($SiO_2$).

Referring to FIGS. 6A to 6E, the first insulating film 603 may include a first hole CH1. The first hole CH1 may overlap at least a portion of the channel region 523 of the first active layer 520.

Referring to FIGS. 6A to 6E, a second insulating film 604 including a second hole CH2 may be disposed on the first insulating film 603 including the first hole CH1. The second insulating film 604 may include an organic insulating material.

However, the present disclosure is not limited thereto, and the second insulating film 604 may not be disposed on the first insulating film 603 as shown in FIG. 6B.

Referring to FIGS. 6A and 6C to 6E, the second hole CH2 may overlap the first hole CH1.

For example, as shown in FIGS. 5, 6A and 6C to 6E, the second hole CH2 may overlap the entirety of the first hole CH1, but the present disclosure is not limited thereto. A portion of the second hole CH2 may overlap a portion of the first hole CH1.

Referring to FIGS. 5, 6A and 6C to 6E, an area of the second hole CH2 may be greater than an area of the first hole CH1. Therefore, as shown in FIGS. 6A and 6C to 6E, a stepped portion may be present between the first insulating film 603 and the second insulating film 604 in a region in which the first hole CH1 and the second hole CH2 are disposed.

The third electrode 563 may be disposed on the second insulating film 604.

Referring to FIGS. 6A and 6C to 6E, the third electrode 563 may be disposed on a portion of an upper surface of the second insulating film 604 and may be disposed inside the first hole CH1 and the second hole CH2.

The third electrode 563 may overlap the channel region 523 of the first active layer 520 in the first and second holes CH1 and CH2. The third electrode 563 may overlap the channel region in the first hole CH1. Also, the third electrode 563 may be in contact with at least a portion of an upper surface of the gate insulating film 602 disposed on the first active layer 520.

The third electrode 563 may overlap at least a portion of the first region 521 and at least a portion of the second region 522 as well as the channel region 523 of the first active layer 520.

The third electrode 563 may be in contact with a portion of the upper surface of the second insulating film 604 around the second hole CH2, a side surface of the second insulating film 604 at which the second hole CH2 is positioned, a side surface of the first insulating film 603 at which the first hole CH1 overlapping the second hole CH2 is provided, and a portion of the upper surface of the gate insulating film 602.

When the stepped portion is present between the first insulating film 603 and the second insulating film 604 in the region in which the first hole CH1 and the second hole CH2 are disposed, a surface area of the third electrode 563 may be increased, thereby effectively blocking light from traveling and entering the first and second insulating films 603 and 604.

The third electrode 563 may serve as a gate electrode of the transistor.

Referring to FIG. 6B, when the second insulating film 604 is not disposed on the first insulating film 603, the third electrode 563 may be disposed on the first insulating film 603.

Referring to FIG. 6B, the third electrode 563 may be disposed on a portion of an upper surface of the first insulating film 603 and may be disposed in the first hole CH1.

The third electrode 563 may overlap the channel region 523 of the first active layer 520 in the first hole CH1. Also, the third electrode 563 may be in contact with at least a portion of the upper surface of the gate insulating film 602 disposed on the first active layer 520.

The third electrode 563 may include at least one stepped portion due to the first hole CH1 formed in the first insulating film 603. Accordingly, the surface area of the third electrode 563 may be increased, and thus light is easily blocked from traveling and entering the first insulating film 603.

Referring to FIGS. 6A to 6E, a structure of the third electrode 563 of the display device according to embodiments may be formed in various forms.

For example, as shown in FIGS. 6A to 6C, the third electrode 563 may be formed as a single layer. In this case, the single layer of the third electrode 563 may include a metal material.

In addition, as shown in FIG. 6D, the third electrode 563 may have a double layer structure. In this case, the third electrode 563 may include a first gate electrode layer 563*a* disposed on the second insulating film 604 and a second gate electrode layer 563*b* disposed on the first gate electrode layer 563*a*.

Here, the first gate electrode layer 563*a* may include a transparent conductive material, and the second gate electrode layer 563*b* may include a metal material. The first gate electrode layer 563*a* and the pixel electrode 570 disposed on the second insulating film 604 may be formed through the same process.

In addition, as shown in FIG. 6E, the third electrode 563 may have a triple layer structure. In this case, the third electrode 563 may include a first gate electrode layer 563*a* disposed on the second insulating film 604, a second gate electrode layer 563*b* disposed on the first gate electrode layer 563*a*, and a third gate electrode layer 563*c* disposed on the second gate electrode layer 563*b*.

Here, the first gate electrode layer 563*a* may include a transparent conductive material, the second gate electrode layer 563*b* may include a metal material, and the third gate electrode layer 563*c* may include a transparent conductive material. The third electrode 563 with three layers and the pixel electrode 570 may be formed through the same process, and in this case, the pixel electrode 570 may have a triple layer structure formed as a three-layer structure (that is a structure including layers 570*a*, 570*b*, and 570*c*).

Referring to 6A and 6C to 6E, the first insulating film 603 and the second insulating film 604 may further include contact holes exposing a portion of an upper surface of the second electrode 552 of the transistor.

Referring to FIG. 6B, the first insulating film 603 may include a contact hole exposing a portion of the upper surface of the second electrode 552 of the transistor TR.

Referring to FIGS. 6A to 6E, the first insulating film 603 may be disposed in the emission area EA and the non-emission area NEA.

Referring to FIGS. 6A and 6C to 6E, the second insulating film 604 may or may not be disposed in a portion of the emission area EA and may be disposed in a portion of the non-emission area NEA.

A pixel electrode 570 (anode) may be disposed on the first insulating film 603 and the second insulating film 604.

The pixel electrode 570 may include a reflective electrode, but the present disclosure is not limited thereto. For example, the pixel electrode 570 may include a transparent conductive material.

Specifically, the pixel electrode 570 of FIGS. 6A to 6D may be formed as a single layer and may include a transparent conductive material. Also, the pixel electrode 570 of FIG. 6E may be formed as multiple layers including a first layer 570*a*, a second layer 570*b*, and a third layer 570*c*. The first and third layers 570*a* and 570*c* of the pixel electrode 570 may include a transparent conductive material, and the second layer 570*b* may include a metal material.

Referring to FIGS. 6A to 6E, in the non-emission area NEA, the pixel electrode 570 may be in contact with at least a portion of the upper surface of the second electrode 552 of the transistor through contact holes formed in the first and second insulating films 603 and 604 or a contact hole formed in the first insulating film 603. The pixel electrode 570 may be disposed to extend from the non-emission area NEA to the emission area EA.

A bank 670 may be disposed on the substrate 600 on which the pixel electrode 570 is disposed. The bank 670 may be disposed in the non-emission area NEA of an active region and may not be disposed in the emission area EA.

Meanwhile, FIGS. 6A to 6E illustrate a structure in which the emission area EA does not overlap the transistor TR and the storage capacitor Cst disposed on the substrate 600, but embodiments of the present disclosure are not limited thereto.

For example, the emission area EA may be disposed to overlap at least one of the transistor TR, the storage capacitor Cst, and lines disposed on the substrate 600. In this case, light emitted from the organic light-emitting element OLED may be emitted in a direction in which the buffer layer 601 is stacked on the substrate 600.

The organic layer 680 including the emission layer may be disposed on the substrate 600 on which the bank 670 is disposed, and the common electrode 690 (cathode) may be disposed on the organic layer 680.

The common electrode 690 may include a transparent conductive material, but the present disclosure is not limited thereto. For example, when the pixel electrode 570 does not include the reflective electrode, the common electrode 690 may include the reflective electrode.

Although FIGS. 6A to 6E illustrate a structure in which the common electrode 690 is a single layer, the common electrode 690 may be formed as multiple layers. In this case, the different layers may include different materials at least.

In the emission area EA, the organic layer 680 may be disposed on an upper surface of the pixel electrode 570, and the common electrode 690 may be disposed on an upper surface of the organic layer 680.

Light emitted from the light-emitting element OLED including the pixel electrode 570, the organic layer 680, and the common electrode 690 may be emitted in a direction in which the light shield LS 510 is stacked on the substrate 600 or in a direction opposite to the direction in which the light shield LS 510 is stacked on the substrate 600. However, the following description will focus on a structure in which light emitted from the organic light-emitting element OLED is emitted in a direction in which the light shield LS 510 is stacked on the substrate 600.

In this case, a portion of light emitted from the organic light-emitting element OLED may pass through a plurality of insulating films disposed on the substrate 600 and reach the first active layer 520 of the transistor.

When light is incident on the first active layer 520, the characteristics of the transistor TR including the first active layer 520 may be degraded.

Referring to FIGS. 6A to 6E, in the display device according to the examples of the present disclosure, since the third electrode 563 disposed on the first active layer 520 blocks light from emitting toward the first active layer 520, the third electrode 563 has an effect of considerably reducing an amount of light entering the first active layer 520.

Specifically, referring to FIGS. 6A and 6C to 6E, since the third electrode 563 overlaps an upper portion of the channel region 523 of the first active layer 520 in the first and second holes CH1 and CH2, is disposed on the side surfaces of the first and second insulating films 603 and 604 in the first and second holes CH1 and CH2, and is also disposed on a portion of the upper surface of the second insulating film 604 positioned around the second hole CH2, the third electrode 563 also has an effect of blocking light from traveling toward the side surfaces of the first and second insulating films 603 and 604.

Referring to FIG. 6B, since the third electrode 563 overlaps the upper portion of the channel region 523 of the first active layer 520 in the first hole CH1, is disposed on the side surface of the first insulating film 603 in the first hole CH1, and is also disposed on a portion of the upper surface of the first insulating film 603 positioned around the first hole CH1, the third electrode 563 may block light from traveling toward the side surface of the first insulating film 603.

Referring to FIGS. 6A and 6B, in the non-emission area NEA, a second active layer 530 and the light shield LS 510 may be disposed to overlap a portion of the common electrode 690.

The light shield LS 510, the second active layer 530, and the common electrode 690 which overlap each other may serve as electrodes of the storage capacitor Cst.

Referring to FIGS. 6A and 6B, the storage capacitor Cst may be disposed in the non-emission area NEA.

The storage capacitor Cst may include a first storage capacitor electrode, a second storage capacitor electrode disposed on the first storage capacitor electrode, and a third storage capacitor electrode disposed on the second storage capacitor electrode.

The first storage capacitor electrode may be the light shield LS 510, the second storage capacitor electrode may be the second active layer 530, and the third storage capacitor electrode may be the pixel electrode 570.

A region of the second active layer 530 serving as the second storage capacitor electrode may be a conductive region.

Referring to FIGS. 6A to 6E, the buffer layer 601 may be disposed on the first storage capacitor electrode (that is, the light shield LS), and the second storage capacitor electrode (for example, the second active layer or the conductive region of the second active layer) may be disposed on the buffer layer 601. The first insulating film 603 may be disposed on the second storage capacitor electrode, and the third storage capacitor electrode (for example, the pixel electrode) may be disposed on the first insulating film 603.

As described above, since the storage capacitor Cst includes three storage capacitor electrodes, capacity of the storage capacitor may be increased.

Referring to FIGS. 6A to 6E, the first insulating film 603 may include regions having different thicknesses.

For example, the first insulating film 603 may have a first thickness T1 in at least a partial region overlapping the first active layer 520 and may have a second thickness T2 in at least a partial region overlapping the second storage capacitor electrode (for example, the second active layer 530). The first and second thicknesses T1 and T2 may be minimum lengths of the first insulating film 603 in a direction in which the buffer layer 601 is stacked on the substrate 600.

Here, the second thickness T2 may be less than the first thickness T1.

Since the thickness of the first insulating film 603 disposed on the first active layer 520 of the transistor TR is relatively thick, it is possible to reduce parasitic capacitance generated between the electrodes of the transistor TR. In addition, since the second thickness T2 of the first insulating film 603 disposed on the second active layer 530, which is the second storage capacitor electrode, is smaller than the first thickness T1, it is possible to increase capacity of the storage capacitor Cst.

After the first insulating film 603 is formed on the substrate 600, through a dry etching process using a halftone mask, a region having the first thickness T1 and a region having the second thickness T2 may be formed in the first insulating film 603.

As shown in FIGS. 6A to 6D, the third electrode 563 may overlap at least a portion of each of the first and second electrodes 551 and 552. Since the first insulating film 603 has the first thickness T1 and the second insulating film 604 is disposed on the first insulating film 603 having the first thickness T1, a distance between the first electrode 551 and the third electrode 563 may increase, and a distance between the second electrode 552 and the third electrode 563 may increase. Accordingly, it is possible to reduce parasitic capacitance generated between the first electrode 551 and the third electrode 563 and between the second electrode 552 and the third electrode 563.

Referring to FIGS. 6A to 6E, the first thickness T1 may be greater than 4,000 Å and the second thickness T2 may be smaller than 4,000 Å, but the thickness of the first insulating film 603 according to examples of the present disclosure is not limited thereto. Also, the thickness of the first insulating film 603 may be zero for gate modulation on a portion of the upper surface of the channel region 523.

In addition, referring to FIGS. 6A to 6E, since the second insulating film 604 is not disposed between the second active layer 530 which is the second storage capacitor electrode and the pixel electrode 570 which is the third storage capacitor electrode, the capacity of the storage capacitor Cst may be further increased.

As described above, since the capacity of the storage capacitor Cst including the first to third storage capacitor electrodes increases, it is possible to prevent an area of a circuit region from also being increased when areas of the storage capacitor electrodes are increased to increase the capacity of the storage capacitor Cst.

When the area of the circuit region increases, a region in which the bank 670 is not disposed, that is, an area of the emission area, may decrease. However, in the display device according to the examples of the present disclosure, the capacity of the storage capacitor Cst may be increased without an increase in areas of the electrodes of the storage capacitor Cst.

Next, a structure of a display device according to aspects of the present disclosure will be described with reference to FIGS. 7A to 7C and 8.

Figure 7A:
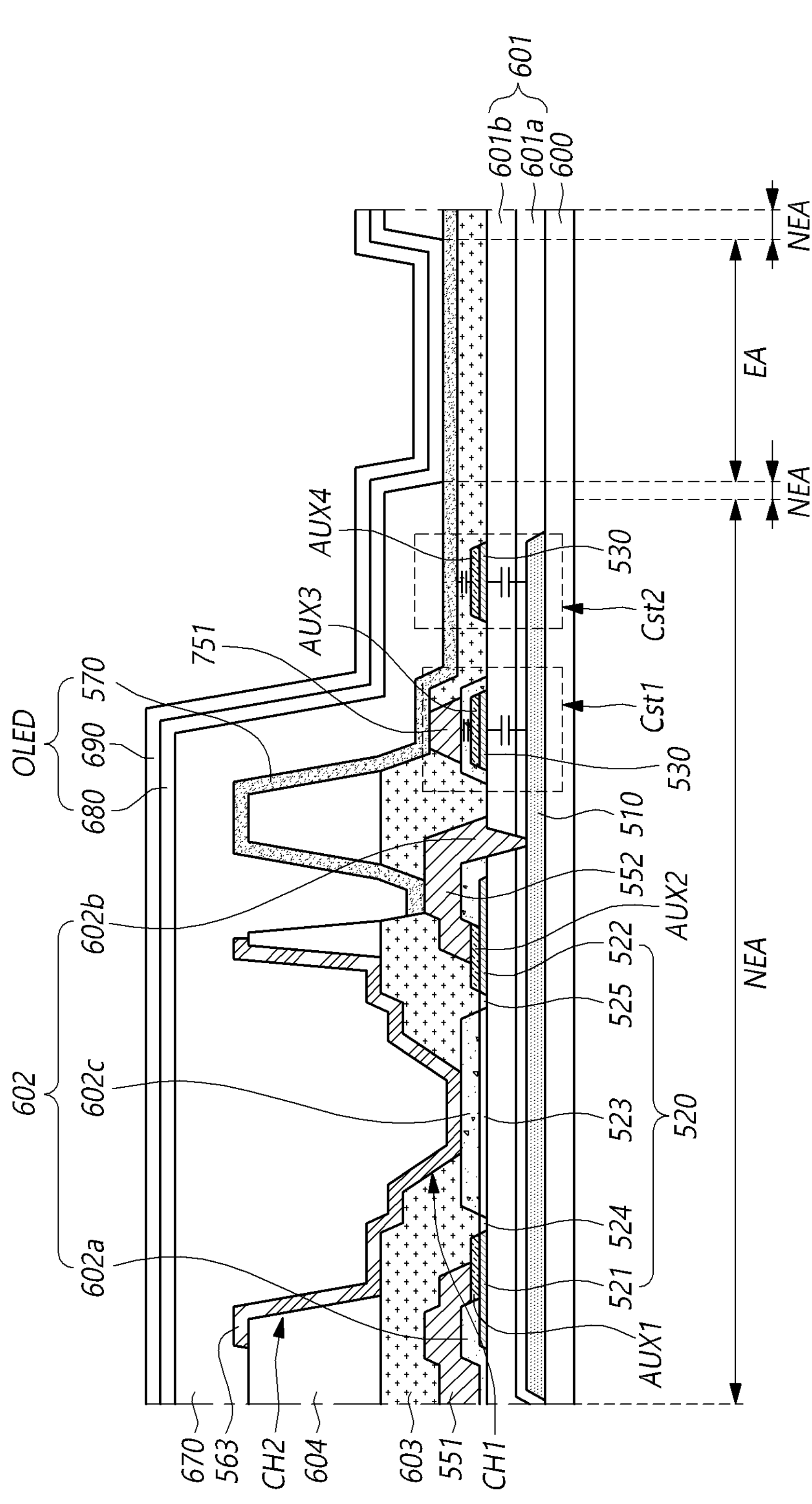
Figure 7B:
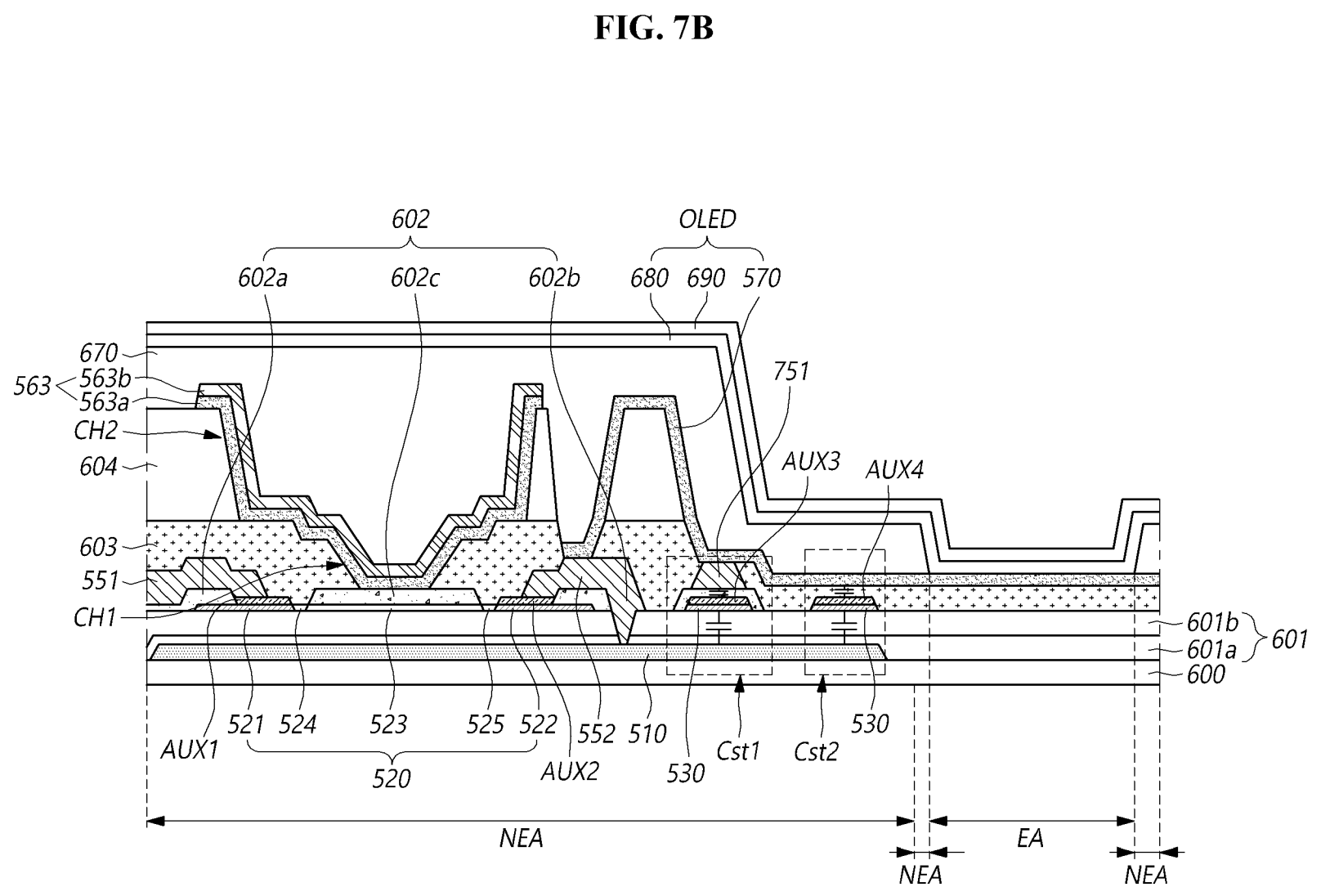
Figure 7C:
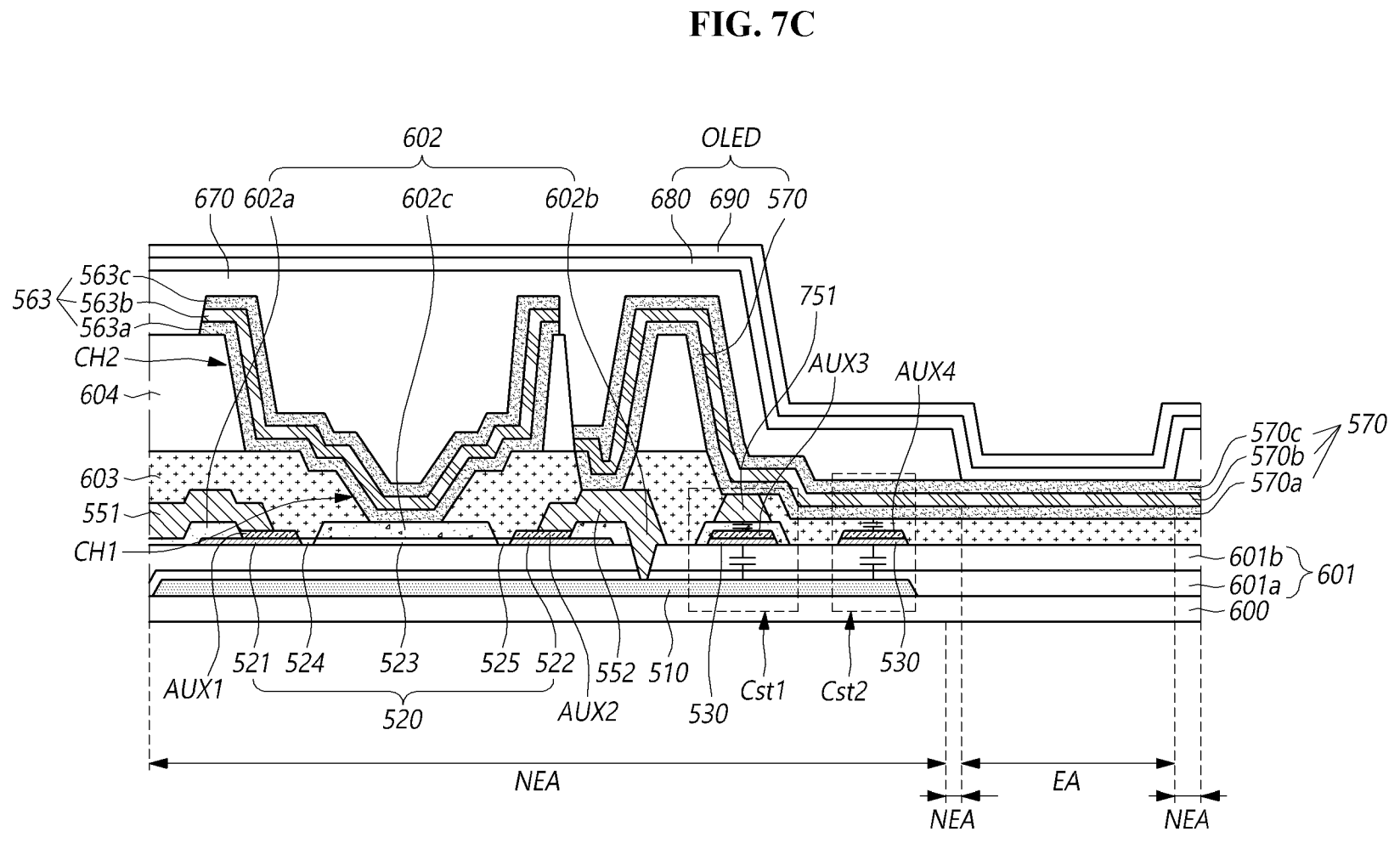
Figure 8:
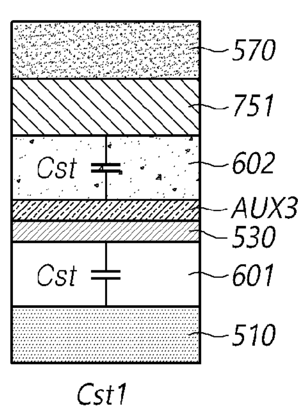
FIG. 8 shows schematic views illustrating structures of storage capacitors disposed in at least one subpixel of a display device according to some aspects of the present disclosure.
Figure 8:
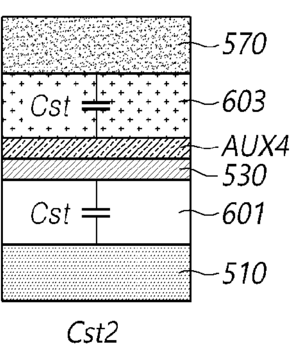

FIGS. 7A to 7C are a schematic cross-sectional views of display devices according to some aspects of the present disclosure. FIG. 8 shows schematic views illustrating structures of storage capacitors disposed in at least one subpixel of a display device according to some aspects of the present disclosure.

In the following description, content (configurations, effects, and the like) that overlaps that of the above-described examples may be omitted. In addition, in the following description, the same reference numbers may be used for components overlapping those of the above-described examples.

In FIGS. 7A to 7C, only third electrodes 563 and pixel electrodes 570 may have different structures, and the remaining components may have the same structure.

Specifically, in FIG. 7A, the third electrode 563 may be formed as a single layer including a metal material, and the pixel electrode 570 may be formed as a single layer including a transparent conductive material.

In FIG. 7B, the third electrode 563 may be formed as a double layer and may include a first gate electrode layer 563*a* including a transparent conductive material and a second gate electrode layer 563*b* including a metal material, and the pixel electrode 570 may have a single layer structure including a transparent conductive material.

In FIG. 7C, the third electrode 563 may be formed as three layers and may include a first gate electrode layer 563*a* including a transparent conductive material, a second gate electrode layer 563*b* including a metal material, and a third gate electrode layer 563*c* including a transparent conductive material. In addition, the pixel electrode 570 may be formed as a triple layer structure including a first layer 570*a* including a transparent conductive material, a second layer 570*b* including a metal material, and a third layer 570*c* including a transparent conductive material.

Referring to FIGS. 7A to 7C, an auxiliary electrode may be disposed on at least one active layer among a plurality of active layers disposed in a subpixel of the display device according to examples of the present disclosure.

As shown in FIGS. 7A to 7C, a transistor disposed on a display panel 110 according to examples of the present disclosure may further include a first auxiliary electrode AUX1 on a first region 521 and a second auxiliary electrode AUX2 on a second region 522.

The first auxiliary electrode AUX1 may be positioned between the first region 521 and a first electrode 551 to electrically connect the first region 521 and the first electrode 551. The second auxiliary electrode AUX2 may be positioned between the second region 522 and a second electrode 552 to electrically connect the second region 522 and the second electrode 552.

A conductive material included in each of the first auxiliary electrode AUX1 and the second auxiliary electrode AUX2 may include a metal included in the first electrode 551, the second electrode 552, or a third electrode 563. For example, the metal included in the first electrode 551, the second electrode 552, or the third electrode 563 may be copper (Cu), aluminum (Al), molybdenum (Mo), titanium (Ti), molybdenum-titanium (MoTi), or the like.

When the first electrode 551, the second electrode 552, or the third electrode 563 has a double metal structure, the conductive material included in each of the first auxiliary electrode AUX1 and the second auxiliary electrode AUX2 may include a first metal (for example, MoTi) included in a first lower electrode, a second lower electrode, or a third lower electrode.

FIGS. 7A to 7C illustrate a structure in which the first and second auxiliary electrodes AUX1 and AUX2 are single layers, but the present disclosure is not limited thereto.

When the first and second auxiliary electrodes AUX1 and AUX2 have multilayer structures, a lower layer may include a transparent conductive material, and an upper layer may include a metal material, a transparent conductive oxide (TCO), oxynitride, or an organic material, but the present disclosure is not limited thereto.

Also, referring to FIGS. 7A to 7C, the first active layer 520 may further include a third region 524 disposed between the first region 521 and a channel region 523 and a fourth region 525 disposed between the second region 522 and the channel region 523.

The third region 524 and the fourth region 525 of the first active layer 520 may be conductive regions. For example, the third region 524 and the fourth region 525 may have conductivity in a process of patterning a gate insulating film 602, but the present disclosure is not limited thereto.

In addition, the display device according to examples of the present disclosure may include a third auxiliary electrode AUX3 disposed on a portion of an upper surface of the second active layer 530 and a fourth auxiliary electrode AUX4 disposed on a second active layer 530. The second active layer 530 may be disposed to be coplanar with the first active layer 520.

The third and fourth auxiliary electrodes AUX3 and AUX4 may be disposed to be separated from each other and coplanar with the first and second auxiliary electrodes AUX1 and AUX2 and may include the same material as the first and second auxiliary electrodes AUX1 and AUX2.

Referring to FIGS. 7A to 7C, in the display device according to examples of the present disclosure, regions in which a storage capacitor Cst includes different storage capacitor electrodes may be present in one subpixel.

For example, referring to FIGS. 7A to 7C and 8, in the display device according to examples of the present disclosure, at least one subpixel may include a first storage capacitor Cst1 and a second storage capacitor Cst2.

Referring to FIGS. 7A to 7C and 8, the first storage capacitor Cst1 may include an LS 510 that is a first lower storage capacitor electrode, a third auxiliary electrode AUX3 that is a first intermediate storage capacitor electrode, a gate metal layer 751 that is a first upper storage capacitor electrode, and a pixel electrode 570.

Specifically, a buffer layer 601 may be disposed on the light shield LS 510 that is the first lower storage capacitor electrode, the second active layer 530 may be disposed on the buffer layer 601, and the third auxiliary electrode AUX3 that is the first intermediate storage capacitor electrode may be disposed on the second active layer 530. A gate insulating film 602 may be disposed on the third auxiliary electrode AUX3, and the gate metal layer 751, which is the first upper storage capacitor electrode, and the pixel electrode 570 may be disposed on the gate insulating film 602.

The pixel electrode 570 may be disposed on the gate metal layer 751, and the gate metal layer 751 may be disposed to be coplanar with first and second electrodes 551 and 552 of the transistor TR.

Referring to FIGS. 7A to 7C and 8, the second storage capacitor Cst2 may include the light shield LS 510 that is a second lower storage capacitor electrode, the fourth auxiliary electrode AUX4 that is a second intermediate storage capacitor electrode, and the pixel electrode 570 that is a second upper storage capacitor electrode.

Specifically, the buffer layer 601 may be disposed on the light shield LS 510 that is the second lower storage capacitor electrode, the second active layer 530 may be disposed on the buffer layer 601, and the fourth auxiliary electrode AUX4 that is the second intermediate storage capacitor electrode may be disposed on the second active layer 530. A first insulating film 603 may be disposed on the fourth auxiliary electrode AUX4, and the pixel electrode 570 that is the second upper storage capacitor electrode may be disposed on the first insulating film 603.

The first storage capacitor Cst1 and the second storage capacitor Cst2 may be connected in parallel, and thus capacity of the storage capacitor Cst may be increased.

Accordingly, to increase the capacity of the storage capacitor Cst, there is no need to increase an area of a storage capacitor Cst or reduce an area of an opening (for example, an emission area). In other words, the capacity of the storage capacitor Cst may be increased while maintaining an area of the opening.

Figure 9B:
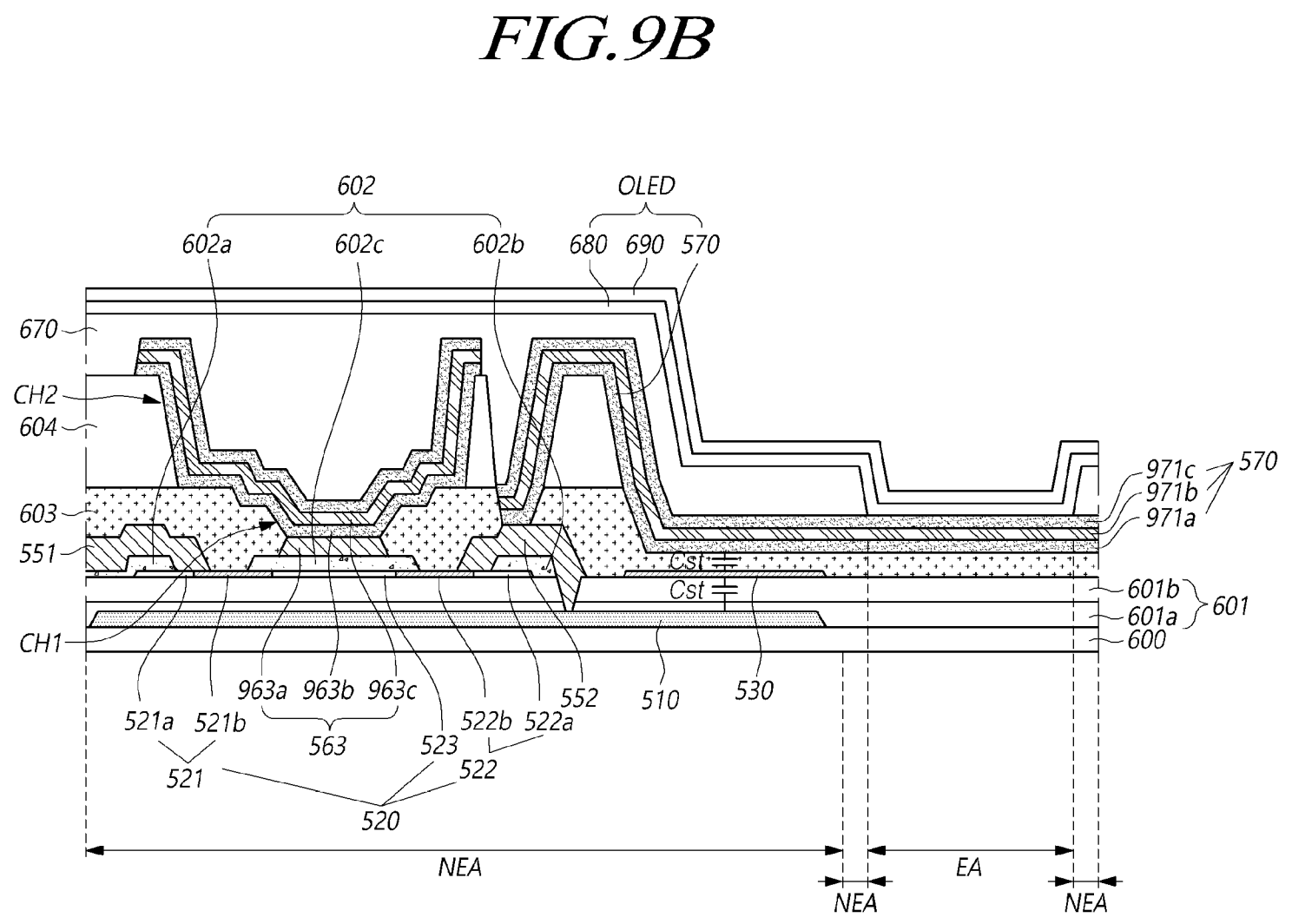

FIGS. 9A and 9B are views illustrating cross-sectional structures of display devices according to some aspects of the present disclosure.

In the following description, content (configurations, effects, and the like) that overlaps that of the above-described examples may be omitted. In addition, in the following description, the same reference numbers may be used for components overlapping those of the above-described examples.

Referring to FIGS. 9A and 9B, a third electrode 563 of a display panel according to examples of the present disclosure may include a first gate electrode layer 963*a*, a second gate electrode layer 963*b*, and a third gate electrode layer 963*c*.

Specifically, referring to FIGS. 9A and 9B, a first electrode 551, a second electrode 552, and the first gate electrode layer 963*a* may be disposed on a gate insulating film 602 overlapping the channel region 523. The first gate electrode layer 963*a* may be disposed to be coplanar with the first electrode 551 and the second electrode 552 and may include the same material as the first electrode and the second electrode.

As shown in FIGS. 9A and 9B, the first electrode 551 may be disposed on a first gate insulating film portion 602*a*, the second electrode 552 may be disposed on a second gate insulating film portion 602*b*, and the first gate electrode layer 963*a* may be disposed on a third gate insulating film portion 602*c*. The first gate electrode layer 963*a* may be disposed in contact with an upper surface of the third gate insulating film portion 602*c*.

A width of the first gate electrode layer 963*a* may correspond to a width of a channel region 523 of a first active layer 520, but the width of the channel region 523 according to examples of the present disclosure is not limited thereto. Here, the width of the first gate electrode layer 963*a* and the width of the channel region 523 may be minimum lengths of the first gate electrode layer 963*a* and the channel region 523 in a direction perpendicular to a direction in which a buffer layer 601 is stacked on a substrate 600.

Referring to FIGS. 9A and 9B, as in the first active layer 520 shown in FIGS. 6A to 6E, the first active layer 520 may include first and second regions 521 and 522 of which at least some or all portions have conductivity and which may have a structure in which the channel region 523 is disposed between the first region 521 and the second region 522.

FIG. 9A illustrates an example of a structure in which the entirety of each of the first region 521 and the second region 522 of the first active layer 520 has conductivity, but the present disclosure is not limited thereto. As shown in FIG. 6C, a structure in which only a portion of each of the first region 521 and the second region 522 of the first active layer 520 has conductivity may be applied. On the other hand, FIG. 9B illustrates an example of a structure in which a portion of each of the first region 521 and the second region 522 of the first active layer 520 has conductivity, but the present disclosure is not limited thereto. As shown in FIGS. 6A and 6B, a structure in which the entirety of each of the first region 521 and the second region 522 of the first active layer 520 has conductivity may be applied.

A first insulating film 603 including a first hole CH1 may be disposed on the substrate 600 on which the first electrode 551, the second electrode 552, and the first gate electrode layer 963*a* are disposed.

Referring to FIGS. 9A and 9B, the first insulating film 603 may be disposed to expose a portion of an upper surface of the first gate electrode layer 963*a*. A portion of the upper surface of the first gate electrode layer 963*a* may be exposed through the first hole CH1 of the first insulating film 603.

A second insulating film 604 including a second hole CH2 overlapping the first hole CH1 may be disposed on the first insulating film 603.

The upper surface of the first gate electrode layer 963*a* exposed through the first hole CH1 may also be exposed through the second hole CH2 of the second insulating film 604.

The second gate electrode layer 963*b* may be disposed on the first gate electrode layer 963*a*, inside the first hole CH1 and the second hole CH2 and on a portion of an upper surface of the second insulating film 604.

Specifically, referring to FIGS. 9A and 9B, the second gate electrode layer 963*b* may be disposed on the upper surface of the first gate electrode layer 963*a* exposed through the first and second holes CH1 and CH2, may be disposed on side surfaces of the first and second insulating films 603 and 604 in the first and second holes CH1 and CH2, and may also be disposed on a portion of an upper surface of the second insulating film 604 surrounding the second hole CH2.

That is, a portion of the second gate electrode layer 963*b* may be in contact with a portion of the upper surface of the first gate electrode layer 963*a*.

Referring to FIGS. 9A and 9B, the second gate electrode layer 963*b* may be disposed to be coplanar with a pixel electrode 570 and may include the same material as the pixel electrode 570. For example, a material of the second gate electrode layer 963*b* may include a transparent conductive material.

The third gate electrode layer 963*c* may be disposed on the second gate electrode layer 963*b*.

The first gate electrode layer 963*a* and the third gate electrode layer 963*c* may include a metal material. For example, the third gate electrode layer 963*c* may include copper (Cu), aluminum (Al), molybdenum (Mo), titanium (Ti), molybdenum-titanium (MoTi), or the like.

In the second and third gate electrode layers 963*b* and 963*c*, a material of the second gate electrode layer 963*b* may be formed on the substrate 600 on which the second insulating film 604 is disposed, and a material of the third gate electrode layer 963*c* may be formed on the material of the second gate electrode layer 963*b*.

Thereafter, the material of the third gate electrode layer 963*c* may be patterned through a photolithography process using a halftone mask to form the third gate electrode layer 963*c*, and then the material of the second gate electrode layer 963*b* may be patterned to form the second gate electrode layer 963*b*.

Therefore, the first gate electrode layer 963*a*, the second gate electrode layer 963*b*, and the third gate electrode layer 963*c* are formed without an increase in the number of masks, and thus the third electrode 563 including the first to third gate electrode layers 963*a*, 963*b*, and 963*c* may be formed through a simple process.

As described above, the third gate electrode layer 963*c* including a metal material is disposed inside the first and second holes CH1 and CH2 to overlap the first active layer 520 and is also disposed on the side surfaces of the first and second insulating films 603 and 604, thereby preventing a phenomenon in which light is incident on the first active layer 520 by passing through the first and second insulating films 603 and 604. Accordingly, it is possible to prevent the characteristics of a transistor TR from being degraded due to internal light.

Also, referring to FIG. 9B, the third electrode 563 may further include a fourth gate electrode layer 963*d* disposed on the third gate electrode layer 963*c*.

The fourth gate electrode layer 963*d* may include a transparent conductive material.

Referring to FIG. 9B, a portion of the third electrode 563 serving as a gate electrode of the transistor TR and the pixel electrode 570 may be formed in the same process.

Referring to FIG. 9B, the pixel electrode 570 may include a first pixel electrode layer 971*a*, a second pixel electrode layer 971*b* disposed on the first pixel electrode layer 971*a*, and a third pixel electrode layer 971*c* disposed on the second pixel electrode layer 971*b*.

Referring to FIG. 9B, the second to fourth gate electrode layers 963*b*, 963*c*, and 963*d* of the third electrode 563 may be disposed to be coplanar with the first to third pixel electrode layers 971*a*, 971*b*, and 971*c*, and the second to fourth gate electrode layers 963*b*, 963*c*, and 963*d* and the first to third pixel electrode layers 971*a*, 971*b*, and 971*c* may be formed through the same process.

Accordingly, each of the first pixel electrode layer 971*a* and the third pixel electrode layer 971*c* may include a transparent conductive material, and the second pixel electrode layer 971*b* may include a metal material.

Since the second to fourth gate electrode layers 963*b*, 963*c*, and 963*d* of the third electrode 563 and the first to third pixel electrode layers 971*a*, 971*b*, and 971*c* may be formed through the same process, there is an effect of simplifying a process.

In addition, referring to FIG. 9B, a storage capacitor Cst may include an LS 510 that is a first storage capacitor electrode, a second active layer 530 that has conductivity and is a second storage capacitor electrode, and the pixel electrode 570 that is a third storage capacitor electrode.

Since the third storage capacitor electrode included in the storage capacitor Cst of the display device according to embodiments of the present disclosure as the pixel electrode 570 including the first to third pixel electrode layers 971*a*, 971*b*, and 971*c*, a process of forming the third storage capacitor electrode is not added, thereby simplifying a process. In addition, since the LS 510 serves as the first storage capacitor electrode to serve to block light incident from a rear surface of the substrate 600, a separate component and manufacturing process for blocking light may not be added.

Next, a structure of a display device according to examples of the present disclosure will be further described with reference to FIG. 10.

In the following description, content (configurations, effects, and the like) that overlaps that of the above-described examples may be omitted. In addition, in the following description, the same reference numbers may be used for components overlapping those of the above-described examples.

FIGS. 10A to 10D are views illustrating structures of display devices according to some aspects of the present disclosure.

Figure 10A:
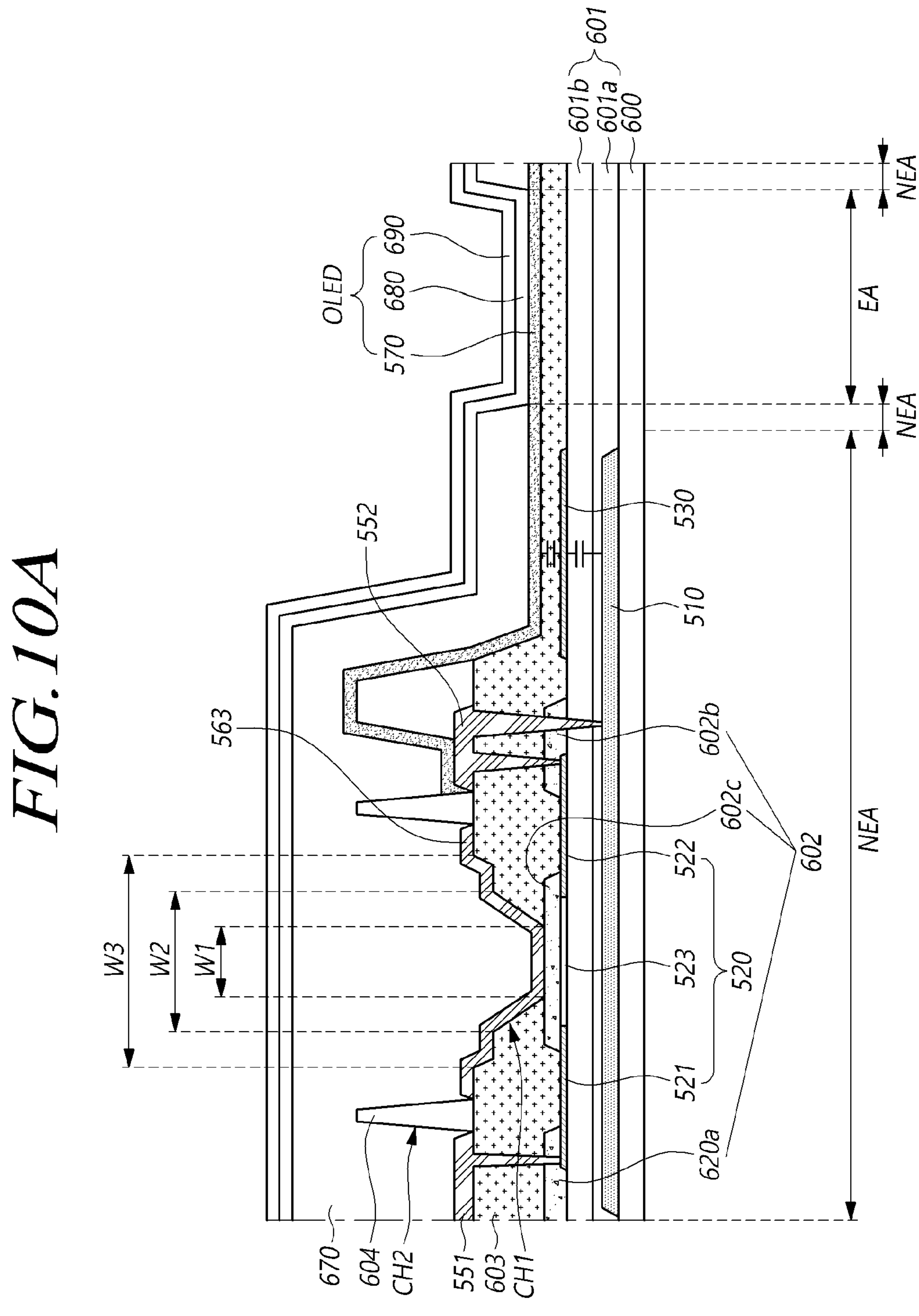
FIGS. 10A to 10D are views illustrating a structure structures of a display device devices according to embodiments of the present disclosure.

First, referring to FIG. 10A, a first electrode, a second electrode, and a third electrode disposed in a subpixel of the display device according to examples of the present disclosure may be disposed to be coplanar with each other and may include the same material.

Specifically, referring to FIG. 10A, a gate insulating film 602 including a plurality of gate insulating film portions may be disposed on a first active layer 520.

Meanwhile, FIG. 10A illustrates a structure in which the gate insulating film 602 includes the plurality of gate insulating film portions, but embodiments of the present disclosure are not limited thereto. The gate insulating film 602 may include only a third gate insulating film portion 602*c* overlapping a channel region 523 of a first active layer 520.

As shown in FIG. 10A, when the gate insulating film 602 includes first to third gate insulating film portions 602*a*, 602*b*, and 602*c*, each of a first region 521 and a second region 522 of the first active layer 520 may include a conductive region and a non-conductive region. For example, regions of the first region 521 and the second region 522 not overlapping the gate insulating film 602 may be conductive regions, and regions thereof overlapping the gate insulating film 602 may include non-conductive regions.

On the other hand, when the gate insulating film 602 includes only the third gate insulating film portion 602*c* disposed on the channel region 523 of the first active layer 520, each of the first and second regions 521 and 522 of the first active layer 520 may be a conductive region.

A first insulating film 603 having a first hole CH1 may be disposed on the gate insulating film 602, and a second insulating film 604 having a second hole CH2 may be disposed on the first insulating film 603.

Referring to FIG. 10A, the first hole CH1 may overlap a third gate insulating film portion 602*c* overlapping a channel region 523 of the first active layer 520. That is, the first insulating film 603 may be disposed to expose at least a portion of an upper surface of the third gate insulating film portion 602*c*.

Referring to FIG. 10A, the first insulating film 603 may have at least one stepped portion in the first hole CH1. Accordingly, a width of the first hole CH1 may include regions having at least two different widths W1, W2, and W3.

A first electrode 551, a second electrode 552, and a third electrode 563 may be disposed on the first insulating film 603.

Referring to FIG. 10A, the first electrode 551 may be in contact with a first region 521 of the first active layer 520 through contact holes formed in the first insulating film 603 and a first gate insulating film portion 602*a*. In addition, the first electrode 551 may be in contact with an LS 510 through contact holes formed in the first insulating film 603, the first gate insulating film portion 602*a*, and a buffer layer 601.

The second electrode 552 may be in contact with a second region 522 of the first active layer 520 through contact holes formed in the first insulating film 603 and a second gate insulating film portion 602*b*.

The third electrode 563 may be disposed in the first hole CH1 of the first insulating film 603. In the first hole CH1, the third electrode 563 may be in contact with a portion of an upper surface of a third gate insulating film portion 602*c*.

The third electrode 563 may serve as a gate electrode of a transistor TR and concurrently may prevent internal light from being incident on the first active layer 520.

Referring to FIG. 10A, the second insulating film 604 may be disposed on a portion of an upper surface of the first insulating film 603 on which the first to third electrodes 551, 552, and 563 are disposed.

The second insulating film 604 may be disposed to expose at least a portion of an upper surface of each of the first to third electrodes 551, 552, and 563.

The second insulating film 604 may include the second hole CH2 overlapping the first hole CH1 and may expose at least a portion of the upper surface of the third electrode 563 through the second hole CH2.

Referring to FIG. 10A, the second insulating film 604 may include a contact hole exposing a portion of the upper surface of the second electrode 552.

A pixel electrode 570 may be in contact with a portion of the upper surface of the second electrode 552 disposed on the first insulating film 603 through the contact hole of the second insulating film 604.

A bank 670 may be disposed on the first electrode 551, the second electrode 552, the third electrode 563, the pixel electrode 570, and the second insulating film 604.

Figure 10B:
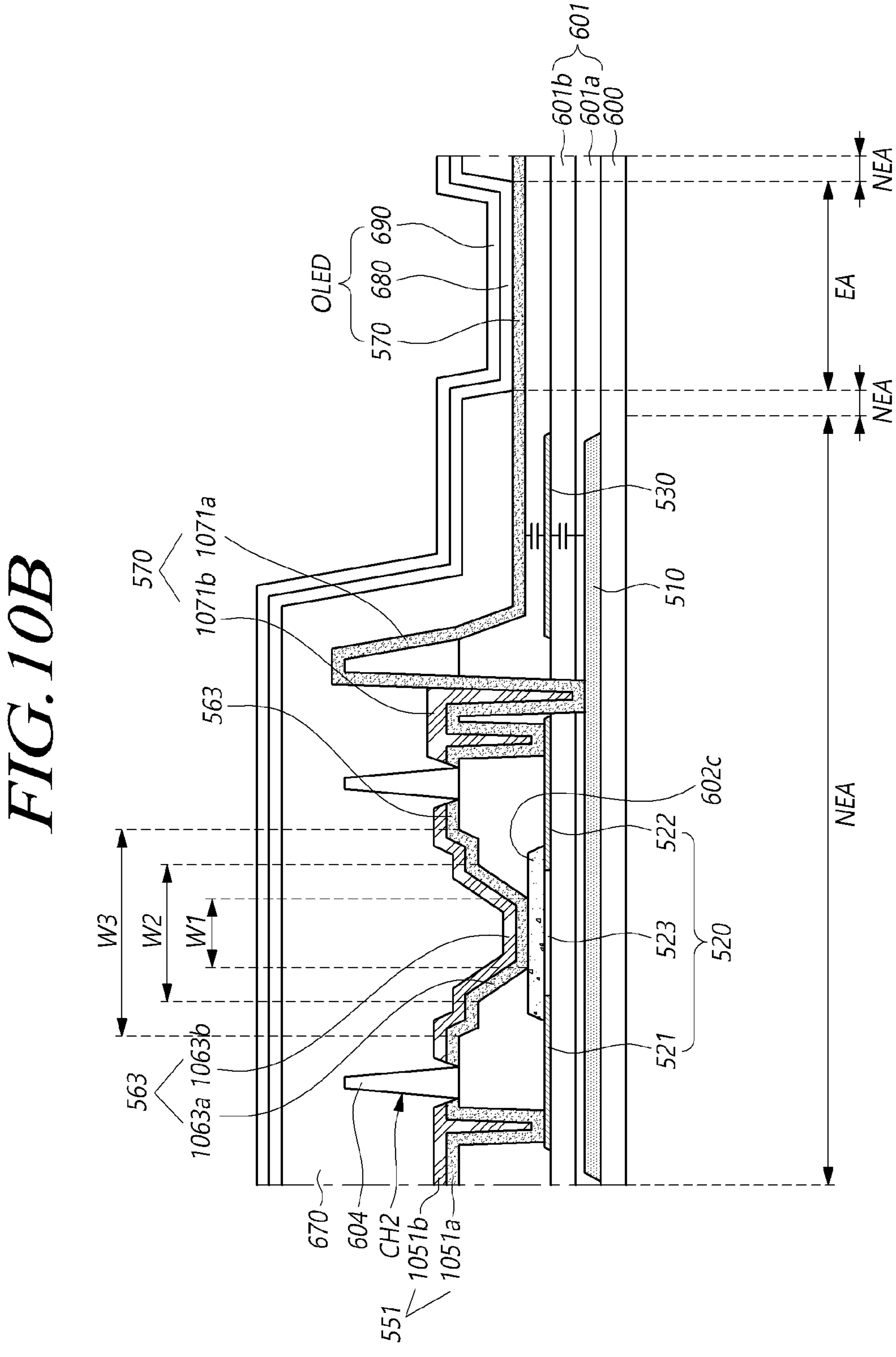
Figure 10C:
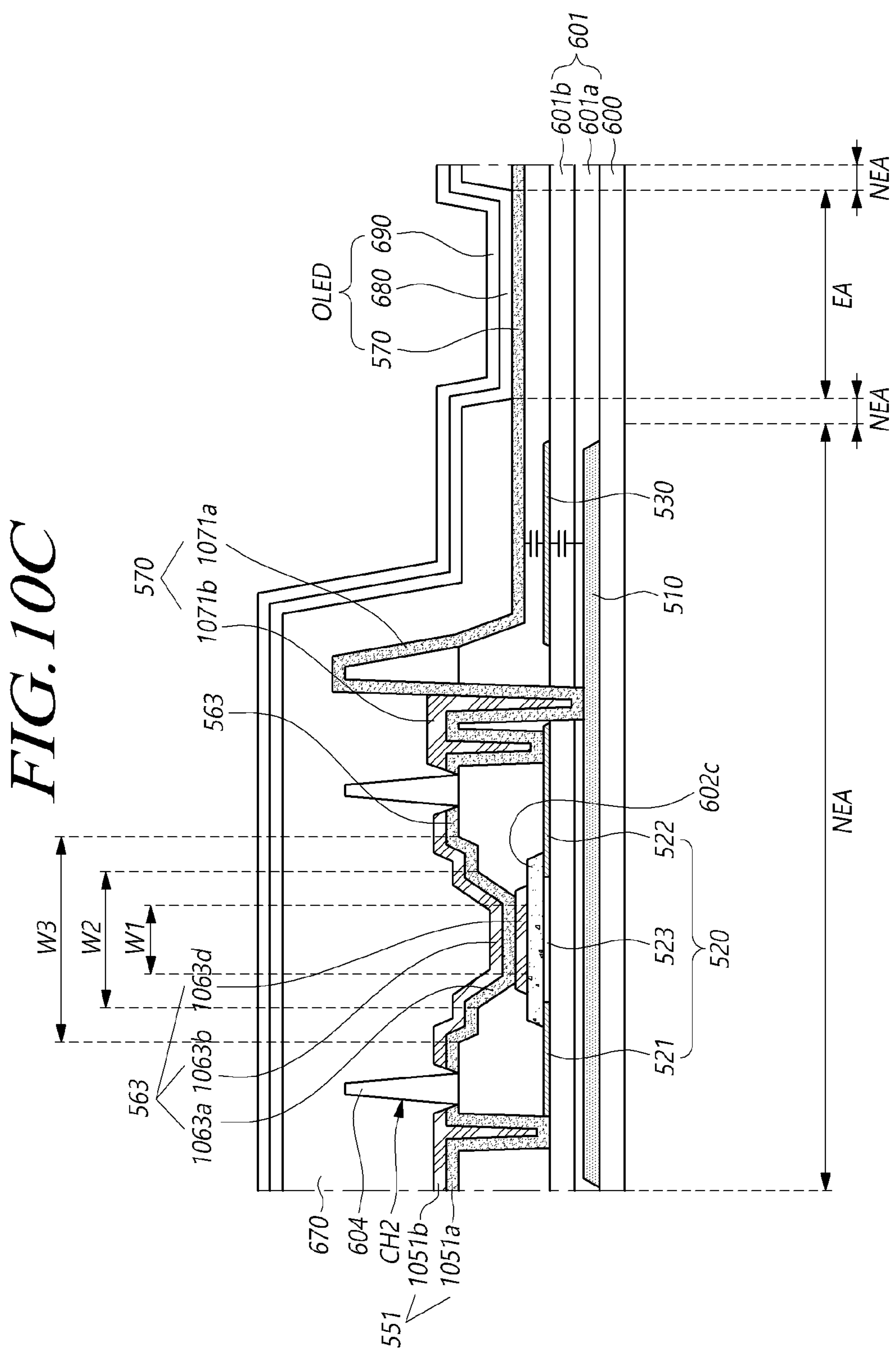
Figure 10D:
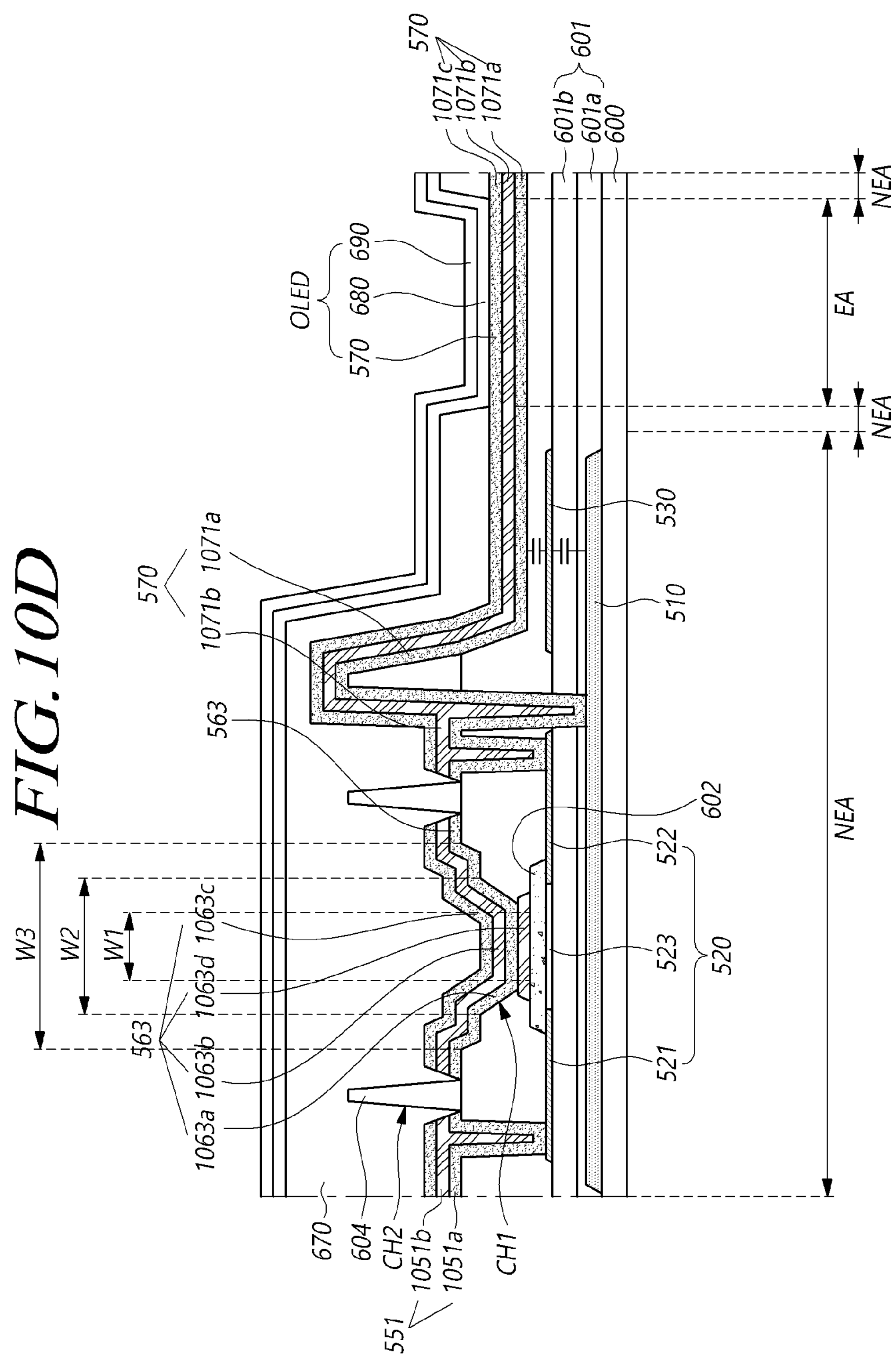

Only the gate insulating film 602, first electrode 551, second electrode, third electrode 563, and pixel electrode 570 of each of the display devices shown in FIGS. 10B to 10D have different structures from those of the display device of FIG. 10A, and the remaining components thereof may have the same structures as those of the display device of FIG. 10A.

Specifically, although FIG. 10A illustrates a structure in which the first electrode 551, the second electrode 552, the third electrode 563, and the pixel electrode 570 are single layers, FIGS. 10B to 10D illustrate a structure in which the first electrode 551, the third electrode 563, and the pixel electrode 570 have multilayer structures, and the pixel electrode 570 and the second electrode are integrally formed. Although 10A illustrates a structure in which the gate insulating film 602 includes the first to third gate insulating film portions 602*a*, 602*b*, and 603*c*, FIGS. 10B to 10D illustrate a structure including only the gate insulating film 602 overlapping the channel region 523 of the first active layer 520.

In the following description, structures of the first electrode 551, the third electrode 553, and the pixel electrode 570 shown in FIGS. 10B to 10D will be mainly described.

Referring to FIG. 10B, the first electrode 551, the third electrode 553, and the pixel electrode 570 may have a double layer structure. For example, the first electrode 551 may include a first electrode layer 551*a* and a second electrode layer 551*b*, the third electrode 553 may include first and second gate electrode layers 1063*a* and 1063*b*, and the pixel electrode 570 may include first and second pixel electrode layers 1071*a* and 1071*b*.

Specifically, referring to FIG. 10B, the first insulating film 603 may be disposed on a substrate 600 on which the gate insulating film 602 is disposed.

The first insulating film 603 may be disposed to expose a portion of an upper surface of the gate insulating film 602 disposed on the channel region 523 of the first active layer 520.

Referring to FIG. 10B, the first electrode 551, the third electrode 553, the pixel electrode 570, and the second insulating film 604 may be disposed on the first insulating film 603.

Referring to FIG. 10B, a first electrode 551 of the transistor TR may include the first electrode layer 551*a* disposed on the first insulating film 603, the second electrode layer 551*b* disposed on the first electrode layer 551*a*, and the third electrode layer 551*c* disposed on the second electrode layer 551*b*.

Here, each of the first electrode layer 551*a* and the third electrode layer 551*c* may include a transparent conductive material. The second electrode layer 551*b* may include a metal material.

The third electrode 553 may include the first gate electrode layer 1063*a* disposed on the gate insulating film 602 and the first insulating film 603 and the second gate electrode layer 1063*b* disposed on the first gate electrode layer 1063*a*.

Here, the first gate electrode layer 1063*a* may include a transparent conductive material, and the second gate electrode layer 1063*b* may include a metal material.

The pixel electrode 570 may include the first pixel electrode layer 1071*a* disposed on the first insulating film 603 and the second insulating film 604 and the second pixel electrode layer 1071*b* disposed on the first pixel electrode layer 1071*a*.

Here, the first pixel electrode layer 1071*a* may include a transparent conductive material, and the second pixel electrode layer 1071*b* may include a metal material.

The first electrode layer 1051*a* of the first electrode 551, the first gate electrode layer 1063*a* of the third electrode 563, and the first pixel electrode layer 1071*a* of the pixel electrode 570 may include the same material and may be disposed to be coplanar with each other.

Further, the second electrode layer 1051*b* of the first electrode 551, the second gate electrode layer 1063*b* of the third electrode 563, and the second pixel electrode layer 1071*b* of the pixel electrode 570 may include the same material and may be disposed to be coplanar with each other.

Accordingly, since the first electrode 551, the third electrode 563, and the pixel electrode 570 may be formed in the same process, a process can be simplified.

Also, referring to FIG. 10B, the first electrode 551 may be in contact with the first region 521 of the first active layer 520, which has conductivity, through a contact hole formed in the first insulating film 603.

The pixel electrode 570 may be disposed in the entirety of an emission area EA and a portion of a non-emission area NEA and may overlap at least a portion of the second region 522 of the first active layer 520 and also overlap at least a portion of the LS 510. The pixel electrode 570 may be in contact with the second region 522 of the first active layer 520 through a contact hole of the first insulating film 603 and may be in contact with the LS 510 through a contact hole of the first insulating film 603 and the buffer layer 601 and thus may also serve as a second electrode of the transistor.

Also, in the pixel electrode 570, the first pixel electrode layer 1071*a* may be disposed in the entirety of the emission area EA and a portion of the non-emission area NEA, but the second pixel electrode layer 1071*b* may not be disposed in the emission area EA and may be disposed only in a portion of the non-emission area NEA. For example, referring to FIG. 10B, the second pixel electrode layer 1071*b* may be disposed only in areas overlapping the second region 522 of the first active layer 520 and the LS 510.

Next, referring to FIG. 10C, in addition to the structure of FIG. 10B, the third electrode 563 may have a structure further including an additional gate electrode layer 1063*d*.

Specifically, referring to FIG. 10C, the first electrode 551 may have a double layer structure, the third electrode 563 may have a triple layer structure, and the pixel electrode 570 may have a double layer structure.

The first electrode 551 and the pixel electrode 570 shown in FIG. 10C may have the same structure as the first electrode 551 and the pixel electrode 570 shown in FIG. 10B, but the third electrode 563 shown in FIG. 10C may have a different structure from that shown in FIG. 10B.

Referring to FIG. 10C, the third electrode 563 includes the additional gate electrode layer 1063*d*, the first gate electrode layer 1063*a* disposed on the additional gate electrode layer 1063*d*, and the second gate electrode layer 1063*b* disposed on the additional gate electrode layer 1063*a*.

Each of the additional gate electrode layer 1063*d* and the second gate electrode layer 1063*b* may include a metal material, and the first gate electrode layer 1063*a* may include a transparent conductive material.

The additional gate electrode layer 1063*d* of the third electrode 563 may be disposed on the gate insulating film 602 disposed on the channel region 523 of the first active layer 520.

The first insulating film 603 may be disposed on the additional gate electrode layer 1063*d*.

The first gate electrode layer 1063*a* and the second gate electrode layer 1063*b* of the third electrode 563 may be disposed on the first insulating film 603. As shown in FIG. 10C, the first and second gate electrode layers 1063*a* and 1063*b* may be disposed in the first hole CH1 of the first insulating film 603. In the first hole CH1, the first gate electrode layer 1063*a* may be in contact with an upper surface of the additional gate electrode layer 1063*d*.

Next, referring to FIG. 10D, the first electrode 551, the pixel electrode 570, and an overcoat layer 604 may be disposed on the first insulating film 603.

Referring to FIG. 10D, the first electrode 551 may have a triple layer structure, the third electrode 553 may have a quadruple layer structure, and the pixel electrode 570 may have a triple layer structure. For example, the first electrode 551 may include the first to third electrode layers 551*a*, 551*b*, and 551*c*, the third electrode 553 includes first to fourth gate electrode layers 1063*a*, 1063*b*, 1063*c*, and 1063*d*, and the pixel electrode 570 may include first to third pixel electrode layers 1071*a*, 1071*b*, and 1071*c*.

Specifically, referring to FIG. 10D, the first gate electrode layer 1063*a* may be disposed on the gate insulating film 602. The first gate electrode layer 1063*a* may include a metal material.

The first insulating film 603 may be disposed on the substrate 600 on which the first gate electrode layer 1063*a* is disposed.

The first insulating film 603 may be disposed to expose a portion of an upper surface of the first gate electrode layer 1063*a*. Referring to FIG. 10D, the first hole CH1 of the first insulating film 603 may overlap a portion of the upper surface of the first gate electrode layer 1063*a*.

Referring to FIG. 10D, the first electrode 551, the third electrode 553, the pixel electrode 570, and the second insulating film 604 may be disposed on the first insulating film 603.

Referring to FIG. 10D, the first electrode 551 of the transistor TR may include the first electrode layer 551*a* disposed on the first insulating film 603, the second electrode layer 551*b* disposed on the first electrode layer 551*a*, and the third electrode layer 551*c* disposed on the second electrode layer 551*b*.

Here, each of the first electrode layer 551*a* and the third electrode layer 551*c* may include a transparent conductive material. The second electrode layer 551*b* may include a metal material.

The third electrode 553 may include the additional gate electrode layer 1063*d*, the first gate electrode layer 1063*a* disposed on the additional gate electrode layer 1063*d*, the second gate electrode layer 1063*b* disposed on the first gate electrode layer 1063*a*, and the third gate electrode layer 1063*c* disposed on the second gate electrode layer 1063*b*.

Here, each of the additional gate electrode layer 1063*d* and the second gate electrode layer 1063*b* may include a metal material, and each of the first gate electrode layer 1063*a* and the third gate electrode layer 1063*c* may include a transparent conductive material.

The pixel electrode 570 may include the first pixel electrode layer 1071*a* disposed on the first insulating film 603 and the second insulating film 604, the second pixel electrode layer 1071*b* disposed on the first pixel electrode layer 1071*a*, and the third pixel electrode layer 1071*c* disposed on the second pixel electrode layer 1071*b*.

Referring to FIG. 10D, each of the first to third pixel electrode layers 1071*a*, 1071*b*, and 1071*c* may be disposed in the entirety of the emission area EA and may be disposed in a portion of the non-emission area NEA. Each of the first to third pixel electrode layers 1071*a*, 1071*b*, and 1071*c* may overlap a portion of the second region 522 of the first active layer 520 and may also overlap a portion of the LS 510.

Each of the first pixel electrode layer 1071*a* and the third pixel electrode layer 1071*c* may include a transparent conductive material, and the second pixel electrode layer 1071*b* may include a metal layer.

The first electrode layer 1051*a* of the first electrode 551, the first gate electrode layer 1063*a* of the third electrode 563, and the first pixel electrode layer 1071*a* of the pixel electrode 570 may include the same material and may be disposed to be coplanar with each other.

The second electrode layer 1051*b* of the first electrode 551, the second gate electrode layer 1063*b* of the third electrode 563, and the second pixel electrode layer 1071*b* of the pixel electrode 570 may include the same material and may be disposed to be coplanar with each other. Each of the second electrode layer 1051*b*, the second gate electrode layer 1063*b*, and the second pixel electrode layer 1071*b* may include a metal material having low resistance and high reflectance. For example, each of the second electrode layer 1051*b*, the second gate electrode layer 1063*b*, and the second pixel electrode layer 1071*b* may include at least one selected from among silver (Ag), copper (Cu), aluminum (Al), molybdenum (Mo), and titanium (Ti), and an alloy thereof.

In addition, the third electrode layer 1051*c* of the first electrode 551, the third gate electrode layer 1063*c* of the third electrode 563, and the third pixel electrode layer 1071*c* of the pixel electrode 570 may include the same material and may be disposed to be coplanar with each other.

Accordingly, a process of forming the first electrode 551, the third electrode 563, and the pixel electrode 570 can be simplified.

Referring to FIG. 10D, the pixel electrode 570 may be disposed to overlap the emission area EA and may be in contact with the second region 522 of the first active layer 520 of the transistor TR through a contact hole formed in the first insulating film 603. In addition, the pixel electrode 570 may be in contact with the LS 510 through a contact hole formed in the buffer layer 601 and the first insulating film 603.

That is, since the pixel electrode 570 is in contact with the first active layer of the transistor and it is not necessary to form a separate second electrode that is also in contact the pixel electrode 570, there is an effect that the structure of the transistor can be simplified, and a process can also be simplified.

Next, a process of manufacturing a display device according to embodiments of the present disclosure will be described below.

FIGS. 11 to 21 are schematic views illustrating processes of manufacturing the display device shown in FIG. 6C.

Referring first to FIG. 11, the LS 510 may be disposed on the substrate 600.

Then, as shown in FIG. 12, the first buffer layer 601*a* may be disposed on the substrate 600 on which the LS 510 is disposed, and the second buffer layer 601*b* may be disposed on the first buffer layer 601*a*.

Referring to FIG. 12, a first active layer pattern 1220 and a second active layer pattern 1221 may be disposed on the buffer layer 601 including the first and second buffer layers 601*a* and 601*b*. An active layer material may be formed on the buffer layer 601 and patterned to form the first and second active layer patterns 1220 and 1221.

Figure 13:
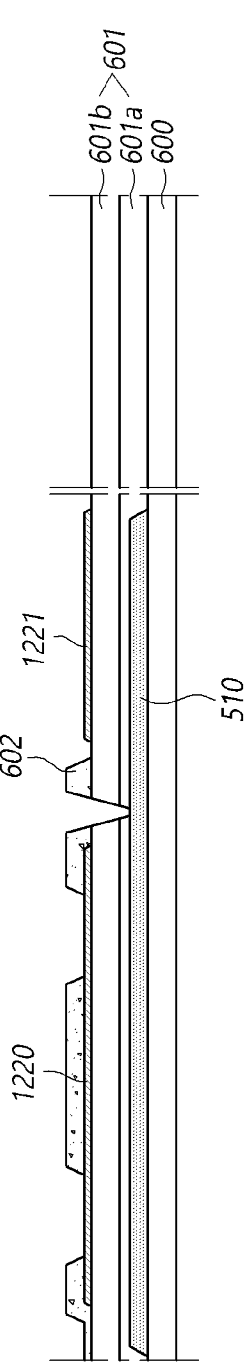

Thereafter, referring to FIG. 13, the gate insulating film 602 may be disposed on the substrate on which the first and second active layer patterns 1220 and 1221 are disposed.

A plurality of contact holes may be formed in the gate insulating film 602. Specifically, the gate insulating film 602 may include contact holes formed to expose portions of upper surfaces of the first and second active layer patterns 1220 and 1221 and a contact hole formed to expose a portion of an upper surface of the LS 510. In a process of forming the contact hole of the gate insulating film 602 exposing a portion of the upper surface of the LS 510, a contact hole may also be formed in the buffer layer 601 disposed below the gate insulating film 602.

In addition, the gate insulating film 602 may be formed to expose the entirety of the second active layer pattern 1221.

Figure 14:
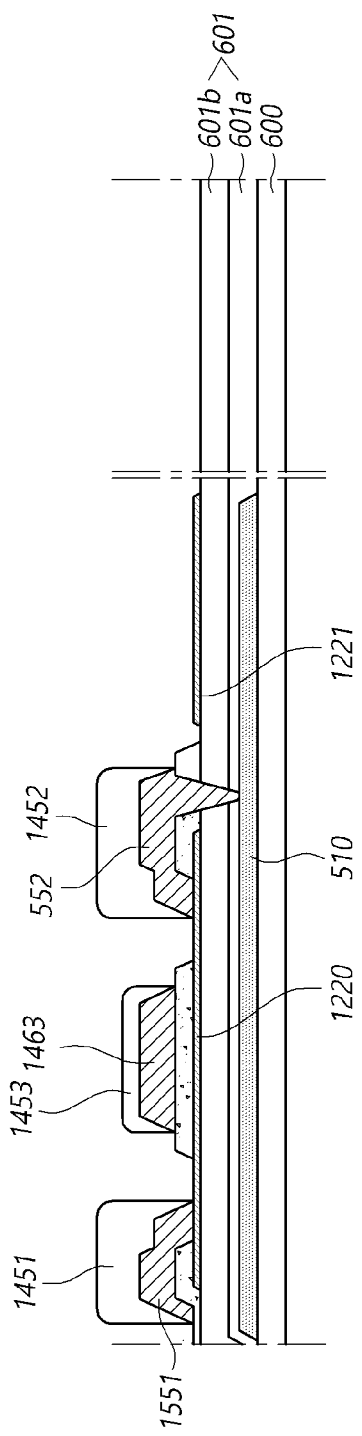

Next, referring to FIG. 14, the first electrode 551, the second electrode 552, and an electrode pattern 1463 may be formed on the gate insulating film 602 and the first active layer pattern 1220.

Specifically, an electrode material may be formed on the substrate 600 on which the gate insulating film 602 is disposed. The electrode material may include a metal material.

A photoresist material may be formed on the electrode material. The photoresist material may be patterned to be formed into a first photoresist pattern 1451, a second photoresist pattern 1452, and a third photoresist pattern 1453.

The photoresist material may be patterned through a halftone mask, and heights of the first and second photoresist patterns 1451 and 1452 formed after the patterning may be greater than that of the third photoresist pattern 1453.

Thereafter, the electrode material may be patterned using the first to third photoresist patterns 1451, 1452, and 1453 as a mask. By patterning the electrode material, the first electrode 551 may be formed below the first photoresist pattern 1451, the second electrode 552 may be formed below the second photoresist pattern 1452, and the electrode pattern 1463 may be formed below the third photoresist pattern 1453.

Figure 15:
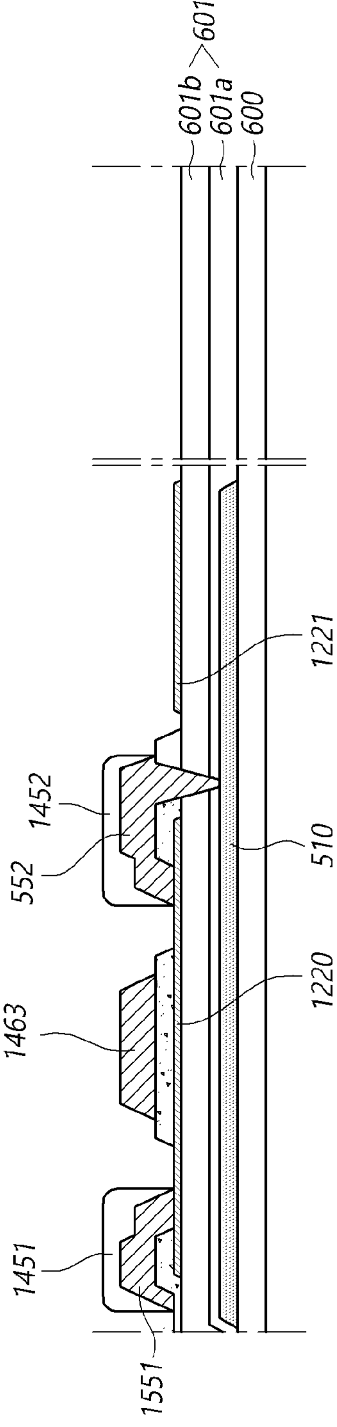

Then, referring to FIG. 15, the third photoresist pattern 1453 disposed on the electrode pattern 1463 may be removed.

The third photoresist pattern 1453 disposed on the electrode pattern 1463 may be removed through a dry etching process, and each of the first and second photoresist patterns 1451 and 1452 having a greater height than the third photoresist pattern 1453 may not be removed.

However, a portion of each of the first and second photoresist patterns 1451 and 1452 may be removed in a process of removing the third photoresist pattern 1453 so that the height of each of the first and second photoresist patterns 1451 and 1452 may be lowered. Specifically, the heights of the first and second photoresist patterns 1451 and 1452 of FIG. 15 may be smaller than the heights of the first and second photoresist patterns 1451 and 1452 of FIG. 14.

Subsequently, referring to FIG. 16, the first active layer pattern 1220 and the second active layer pattern 1221 may have conductivity through a dry etching process. In this case, through a dry etching process using carbon tetrafluoromethane (CF4), nitrogen trifutoride (NF3), sulfur hexafluoride (SF6), and helium (He) gases, at least a portion of each of the first active layer pattern and the second active layer pattern may have conductivity to be formed into the first active layer 520 and the second active layer 530.

Specifically, only a partial region of the first active layer 520 may have conductivity, and the entirety of the second active layer 530 may have conductivity.

Figure 16:
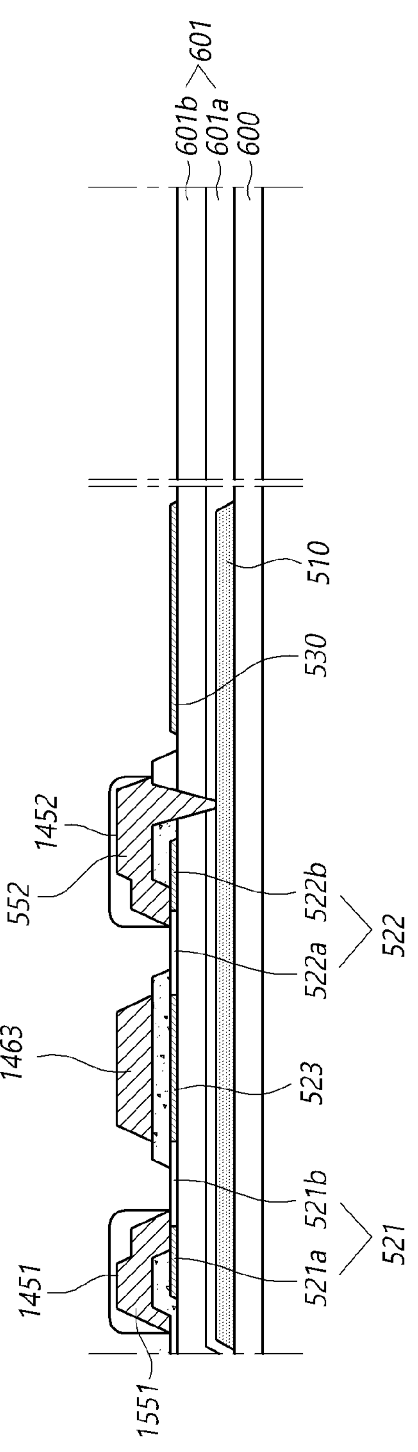

Referring to FIG. 16, a region of the first active layer 520, which does not overlap at least one of the gate insulating film 602, the first electrode 551, the second electrode 552, and the electrode pattern 1463, may be a conductive region. Accordingly, the first active layer 520 may be formed in a structure including the conductive second auxiliary region 521*b* disposed between the first auxiliary region 521*a* and the channel region 523 and the conductive fourth auxiliary region 522*b* disposed between the third auxiliary region 522*a* and the channel region 523.

In other words, since the gate insulating film 602, the first electrode 551, the second electrode 552, and the electrode pattern 1463 serve to block plasma, each of the first auxiliary region 521*a*, the third auxiliary region 522*a*, and the channel region 523 of the first active layer 520 may not have conductivity, but since there is no component that block plasma, the remaining regions, that is, the second auxiliary region 521*b*, the fourth auxiliary region 522*b*, and the second active layer 530 of the first active layer 520 may have conductivity through a dry etching process.

Meanwhile, by using a dry etching process so as to allow a portion of the first active layer 520 and the second active layer 530 to have conductivity, each of the first photoresist pattern 1451 disposed on the first electrode 551 and the second photoresist pattern 1452 disposed on the second electrode 552 may also be partially etched so that a height thereof may be lowered.

Specifically, the height of each of the first and second photoresist patterns 1451 and 1452 shown in FIG. 16 may be smaller than the height of each of the first and second photoresist patterns 1451 and 1452 shown in FIG. 15.

Figure 17:
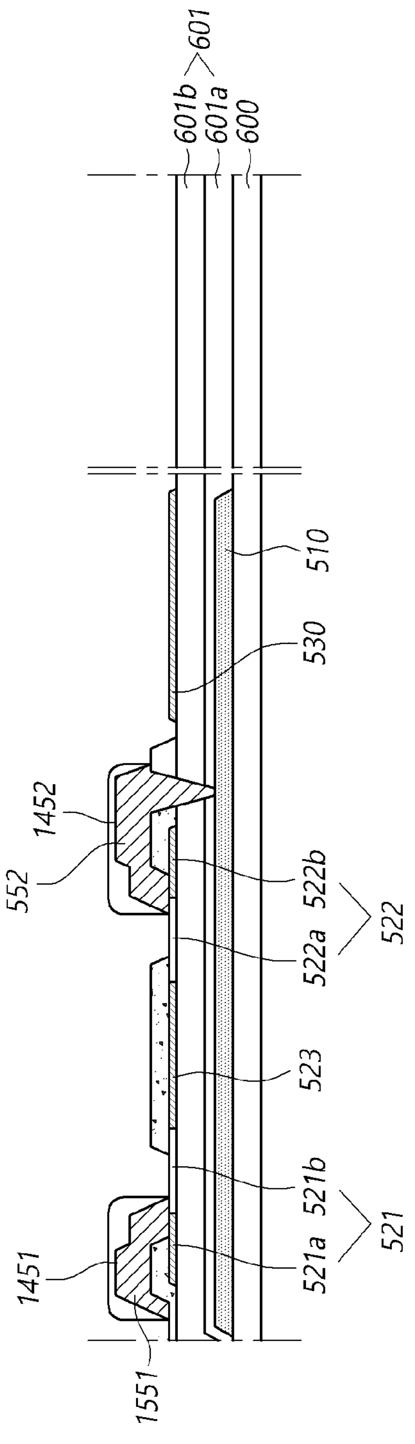

After that, as shown in FIG. 17, the electrode pattern 1463 disposed on the channel region 523 of the first active layer 520 and the gate insulating film 602 may be removed.

The electrode pattern 1463 may be removed through a wet etching process. In such a process, the first electrode 551 and the second electrode 552 including the same material as the electrode pattern 1463 may be surrounded by the first photoresist pattern 1451 and the second photoresist pattern 1452 and thus may have a structure in which an etching solution cannot permeate into the first and second electrodes 551 and 552. Therefore, the first and second electrodes 551 and 552 may remain without being removed, and since the photoresist pattern is removed on the electrode pattern 1463, the electrode pattern 1463 may be removed in a wet etching process.

Figure 18:
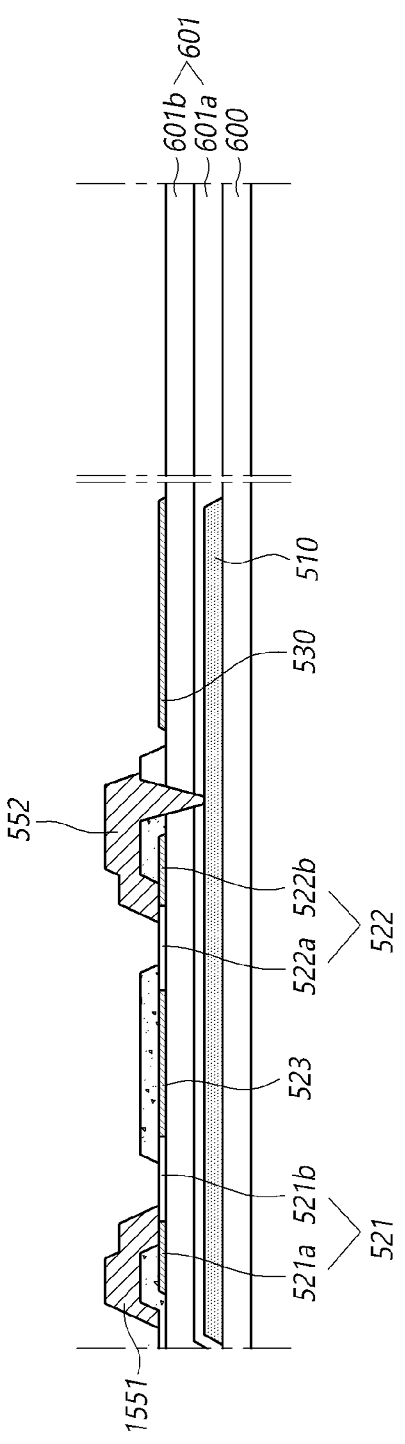

Then, as shown in FIG. 18, the first and second photoresist patterns 1451 and 1452 disposed on the first and second electrodes 551 and 552 may be removed through a strip process.

Figure 19:
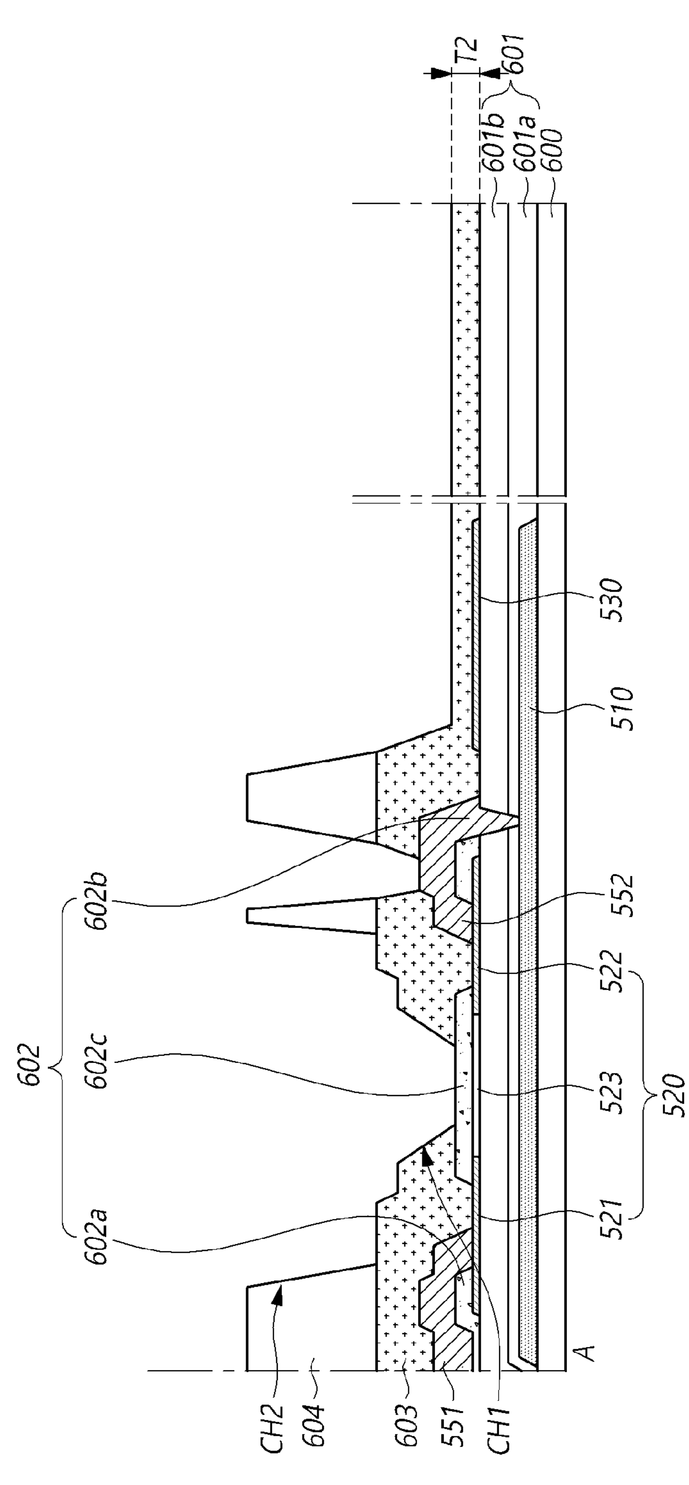

Next, referring to FIG. 19, the first insulating film 603 and the second insulating film 604 may be disposed on the substrate 600 on which the first and second electrodes 551 and 552 are disposed.

Specifically, a material of the first insulating film 603 is deposited on the substrate 600. Thereafter, a material of the second insulating film 604 is deposited on the material of the first insulating film 603.

Then, the material of the second insulating film 604 is patterned to form the second insulating film 604 which includes a second hole CH2 and does not overlap the second active layer 530.

Thereafter, the first insulating film 603 including the first hole CH1 formed in a region overlapping the second hole CH2 is formed through a dry etching process. A thickness of the first insulating film 603 disposed on the second active layer 530 may be smaller than that of the first insulating film 603 disposed on the first active layer 520.

However, the method of manufacturing the display device according to embodiments of the present disclosure is not limited thereto, the first insulating film 603 may not be disposed on the second active layer 530 and not be disposed in the emission area to be formed later, and the gate insulating film 602 may be disposed on the second active layer 530 and may be disposed to extend to the emission area to be formed later.

In addition, in a process of forming the first and second contact holes CH1 and CH2, a contact hole exposing a portion of an upper surface of the second electrode 552 may be formed in the first insulating film 603 and the second insulating film 604.

Figure 20:
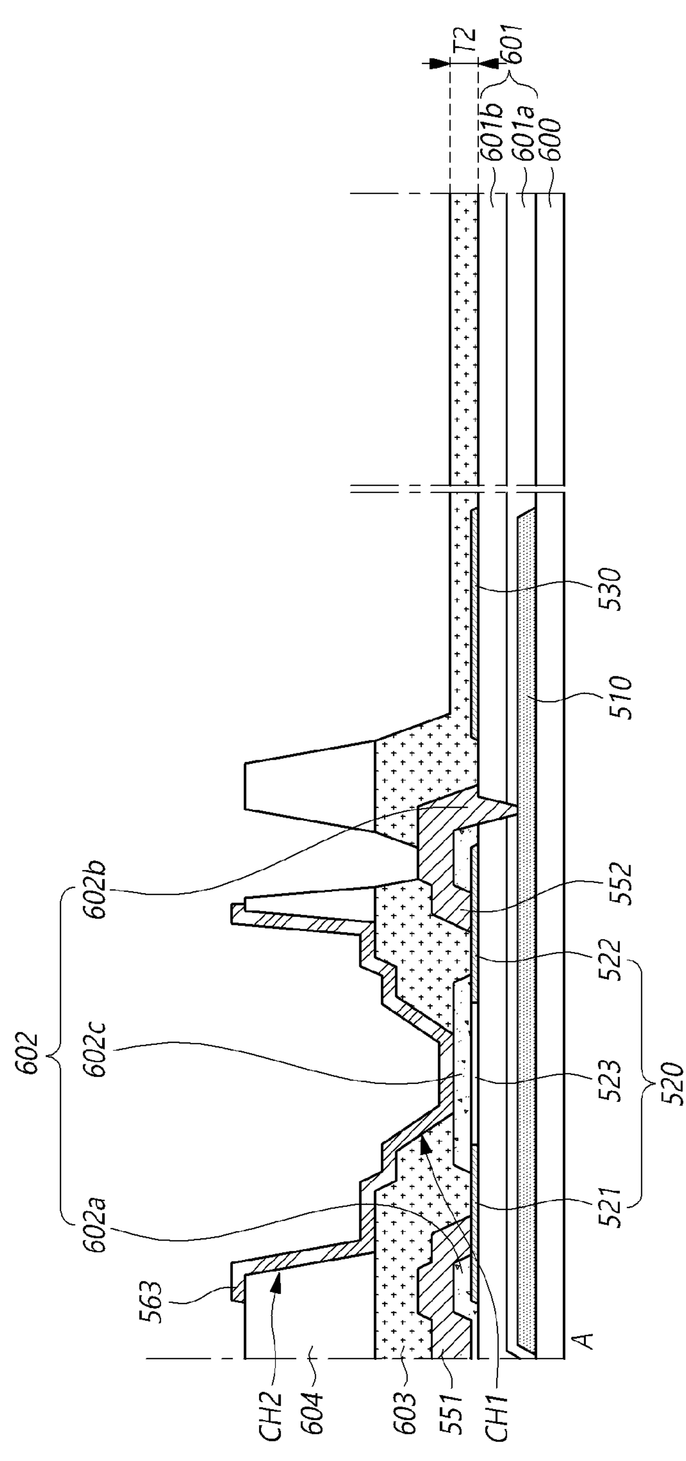

Then, referring to FIG. 20, a material of the third electrode 563 may be deposited on the substrate 600 on which the second insulating film 604 is formed. The material of the third electrode 563 may be patterned through an etching process to be formed into the third electrode 563 disposed on the second insulating film 604.

The third electrode 563 may be disposed on a portion of an upper surface of the second insulating film 604 and may be disposed in the first hole CH1 and the second hole CH2. The third electrode 563 may overlap an upper surface of the gate insulating film 602 disposed on the channel region 523 in the first and second holes CH1 and CH2.

Figure 21:
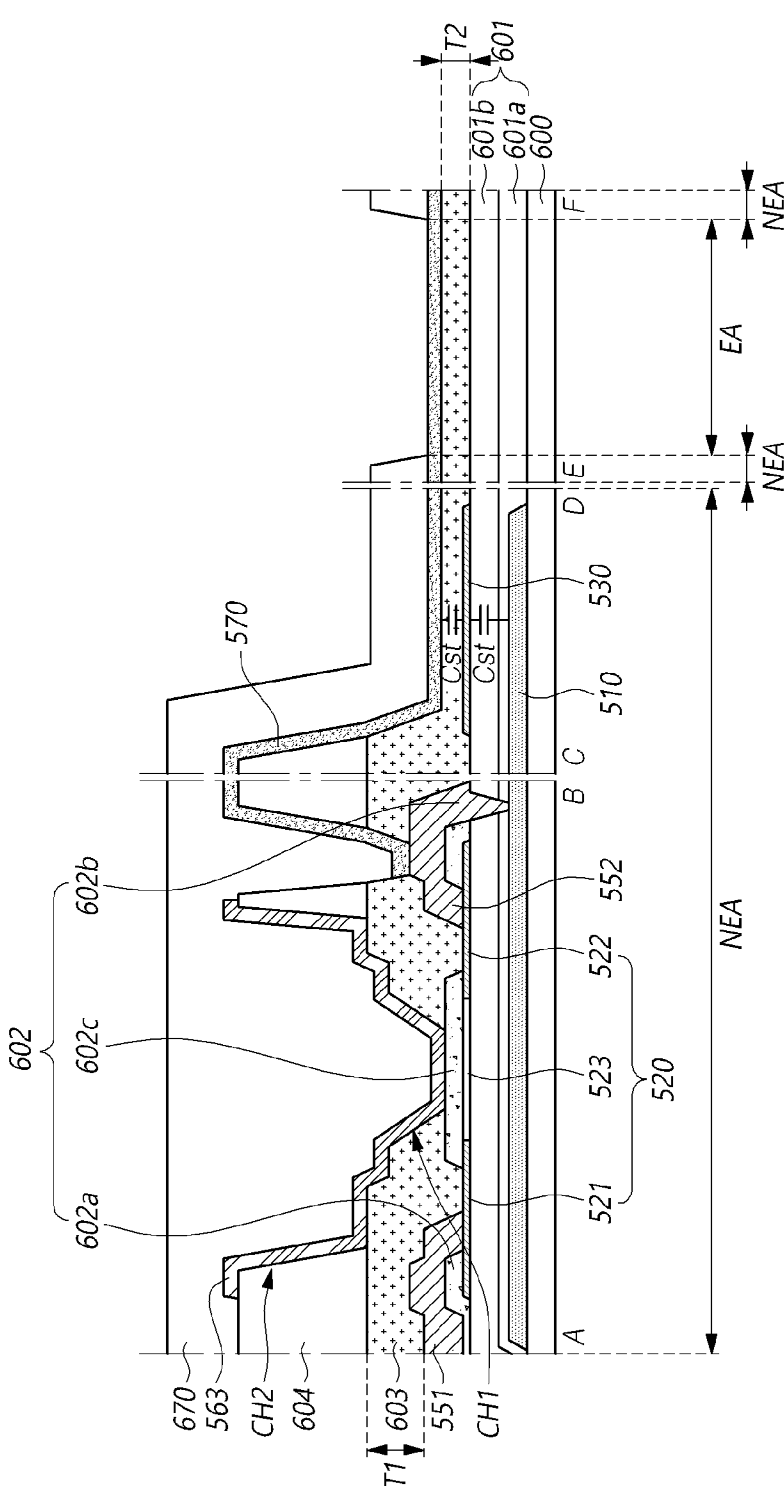

Then, referring to FIG. 21, a material of the pixel electrode 570 for forming the pixel electrode 570 may be deposited on the substrate 600 on which the third electrode 563 is disposed.

The material of the pixel electrode 570 may be patterned through a patterning process to form the pixel electrode 570. The pixel electrode 570 may be in contact with the second electrode 552 through the contact hole of the first and second insulating films 603 and 604 exposing the second electrode 552. The pixel electrode 570 may be also disposed on the second active layer 530 and may also be disposed to extend to the emission area to be formed later.

Referring to FIG. 21, a material of the bank 670 for forming the bank 670 may be deposited on the substrate 600 on which the pixel electrode 570 is disposed.

The material of the bank 670 may be patterned and deposited only in the non-emission area NEA and may not be disposed in the emission area EA.

In summary, in an operation of forming the gate insulating film, a material of the gate insulating film may be formed into the first to third gate insulating film portions of which at least portions overlap an upper surface of the first active layer pattern and which may be removed on the second active layer pattern. In addition, an operation of forming the first and second electrodes includes forming the first photoresist pattern disposed on an electrode material and overlapping a portion of each of the first gate insulating film portion and the first active layer pattern, the second photoresist pattern overlapping a portion of each of the second gate insulating film portion and the first active layer pattern, and the third photoresist pattern overlapping a portion of each of the third insulating film portion and the first active layer pattern, patterning the electrode material using the first to third photoresist patterns as a mask to form the first electrode, the second electrode, and the electrode pattern, allowing a portion of the first active layer pattern and the second active layer pattern to have conductivity through a dry etching process and form the first and second active layers, and removing the first and second photoresist patterns disposed on the first and second electrodes. A conductive region of the first active layer may include a region between the first gate insulating film portion and the third gate insulating film portion and a region between the second gate insulating film portion and the third gate insulating film portion, and the entirety of the second active layer may have conductivity.

Figure 22:
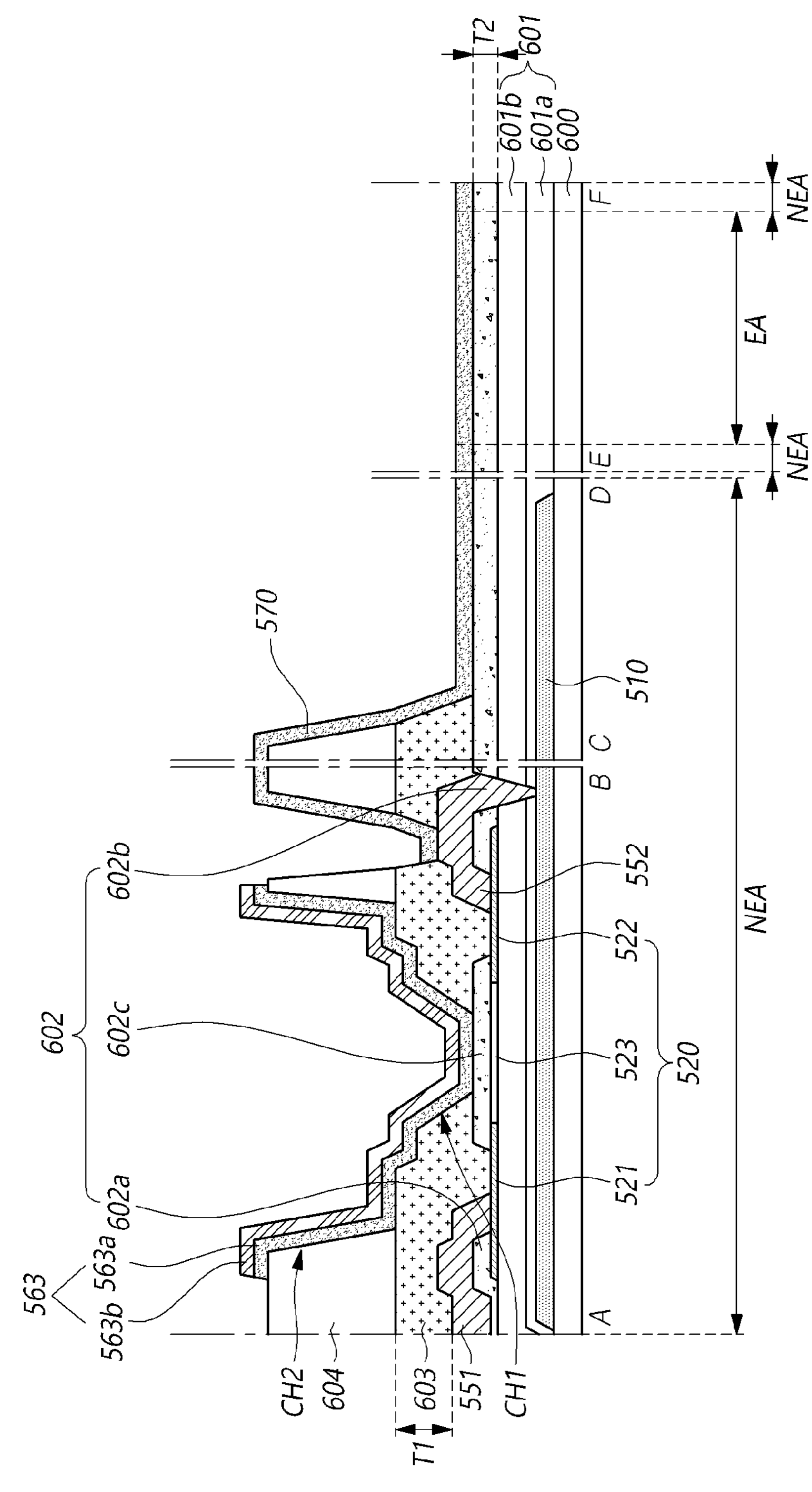
FIGS. 22 and 23 are schematic views illustrating process operations of forming a third electrode, a pixel electrode, and a bank of the display device shown in FIG. 6D.
Figure 23:
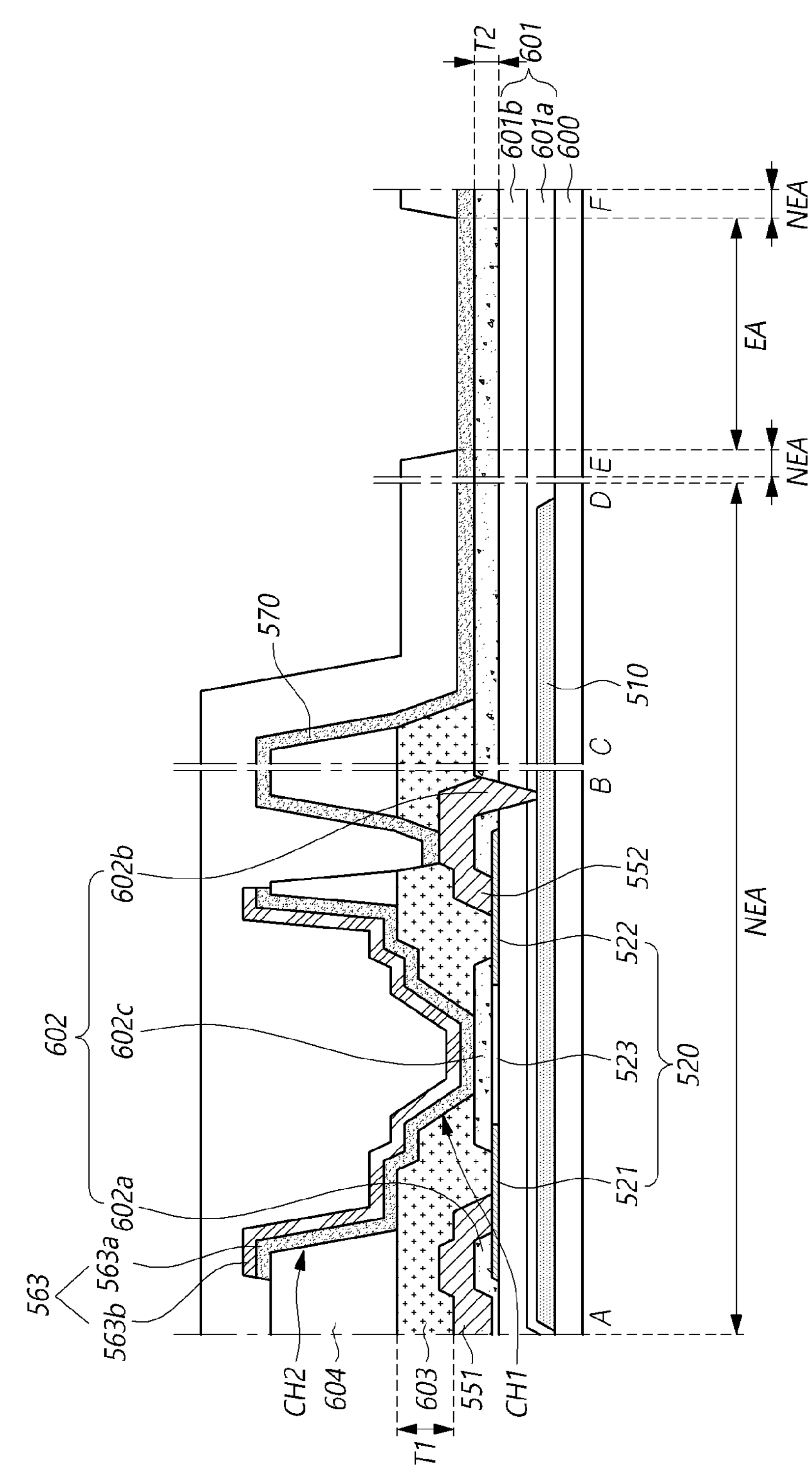
Figure 24:
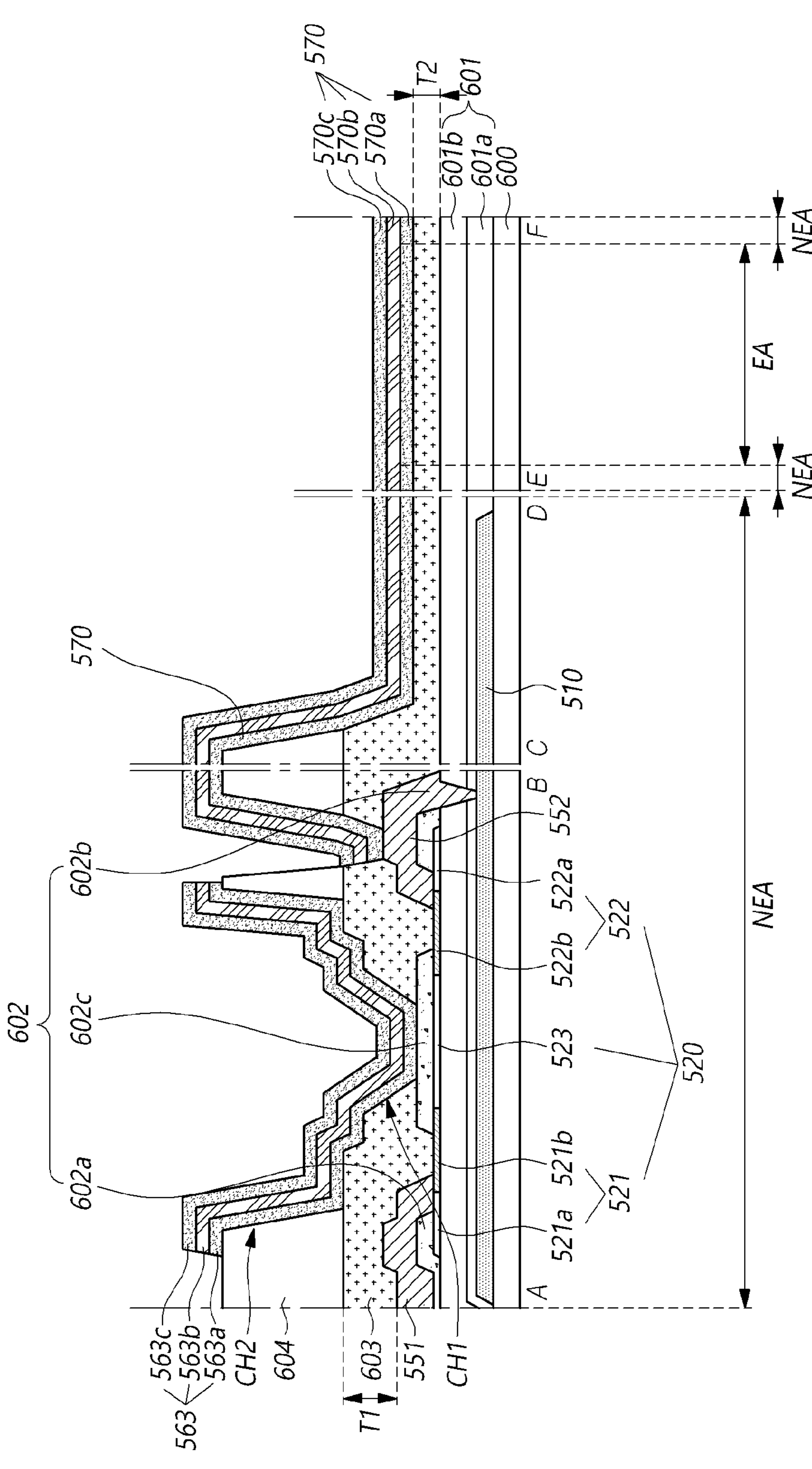
FIGS. 24 and 25 are schematic views illustrating processes of forming a third electrode, a pixel electrode, and a bank of the display device shown in FIG. 6E.
Figure 25:
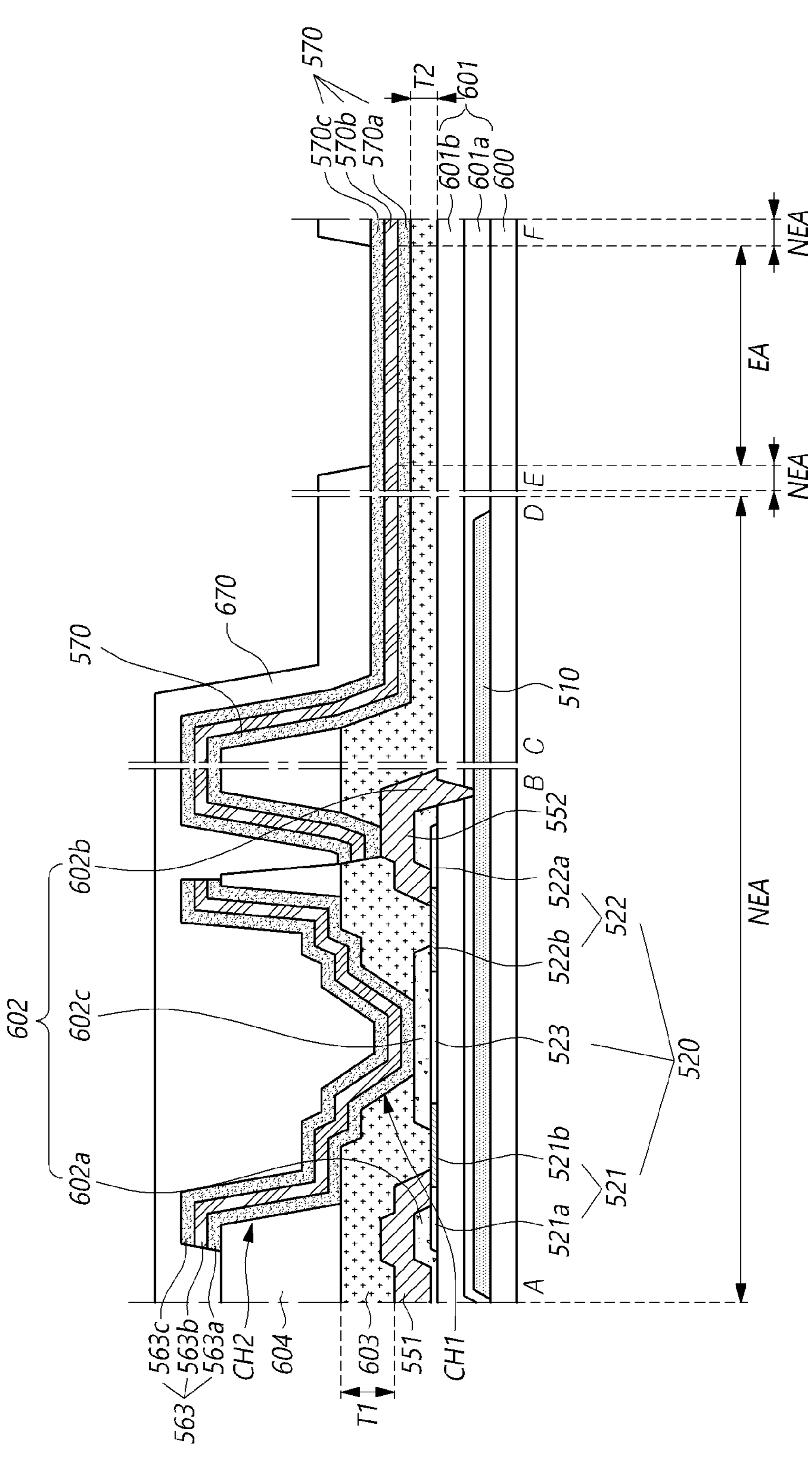

Meanwhile, although a manufacturing method in which the third electrode 563 and the pixel electrode 570 are formed through different processes has been described with reference to FIGS. 20 and 21, the method of manufacturing the display device according to embodiments of the present disclosure is not limited thereto FIGS. 22 and 23 are schematic views illustrating process operations of forming the third electrode, the pixel electrode, and the bank of the display device shown in FIG. 6D, and FIGS. 24 and 25 are schematic views illustrating processes of forming the third electrode, the pixel electrode, and the bank of the display device shown in FIG. 6E.

Meanwhile, process operations before the third electrode 563 and the pixel electrode 570 are formed in FIGS. 22 to 25 may be the same as those described with reference to FIGS. 11 to 19.

First, referring first to FIG. 22, the third electrode 563 and the pixel electrode 570 may be formed on the first insulating film 603 and the second insulating film 604.

Specifically, a transparent conductive material layer may be formed on the substrate 600 on which the first and second insulating films 603 and 604 are disposed. A metal material layer may be formed on the transparent conductive material layer.

Thereafter, the metal material layer may be patterned using a halftone mask. The patterned metal material layer may remain on a portion of an upper surface of the second insulating film 604 and remain in a region overlapping the first and second holes CH1 and CH2. In addition, the metal material layer may also remain inside the contact hole of the first and second insulating films 603 and 604 exposing a portion of the upper surface of the second electrode 552 and remain in a region corresponding to the emission area EA (an opening of the bank to be formed later).

Then, the transparent conductive material layer disposed below the metal material layer may be patterned. The patterned transparent conductive material layer may remain only in a region overlapping the metal material layer.

Next, only the transparent conductive material layer corresponding to the pixel electrode 570 remains after removing the metal material layer disposed inside the contact hole of the first and second insulating films 603 and 604 exposing a portion of the upper surface of the second electrode 552 and disposed in the region corresponding to the emission area EA (the opening of the bank to be formed later).

Thereafter, finally, a photoresist pattern disposed on a portion of the upper surface of the second insulating film 604 and disposed in the region overlapping the first and second holes CH1 and CH2 is removed to form the third electrode 563 formed of the first gate electrode layer 563*a* and the second gate electrode layer 563*b*.

Then, as shown in FIG. 23, the bank 670 having an opening exposing a portion of an upper surface of the pixel electrode 570 may be formed.

Subsequently, process operations of forming the display device of FIG. 6E will be schematically described below with reference to FIGS. 24 and 25.

Referring to FIG. 24, the third electrode 563 including the first gate electrode layer 563*a*, the second gate electrode layer 563*b*, and the third gate electrode layer 563*c* and the pixel electrode 570 including the first to third layers 570*a*, 570*b*, and 570*c* may be formed on the first insulating film 603 and the second insulating film 604. The third electrode 563 and the pixel electrode 570 may be formed through the same process, and a halftone mask may be used during a process.

Specifically, a first transparent conductive material layer may be formed on the substrate 600 on which the first and second insulating films 603 and 604 are disposed, a metal material layer may be formed on the first transparent conductive material layer, and a second transparent conductive material layer may be formed on the metal material layer.

Thereafter, the second transparent conductive material layer may be patterned. The second transparent conductive material layer may remain only on a portion of the upper surface of the second insulating film 604 and only in a region overlapping the first and second holes CH1 and CH2. In addition, the second transparent conductive material layer may also remain inside the contact hole of the first and second insulating films 603 and 604 exposing a portion of the upper surface of the second electrode 552 and remain in a region corresponding to the emission area EA (the opening of the bank to be formed later). The patterned second transparent conductive material layer may become the third gate electrode layer 563*c* of the third electrode 563 and the third layer 570*c* of the pixel electrode 570.

Thereafter, the metal material layer disposed below the second transparent conductive material layer may be patterned. The metal material layer may remain only in a region in which the second transparent conductive material layer is disposed and may be removed from the remaining region. In the metal material layer patterned in this way, the metal material layer disposed below the third gate electrode layer 563*c* may become the second gate electrode layer 563*b* of the third electrode 563, and the metal material layer disposed below the third layer 570*c* of the pixel electrode 570 may become the second layer 570*b* of the pixel electrode 570.

Thereafter, the first transparent conductive material layer disposed below the metal material layer may be patterned. The first transparent conductive material may remain only in a region in which the metal material layer is disposed and may be removed from the remaining region. In the first transparent conductive material layer patterned in this way, the first transparent conductive material layer disposed below the second gate electrode layer 563*b* of the third electrode 563 may become the first gate electrode layer 563*a* of the third electrode 563, and the metal material layer disposed below the second layer 570*b* of the pixel electrode 570 may become the first layer 570*a* of the pixel electrode 570.

Through such a process, the third electrode 563 of a triple layer and the pixel electrode 570 of a triple layer are formed through the same process, thereby simplifying a process.

Then, as shown in FIG. 25, the bank 670, which has an opening exposing a portion of an upper surface of the third layer 570C of the pixel electrode 570, may be formed.

Next, a method of manufacturing the display device shown in FIG. 7A will be described below with reference to FIGS. 26 to 36.

FIGS. 26 to 36 are schematic views illustrating processes of manufacturing the display device shown in FIG. 7A.

Figure 26:
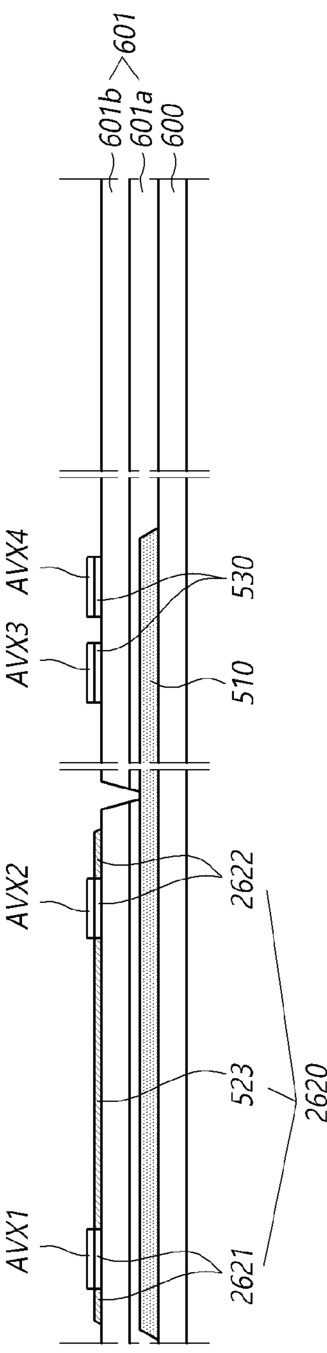
FIGS. 26 to 36 are schematic views illustrating processes of manufacturing the display device shown in FIG. 7A.

First, referring to FIG. 26, the LS 510 may be disposed on a substrate 600.

Next, the buffer layer 601 may be formed on the LS 510.

An active material may be formed on the buffer layer 601 and patterned to form a first active layer pattern 2620 and a second active layer pattern.

An auxiliary electrode material is formed on the substrate, on which the first active layer pattern 2620 and the second active layer pattern are formed, and patterned to form the auxiliary electrodes AUX1, AUX2, AUX3, and AUX4 on portions of an upper surface of the first active later pattern and an upper surface of the second active layer pattern.

Specifically, referring to FIG. 26, the first and second auxiliary electrodes AUX1 and AUX2 may be disposed on portions of the upper surface of the first active layer pattern 2620 to be spaced apart from each other.

Also, referring to FIG. 26, a plurality of second active layer patterns may be formed in a cross section, the third auxiliary electrode AUX3 may be disposed on one second active layer pattern, and the fourth auxiliary electrode AUX4 may be disposed on the other second active layer pattern.

Regions in which the first active layer pattern 2620 and each of the plurality of second active layer patterns are in contact with the auxiliary electrodes may have conductivity due to the auxiliary electrodes. Here, each of the first to fourth auxiliary electrodes AUX1, AUX2, AUX3, and AUX4 may include a metal material or a conductive oxide.

For example, the first to fourth auxiliary electrodes AUX1, AUX2, AUX3, and AUX4 may include at least one selected from among copper, aluminum, molybdenum (Mo), titanium (Ti), and molybdenum-titanium (MoTi).

As another example, the first to fourth auxiliary electrodes AUX1, AUX2, AUX3, and AUX4 may include at least one selected from among a TCO, oxynitride, and an organic material. For example, the TCO may include at least one selected from among indium zinc oxide (IZO), indium tin oxide (ITO), indium-gallium-zinc oxide (IGZO), zinc oxide (ZnO), aluminum-doped zinc oxide (AZO), gallium-doped zinc oxide (GZO), antimony tin oxide (ATO), and fluorine-doped transparent oxide (FTO). The Oxynitride may include zinc oxynitride (ZnON) and the like.

The active layer patterns in contact with the first to fourth auxiliary electrodes AUX1, AUX2, AUX3, and AUX4 may have conductivity. Accordingly, the channel region 523 of the first active layer pattern 2620 may not have conductivity, and regions of the first region 2621 and the second region 2622 in contact with the first and second auxiliary electrodes AUX1 and AUX2 may be conductive regions. In other words, each of the first region 2621 and the second region 2622 may include a conductive region and a non-conductive region.

Figure 27:
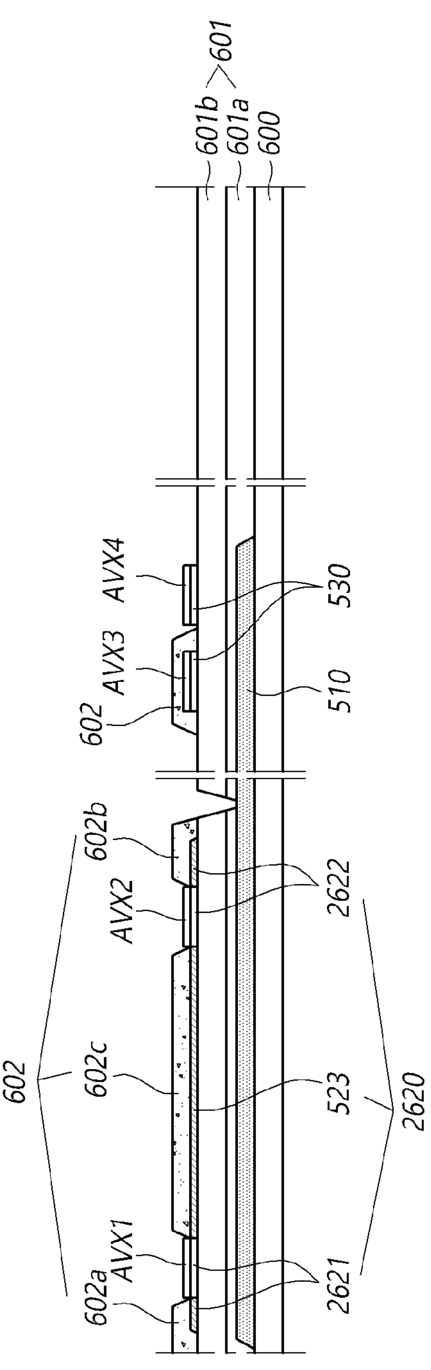

Then, as shown in FIG. 27, a gate insulating film material may be formed on the substrate 600 on which the first to fourth auxiliary electrodes AUX1, AUX2, AUX3, and AUX4 are disposed.

The gate insulating film material may be patterned through a dry etching process, thereby forming the gate insulating film 602 including first to third gate insulating film portions 602*a*, 602*b*, and 602*c*. The gate insulating film 602 may be disposed to expose upper surfaces of the first auxiliary electrode AUX1 and the second auxiliary electrode AUX2 and surround upper and side surfaces of the third auxiliary electrode AUX3 and may be formed to expose upper and side surfaces of the fourth auxiliary electrode AUX4.

In addition, as shown in FIG. 27, a portion of the gate insulating film material and a portion of the buffer layer 601 are etched in a dry etching process to form a contact hole exposing a portion of an upper surface of the LS 510. In this case, the gate insulating film material and the buffer layer 601 may be dry-etched using carbon tetrafluoromethane (CF4), nitrogen trifluoride (NF3), sulfur hexafluoride (SF6), and oxygen (O2) gases.

Figure 28:
Figure 28:
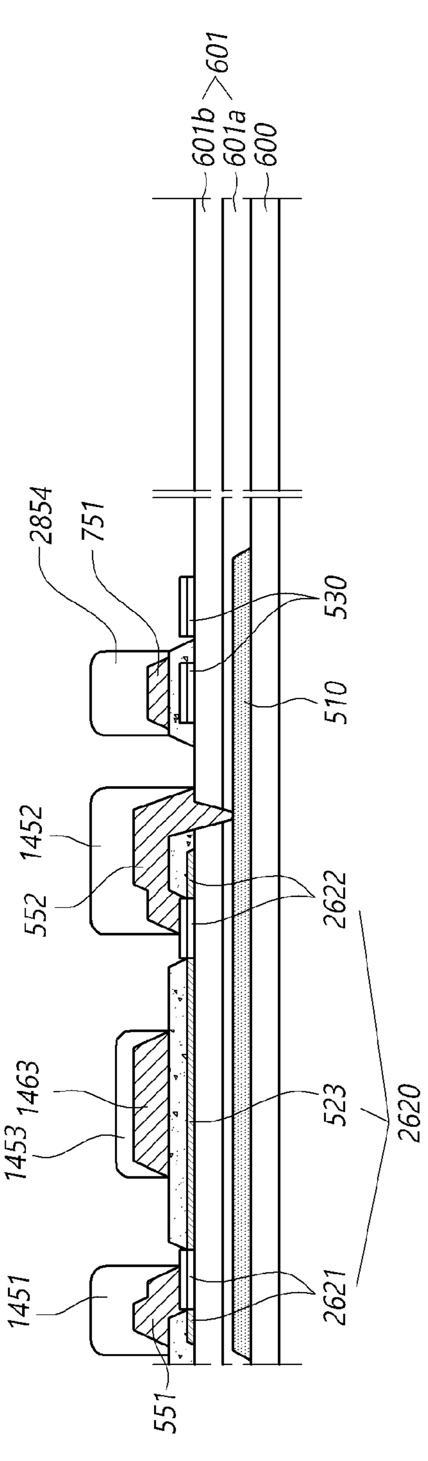

Then, referring to FIG. 28, an electrode material may be deposited on the substrate 600. The electrode material may include a metal material.

A photoresist material may be deposited on the electrode material. The photoresist material may be patterned to be formed into a first photoresist pattern 1451, a second photoresist pattern 1452, a third photoresist pattern 1453, and a fourth photoresist pattern 2854.

The photoresist material may be patterned through a halftone mask, and after the patterning, heights of the first, second, and fourth photoresist patterns 1451, 1452, and 2854 formed may be greater than that of the third photoresist pattern 1453.

Thereafter, the electrode material may be patterned using the first to fourth photoresist patterns 1451, 1452, 1453, and 2854 as a mask. By patterning the electrode material, the first electrode 551 may be formed below the first photoresist pattern 1451, the second electrode 552 may be formed below the second photoresist pattern 1452, an electrode pattern 1463 may be formed below the third photoresist pattern 1453, and the gate metal layer 751 may be formed below the fourth photoresist pattern 2854.

As shown in FIG. 28, the second electrode 552 may be formed to be in contact with the upper surface of the LS 510 through a contact hole formed in the buffer layer 601 and the gate insulating film 602.

Figure 29:
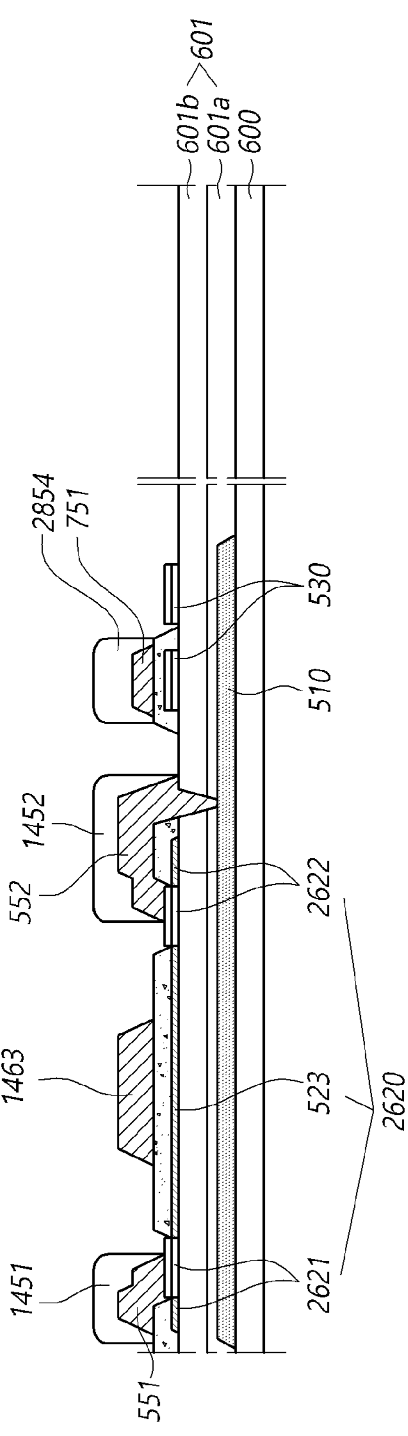

Then, referring to FIG. 29, the third photoresist pattern 1453 disposed on the electrode pattern 1463 may be removed.

The third photoresist pattern 1453 disposed on the electrode pattern 1463 may be removed through a dry etching process, and each of the first, second, and fourth photoresist patterns 1451, 1452, and 2854 having a greater height than the third photoresist pattern 1453 may not be removed.

However, a portion of each of the first, second, and fourth photoresist patterns 1451, 1452, and 2854 may also be removed in a process of removing the third photoresist pattern 1453 so that the height of each of the first, second, and fourth photoresist patterns 1451, 1452, and 2854 may be lowered. Specifically, the heights of the first, second, and fourth photoresist patterns 1451, 1452, and 2854 of FIG. 29 may be smaller than the heights of the first, second, and fourth photoresist patterns 1451, 1452, and 2854 of FIG. 28.

Subsequently, referring to FIG. 30, the first active layer pattern 1220 and the second active layer pattern 1221 may have conductivity through a dry etching process. In this case, a portion of the first active layer pattern may additionally have conductivity through a dry etching process using carbon tetrafluoromethane (CF4), nitrogen trifutoride (NF3), sulfur hexafluoride (SF6), and helium (He) gas gases.

Figure 30:
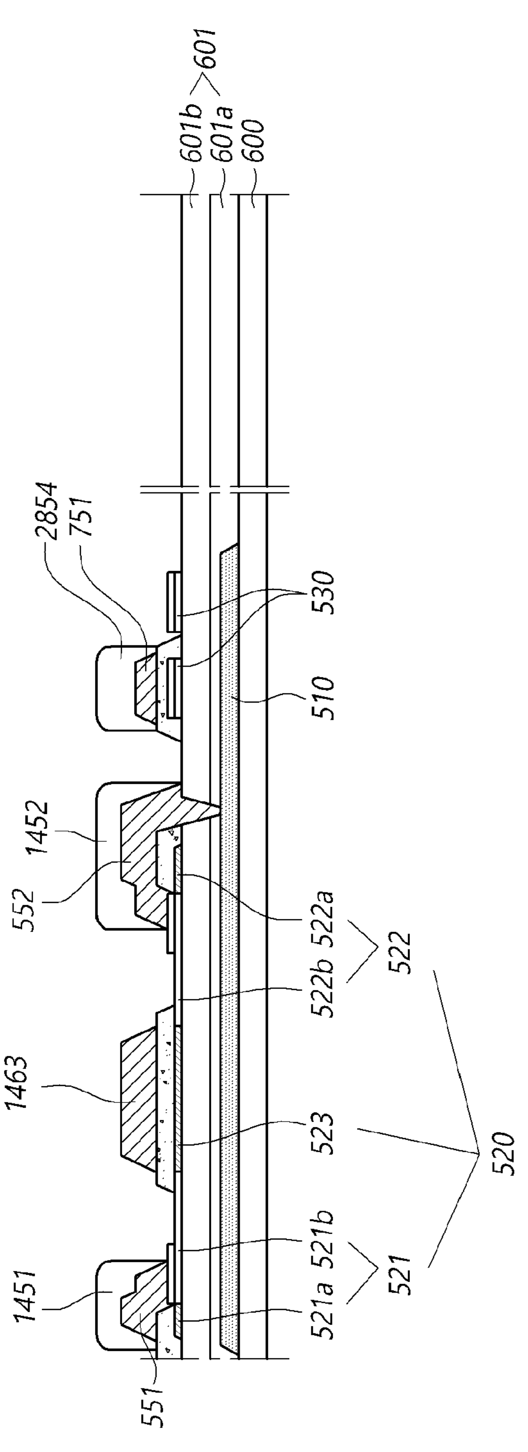

Specifically, referring to FIG. 30, in a dry etching process, while a portion of the third gate insulating film portion 602*c* of the gate insulating film 602 is additionally removed, a portion of the upper surface of the first active layer pattern may be exposed. The exposed first active layer pattern may have conductivity through a dry etching process.

In other words, the first active layer pattern may have conductivity in regions thereof overlapping the first and second auxiliary electrodes AUX1 and AUX2 as well as a region thereof corresponding to each of a region between the third gate insulating film portion 602*c* and a region between the second auxiliary electrode AUX2 and the third gate insulating film portion 602*c*, and thus finally, the first active layer 520 including a second auxiliary region 521*b* and a fourth auxiliary region 521*d* may be formed.

That is, portions of the second auxiliary region 521*b* and the fourth auxiliary region 521*d* of the first active layer 520 may have conductivity due to the first and second auxiliary electrodes AUX1 and AUX2, and the other portions thereof may be formed to have conductivity in a dry etching process of the gate insulating film 602.

Figure 31:
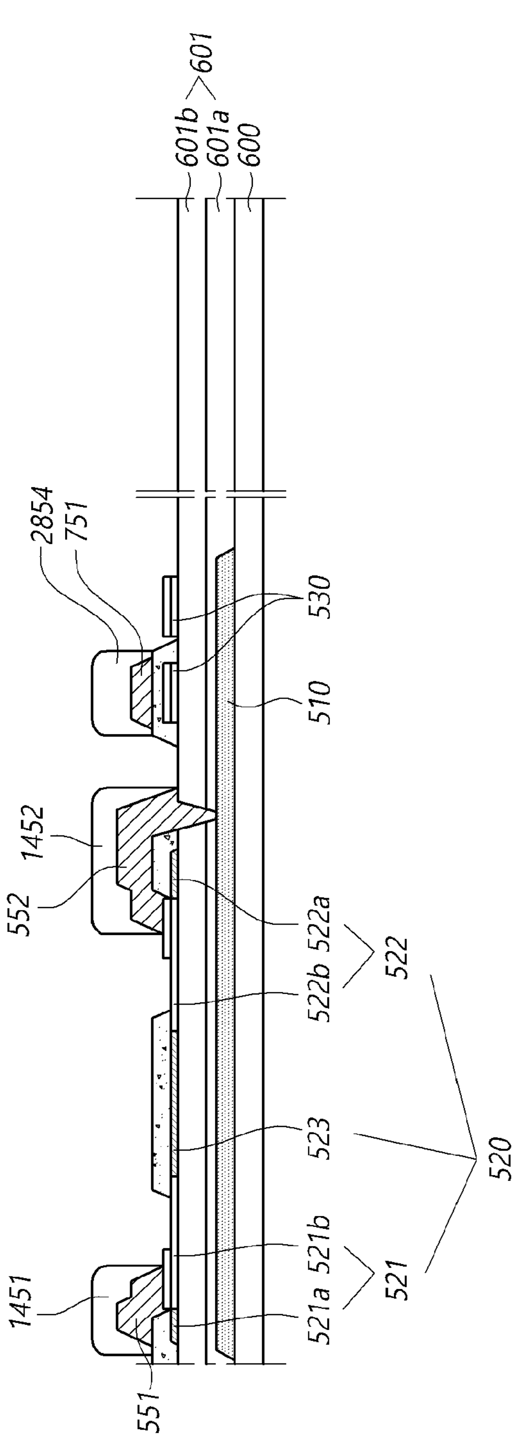

After that, referring to FIG. 31, the electrode pattern 1463 disposed on the channel region 523 of the first active layer 520 and the gate insulating film 602 may be removed. The electrode pattern 1463 may be removed through a wet etching process.

Figure 32:
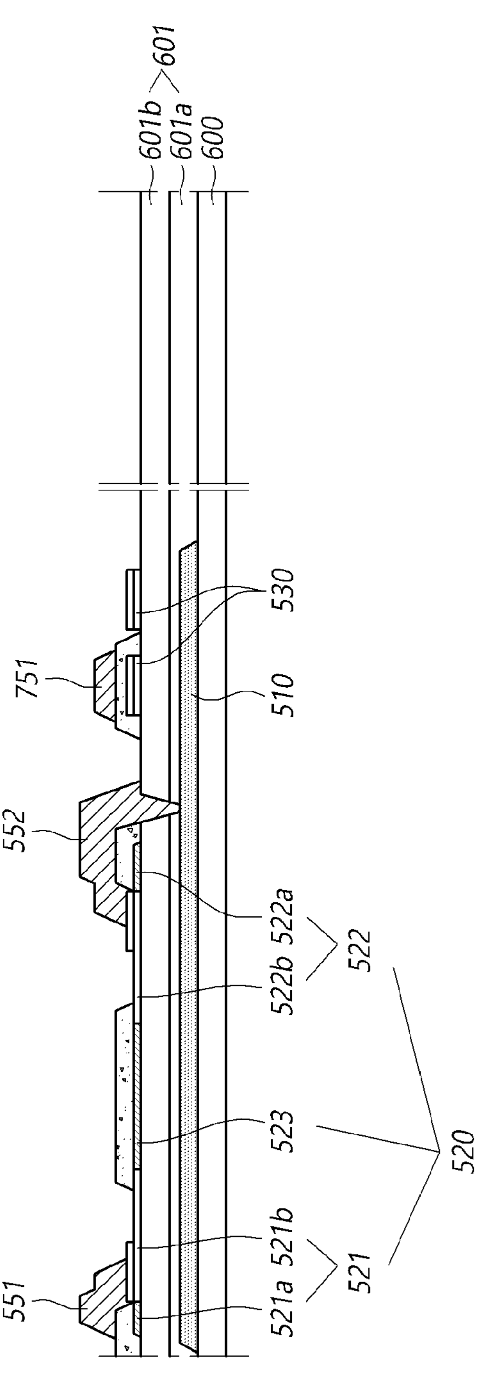

Then, referring to FIG. 32, the first, second, and fourth photoresist patterns 1451, 1452, and 2458 disposed on the first and second electrodes 551 and 552 and the third gate metal layer 751 be removed through a strip process.

Figure 33:
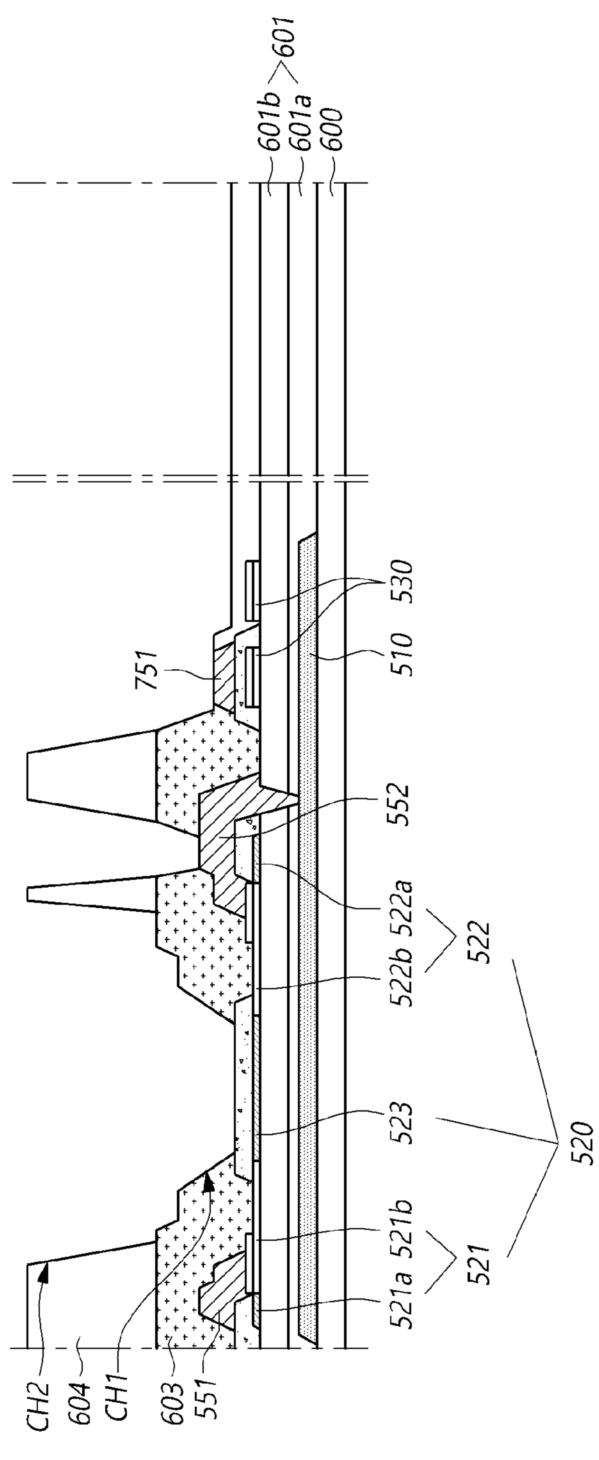

Next, referring to FIG. 33, the first insulating film 603 and a second insulating film 604 may be disposed on the substrate 600 on which the first and second electrodes 551 and 552 and the gate metal layer 751 are disposed.

Specifically, a material of the first insulating film 603 is deposited on the substrate 600. Thereafter, a material of the second insulating film 604 is deposited on the material of the first insulating film 603.

Then, the material of the second insulating film 604 is patterned to form the second insulating film 604 which includes a second hole CH2 and does not overlap the second active layer 530.

Thereafter, the first insulating film 603 including a first hole CH1 formed in a region overlapping the second hole CH2 is formed through a dry etching process. A thickness of the first insulating film 603 disposed on the second active layer 530 may be smaller than that of the first insulating film 603 disposed on the first active layer 520.

In addition, in a process of forming the first and second contact holes CH1 and CH2, a contact hole exposing a portion of an upper surface of the second electrode 552 may be formed in the first insulating film 603 and the second insulating film 604. The contact hole exposing a portion of the upper surface of the second electrode 552 may be formed through a process of patterning the material of the second insulating film 604 and then additionally patterning the material of the first insulating film 603 through a dry etching process.

Figure 34:
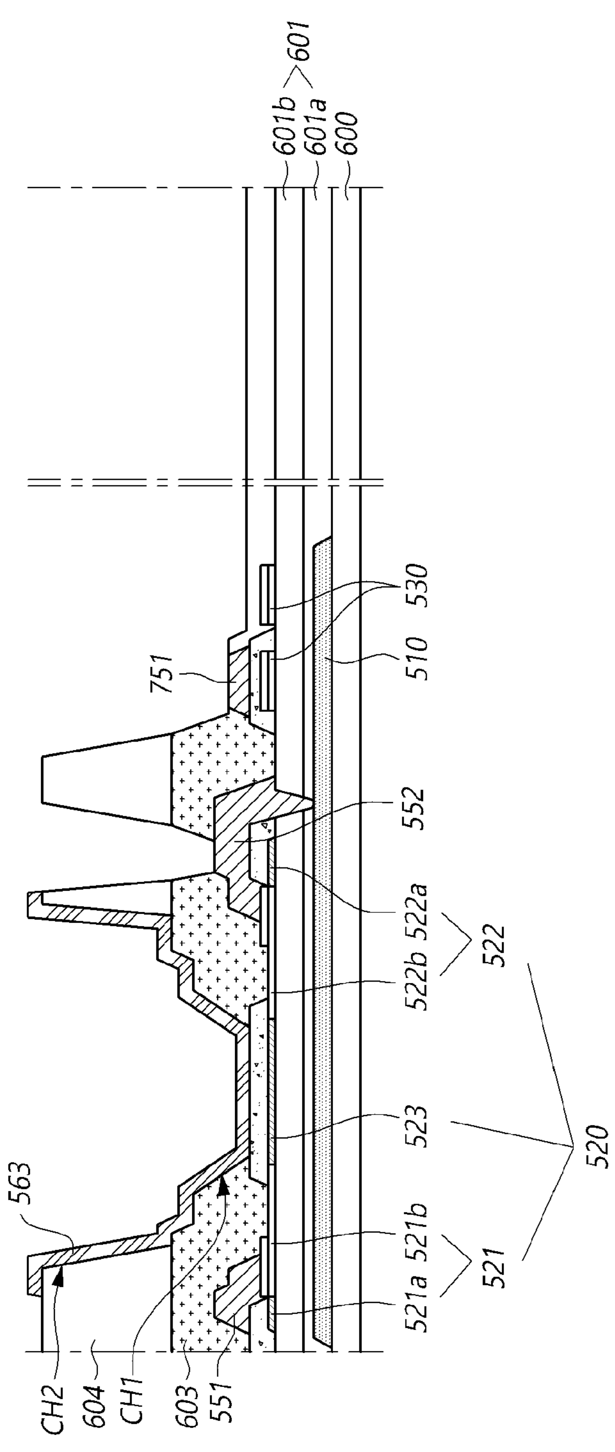

Then, referring to FIG. 34, a material of the third electrode 563 may be deposited on the substrate 600 on which the second insulating film 604 is formed. The material of the third electrode 563 may be patterned through an etching process (for example, wet etching) to form the third electrode 563 disposed on the second insulating film 604.

The third electrode 563 may be disposed on a portion of an upper surface of the second insulating film 604 and may be disposed in the first hole CH1 and the second hole CH2. The third electrode 563 may overlap an upper surface of the gate insulating film 602 disposed on the channel region 523 in the first and second holes CH1 and CH2.

Figure 35:
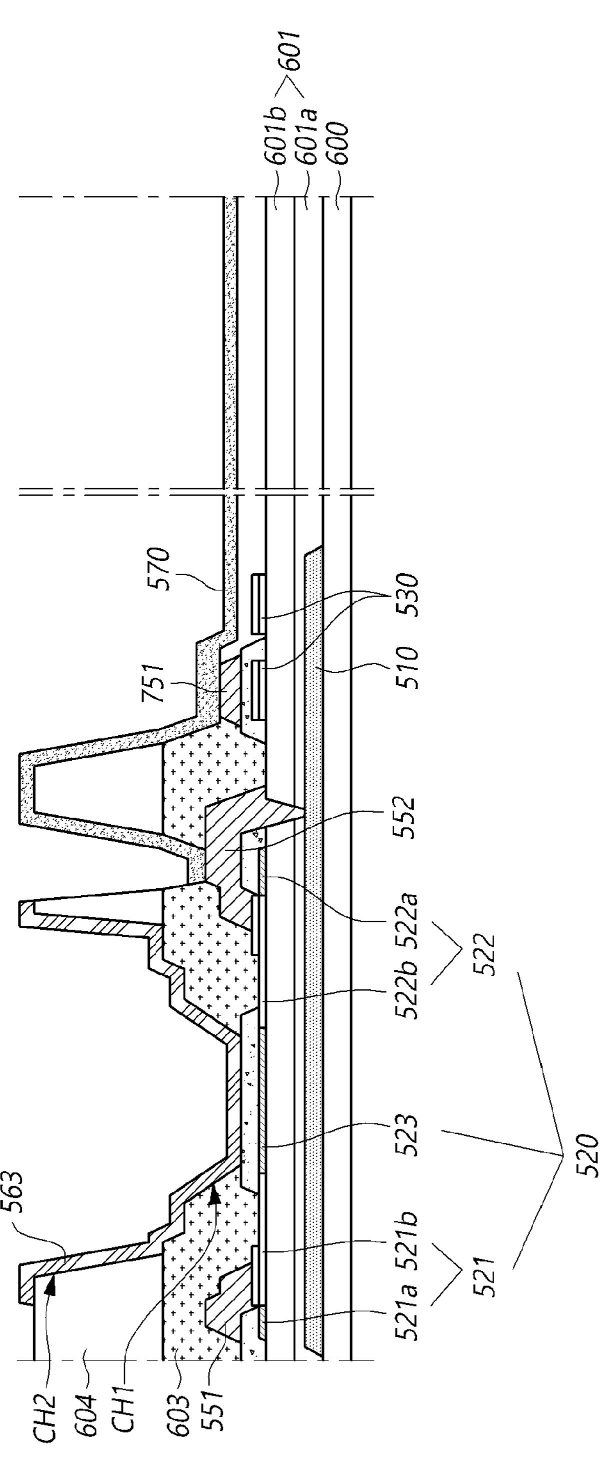

Then, referring to FIG. 35, a material of the pixel electrode 570 for forming the pixel electrode 570 may be deposited on the substrate 600 on which the third electrode 563 is formed.

The material of the pixel electrode 570 may be patterned through a patterning process for the pixel electrode 570. The pixel electrode 570 may be in contact with the second electrode 552 through the contact hole of the first and second insulating films 603 and 604 exposing the second electrode 552. The pixel electrode 570 may also be disposed on the second active layer 530 and may be disposed to extend to the emission area to be formed later.

In addition, the pixel electrode 570 may be formed to overlap a plurality of second active layers 530 and the gate metal layer 751.

Figure 36:
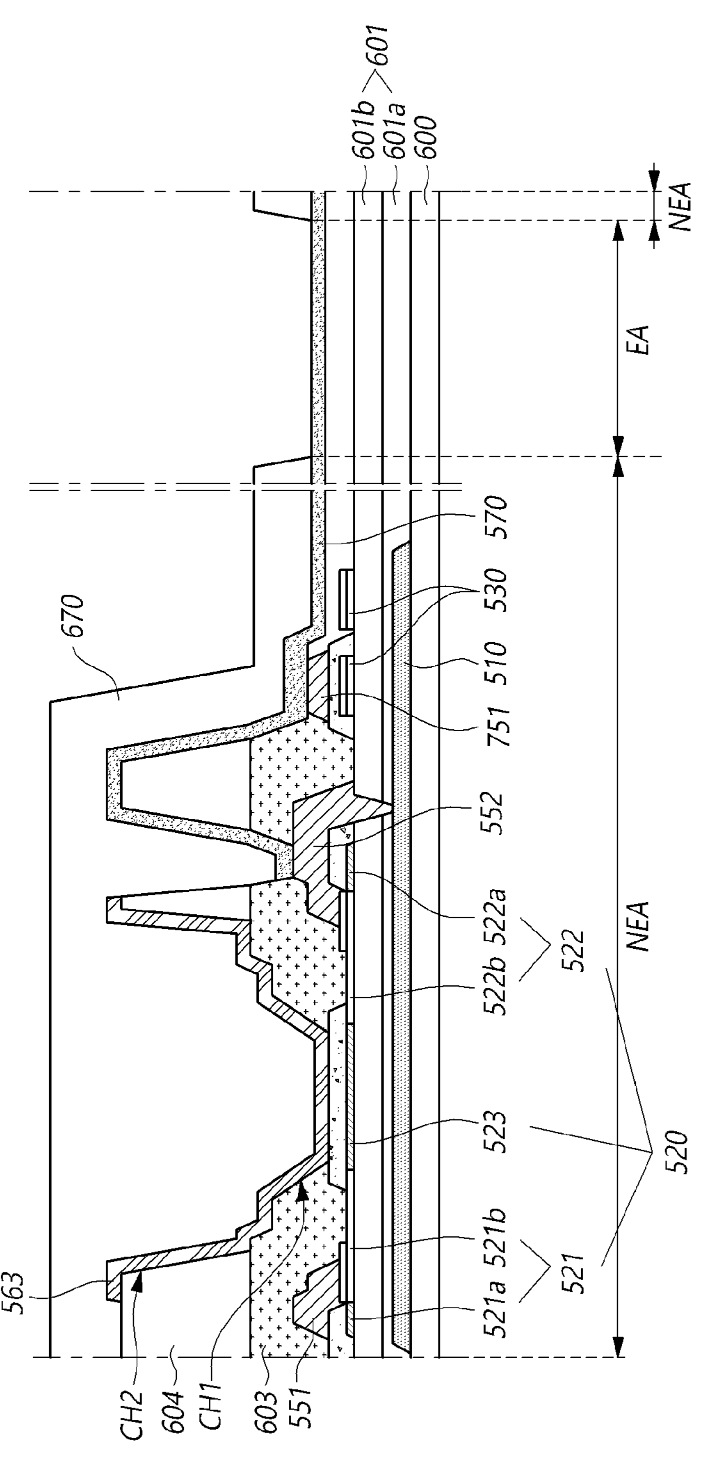

After that, as shown in FIG. 36, a material of a bank 670 for forming the bank 670 may be deposited on the substrate 600 on which the pixel electrode 570 is disposed.

In summary, the method may further include depositing an auxiliary electrode material on a portion of an upper surface of a first active layer pattern and the entirety of an upper surface of a second active layer pattern, and patterning the auxiliary electrode material to form a first auxiliary electrode and a second auxiliary electrode spaced apart from each other on the first active layer pattern and form a third auxiliary electrode and a fourth auxiliary electrode on upper surfaces of two active layer patterns. The first and second active layer patterns may have conductivity in regions in contact with the first to fourth auxiliary electrodes. Here, the first auxiliary electrode may be disposed in a region between a first gate insulating film portion and a third gate insulating film portion, and the second auxiliary electrode may be disposed in a region between the second gate insulating film portion and a third gate insulating film portion. Also, a gate insulating film may include a portion surrounding one second active layer.

The patterning of the electrode material deposited on the gate insulating film may include forming a first photoresist pattern disposed on the electrode material and overlapping a portion of each of the first gate insulating film portion and the first active layer pattern, a second photoresist pattern overlapping a portion of each of the second gate insulating film portion and the first active layer pattern, forming a third photoresist pattern overlapping a portion of each of the third insulating film portion and the first active layer pattern, and a fourth photoresist pattern overlapping the gate insulating film disposed on the third auxiliary electrode, patterning the electrode material using the first to fourth photoresist patterns as a mask to form a first electrode, a second electrode, an electrode pattern, and a gate metal layer, removing a portion of the third gate insulating film through a dry etching process, allowing a portion of the first active layer to have conductivity to form a first active layer, and removing the third photoresist pattern disposed on the electrode pattern is removed, and removing the first, second, and fourth photoresist patterns.

In the dry etching process after the first electrode, the second electrode, the electrode pattern, and the gate metal layer are formed, in the first active layer, a region between the first auxiliary electrode and the third gate insulating film portion and a region between the second auxiliary electrode and the third gate insulating film portion may additionally have conductivity.

Although a manufacturing method in which the third electrode 563 and the pixel electrode 570 are formed through different processes has been described with reference to FIG. 35, the method of manufacturing the display device according to embodiments of the present disclosure is not limited thereto.

Figure 37:
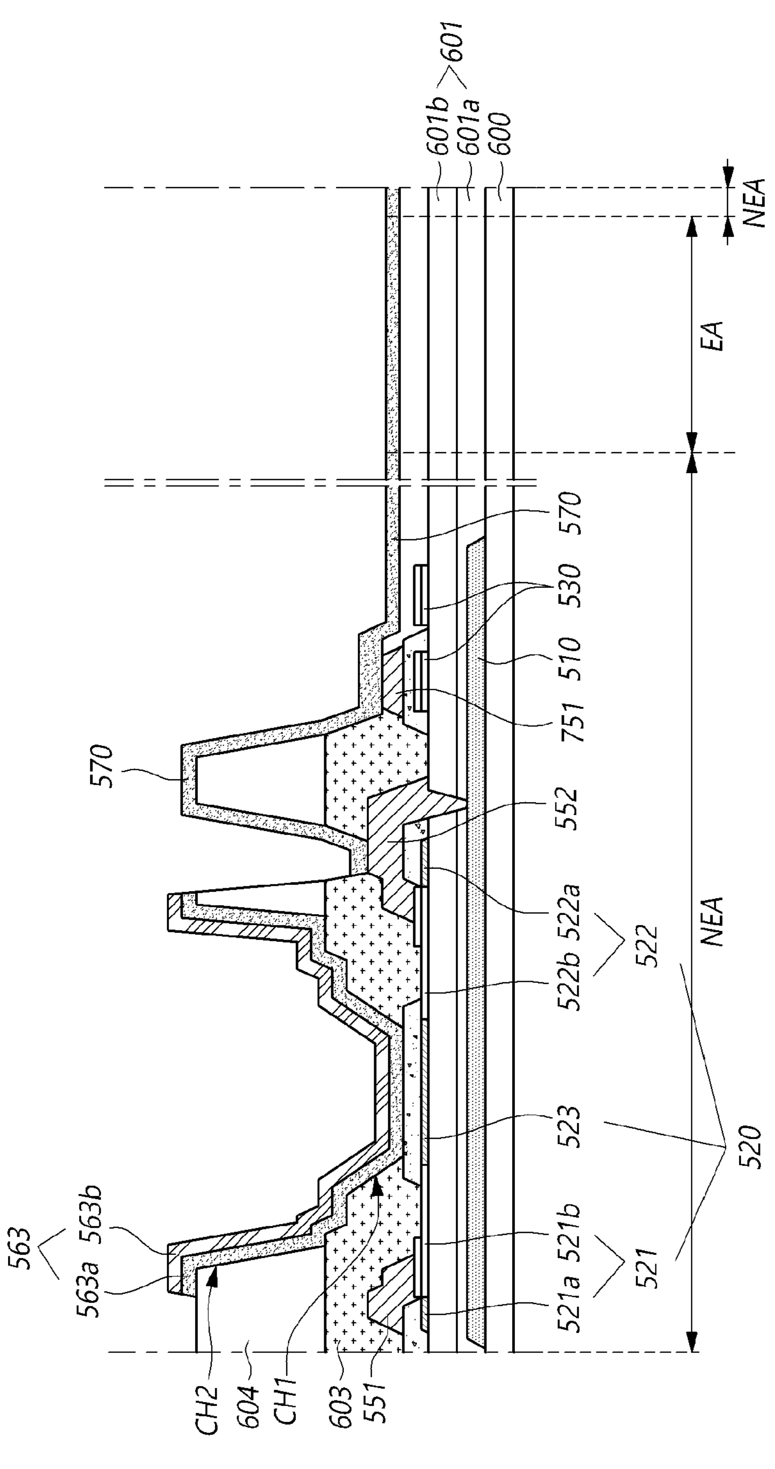
FIGS. 37 and 38 are schematic views illustrating process operations of forming a third electrode, a pixel electrode, and a bank of the display device shown in FIG. 7B.
Figure 38:
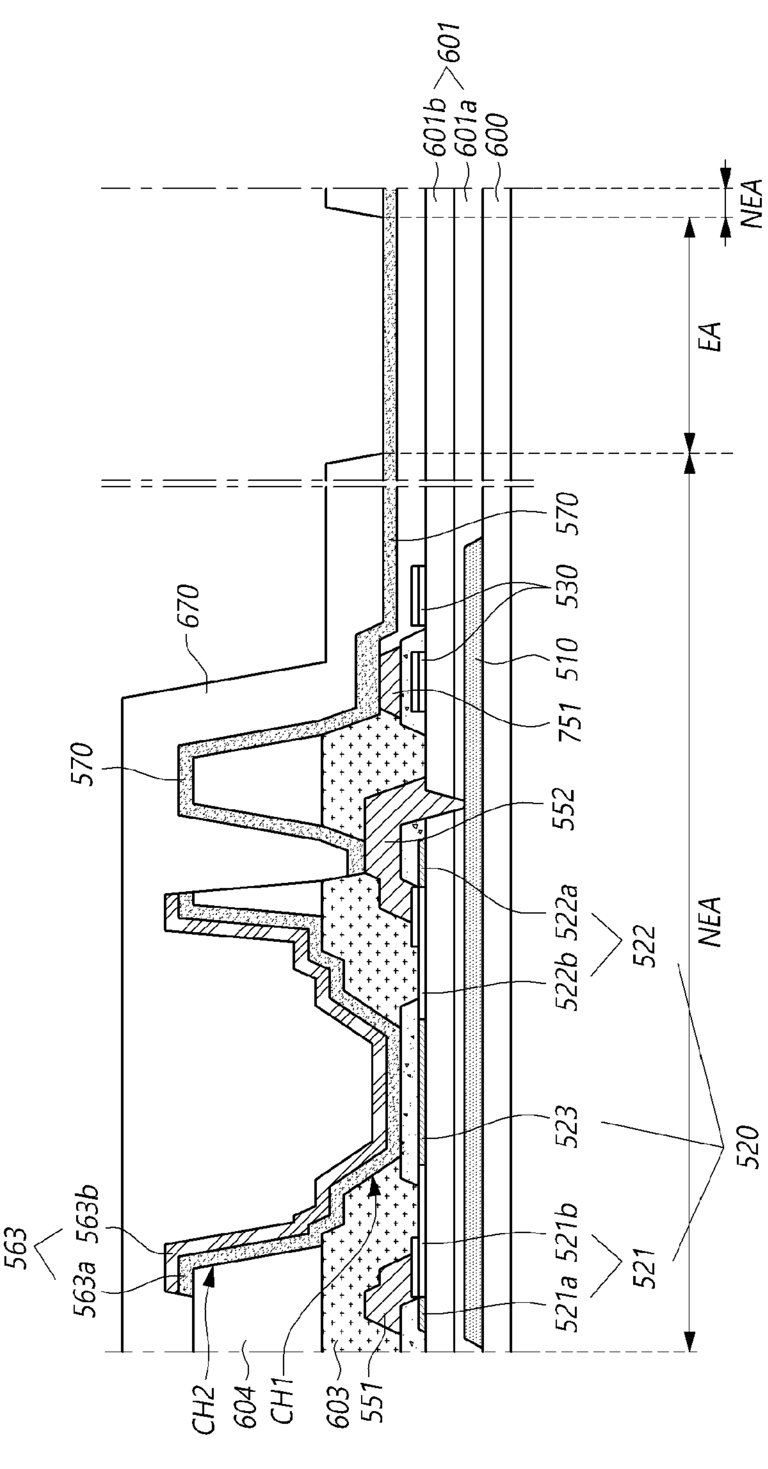
Figure 39:
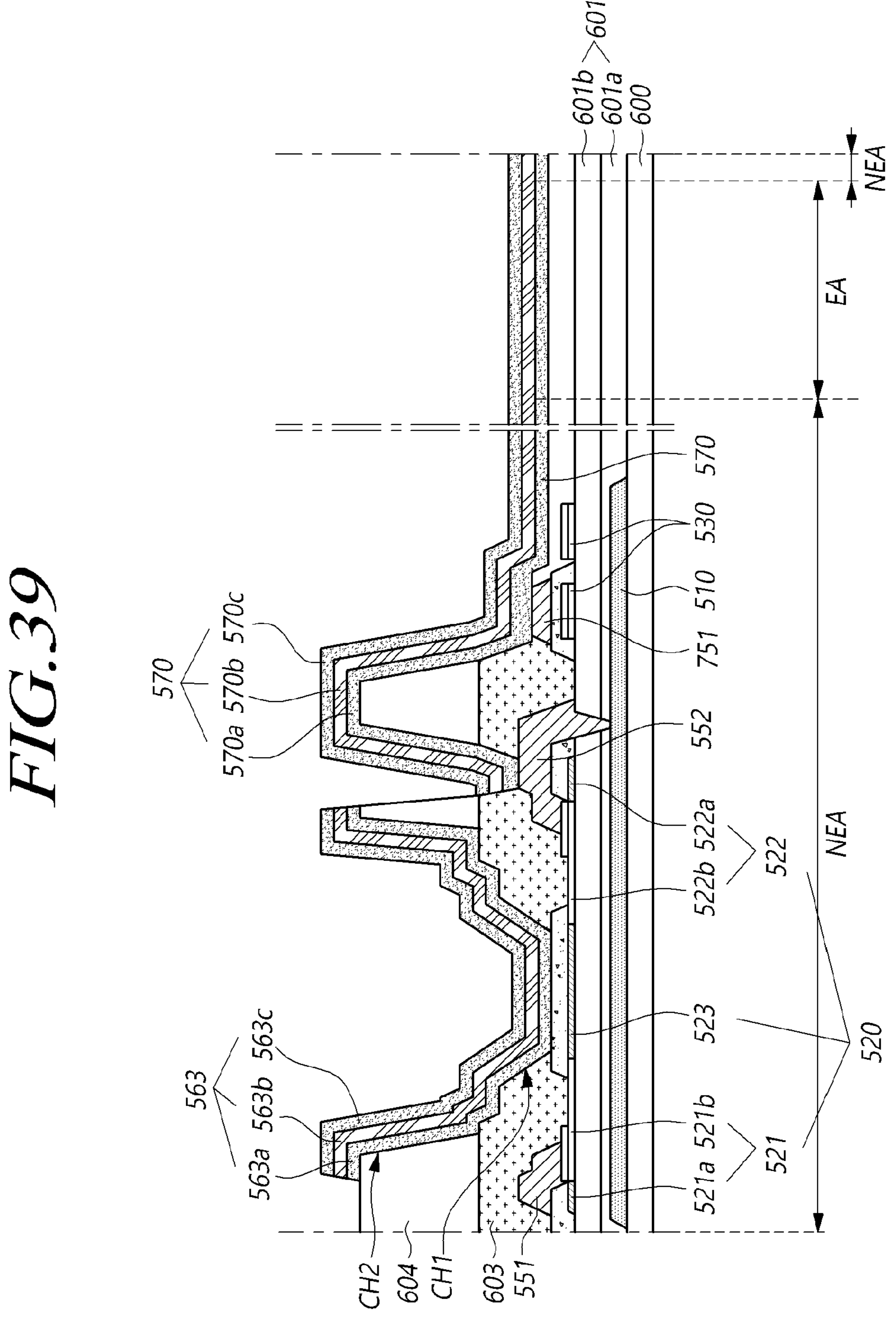
Figure 40:
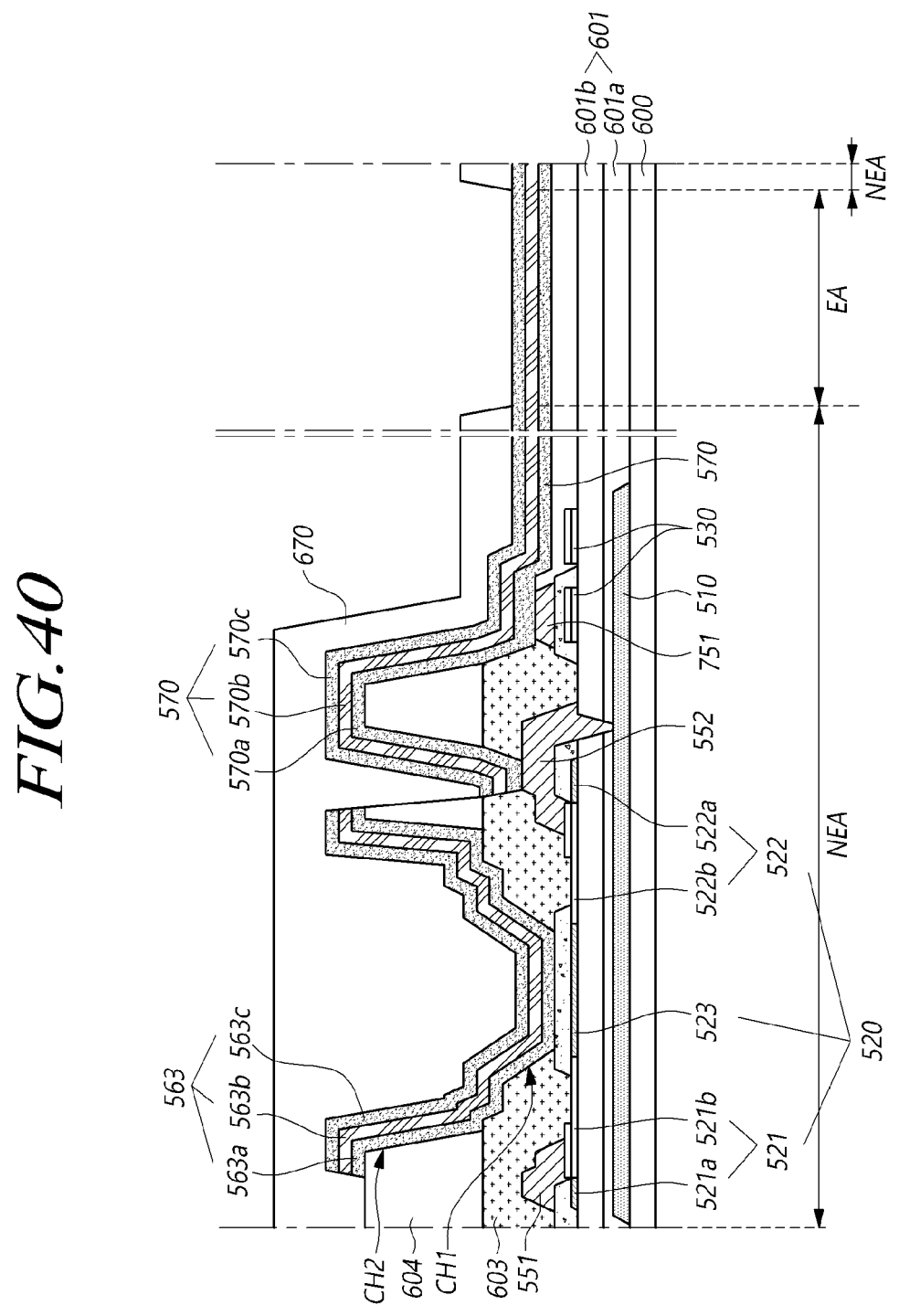

FIGS. 37 and 38 are schematic views illustrating process operations of forming the third electrode, the pixel electrode, and the bank of the display device shown in FIG. 7B, and FIGS. 39 and 40 are schematic views illustrating processes of forming the third electrode, the pixel electrode, and the bank of the display device shown in FIG. 7C.

Process operations before the third electrode 563 and the pixel electrode 570 are formed in FIGS. 37 to 40 may be the same as those described with reference to FIGS. 26 to 33.

First, referring to FIG. 37, a transparent conductive material layer may be formed on the substrate 600 on which the first and second insulating films 603 and 604 are disposed. A metal material layer may be formed on the transparent conductive material layer.

Thereafter, the metal material layer may be patterned using a halftone mask. The patterned metal material layer may remain on a portion of an upper surface of the second insulating film 604 and remain in a region overlapping the first and second holes CH1 and CH2. In addition, the metal material layer may also remain inside a contact hole of the first and second insulating films 603 and 604 exposing a portion of an upper surface of the second electrode 552 and remain in a region corresponding to the emission area EA (an opening of the bank to be formed later).

Then, the transparent conductive material layer disposed below the metal material layer may be patterned. The patterned transparent conductive material layer may remain only in a region overlapping the metal material layer.

In addition, only the transparent conductive material layer corresponding to the pixel electrode 570 remains after removing the metal material layer disposed inside the contact hole of the first and second insulating films 603 and 604 exposing a portion of the upper surface of the second electrode 552 and disposed in the region corresponding to the emission area EA (the opening of the bank to be formed later).

Finally, a photoresist pattern disposed on a portion of the upper surface of the second insulating film 604 and the region overlapping the first and second holes CH1 and CH2 is removed to form the third electrode 563 formed of the first gate electrode layer 563*a* and the second gate electrode layer 563*b*

Then, as shown in FIG. 38, the bank 670 having an opening exposing a portion of an upper surface of the pixel electrode 570 may be formed.

Subsequently, process operations of forming the display device of FIG. 7C will be schematically described below with reference to FIGS. 39 and 40.

First, referring to FIG. 39, a first transparent conductive material layer may be formed on the substrate 600 on which the first and second insulating films 603 and 604 are disposed, a metal material layer may be formed on the first transparent conductive material layer, and a second transparent conductive material layer may be formed on the metal material layer.

Thereafter, the second transparent conductive material layer may be patterned. The second transparent conductive material layer may remain only on a portion of an upper surface of the second insulating film 604 and only in a region overlapping the first and second holes CH1 and CH2. In addition, the second transparent conductive material layer may also remain inside a contact hole of the first and second insulating films 603 and 604 exposing a portion of the upper surface of the second electrode 552 and remain in a region corresponding to the emission area EA (an opening of the bank to be formed later). The patterned second transparent conductive material layer may become the third gate electrode layer 563*c* of the third electrode 563 and a third layer 570*c* of the pixel electrode 570.

Thereafter, the metal material layer disposed below the second transparent conductive material layer may be patterned. The metal material layer may remain only in a region in which the second transparent conductive material layer is disposed and may be removed from the remaining region. In the metal material layer patterned in this way, the metal material layer disposed below the third gate electrode layer 563*c* may become the second gate electrode layer 563*b* of the third electrode 563, and the metal material layer disposed below the third layer 570*c* of the pixel electrode 570 may become the second layer 570*b* of the pixel electrode 570.

Thereafter, the first transparent conductive material layer disposed below the metal material layer may be patterned. The first transparent conductive material may remain only in a region in which the metal material layer is disposed and may be removed from the remaining region. In the first transparent conductive material layer patterned in this way, the first transparent conductive material layer disposed below the second gate electrode layer 563*b* of the third electrode 563 may become the first gate electrode layer 563*a* of the third electrode 563, and the metal material layer disposed below the second layer 570*b* of the pixel electrode 570 may become the first layer 570*a* of the pixel electrode 570.

Through such a process, the third electrode 563 of a triple layer and the pixel electrode 570 of a triple layer are formed through the same process, thereby simplifying a process.

Then, as shown in FIG. 40, the bank 670, which has an opening exposing a portion of an upper surface of the third layer 570C of the pixel electrode 570, may be formed.

The bank 670 may overlap the transistor and the storage capacitor Cst, but this is merely an example. The bank 670 may not overlap at least one of the transistor and the storage capacitor Cst.

Next, a method of manufacturing the display device shown in FIG. 10A will be described below with reference to FIGS. 41 to 44.

FIGS. 41 to 44 are schematic views illustrating processes of manufacturing the display device shown in FIG. 10A.

Although FIG. 10 illustrates a structure in which the gate insulating film 602 includes the first to third gate insulating film portions 602*a*, 602*b*, and 602*c*, for convenience of description, in FIGS. 41 to 44, a structure in which the gate insulating film 602 includes the third gate insulating film portion 602*c* of FIG. 10A will be mainly described.

Figure 42:
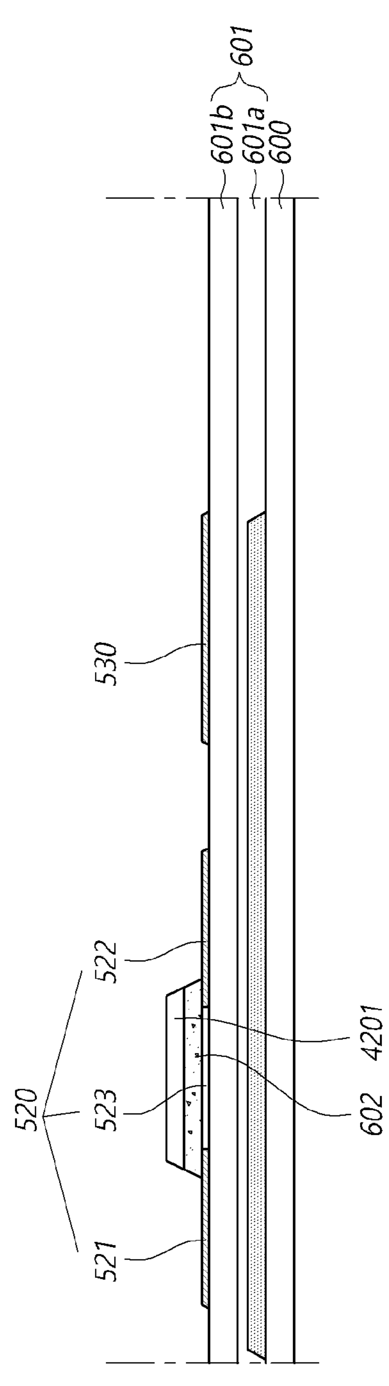

First, referring to FIG. 42, the LS 510 and a buffer layer 60 may be disposed on the substrate 600.

Next, an active material may be deposited on the buffer layer 601 and patterned to form a first active layer pattern 4120 and a second active layer pattern 4221.

Thereafter, referring to FIG. 42, after a gate insulating film material is deposited on the substrate 600 on which the first and second active layer patterns 4120 and 4221 are disposed, the gate insulating film material may be patterned through a dry etching process to form the gate insulating film 602.

Specifically, as shown in FIG. 42, a photoresist pattern 4201 is formed only at a position at which the gate insulating film material will remain after being removed. Then, through a dry etching process, only the gate insulating film material positioned below the photoresist pattern 4201 remains, and the remaining gate insulating film material is removed to form the gate insulating film 602.

In the dry etching process of forming the gate insulating film 602, carbon tetrafluoromethane (CF4), nitrogen trifluoride (NF3), sulfur hexafluoride (SF6), and helium (He) gases may be used, and in such a process, a portion of the first active layer pattern and the entirety of the second active layer pattern may have conductivity.

Specifically, the first active layer pattern may have conductivity in a region from which the gate insulating film material is removed through a dry etching process, thereby forming the first active layer 520 including the first and second regions 521 and 522 that are conductive regions may be formed.

The second active layer pattern may have conductivity to become the second active layer 530.

Meanwhile, although FIG. 42 illustrates a structure in which a width of the channel region 523 of the first active layer 520 is smaller than a width of the gate insulating film 602, the width of the channel region 523 of the first active layer 520 of the display device according to embodiments of the present disclosure may be variously changed according to process conditions for forming the gate insulating film 602. For example, the width of the channel region 523 of the first active layer 520 may be greater than or equal to the width of the gate insulating film 602.

Here, the width of the channel region 523 of the first active layer 520 and the width of the gate insulating film 602 may each be a minimum length in a direction perpendicular to a direction in which the buffer layer 601 is stacked on the substrate 600 in a cross section.

After the gate insulating film 602 is formed, the photoresist pattern 4201 disposed on the gate insulating film 602 may be removed.

Figure 43:
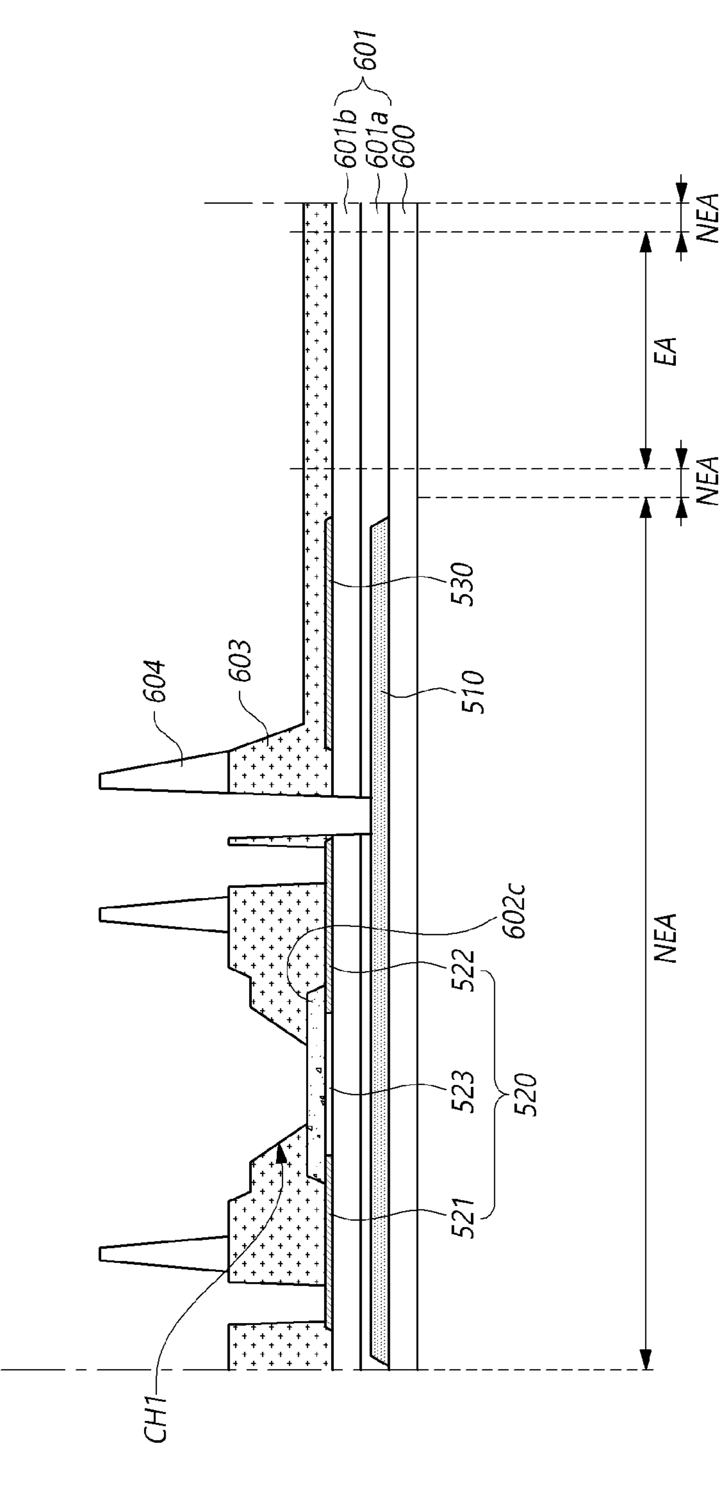

Then, referring to FIG. 43, the first insulating film 603 and the second insulating film 604 may be formed on the substrate 600 on which the gate insulating film 602 is formed.

Subsequently, referring to FIG. 44, an electrode material may be deposited on the substrate 600 and patterned to form the first electrode 551, the second electrode 552, and the third electrode 563.

A pixel electrode material may be deposited on the substrate, on which the first to third electrodes 551, 552, and 563 are formed, and patterned to form the pixel electrode 570 on the first and second insulating films 603 and 604.

Figure 44:
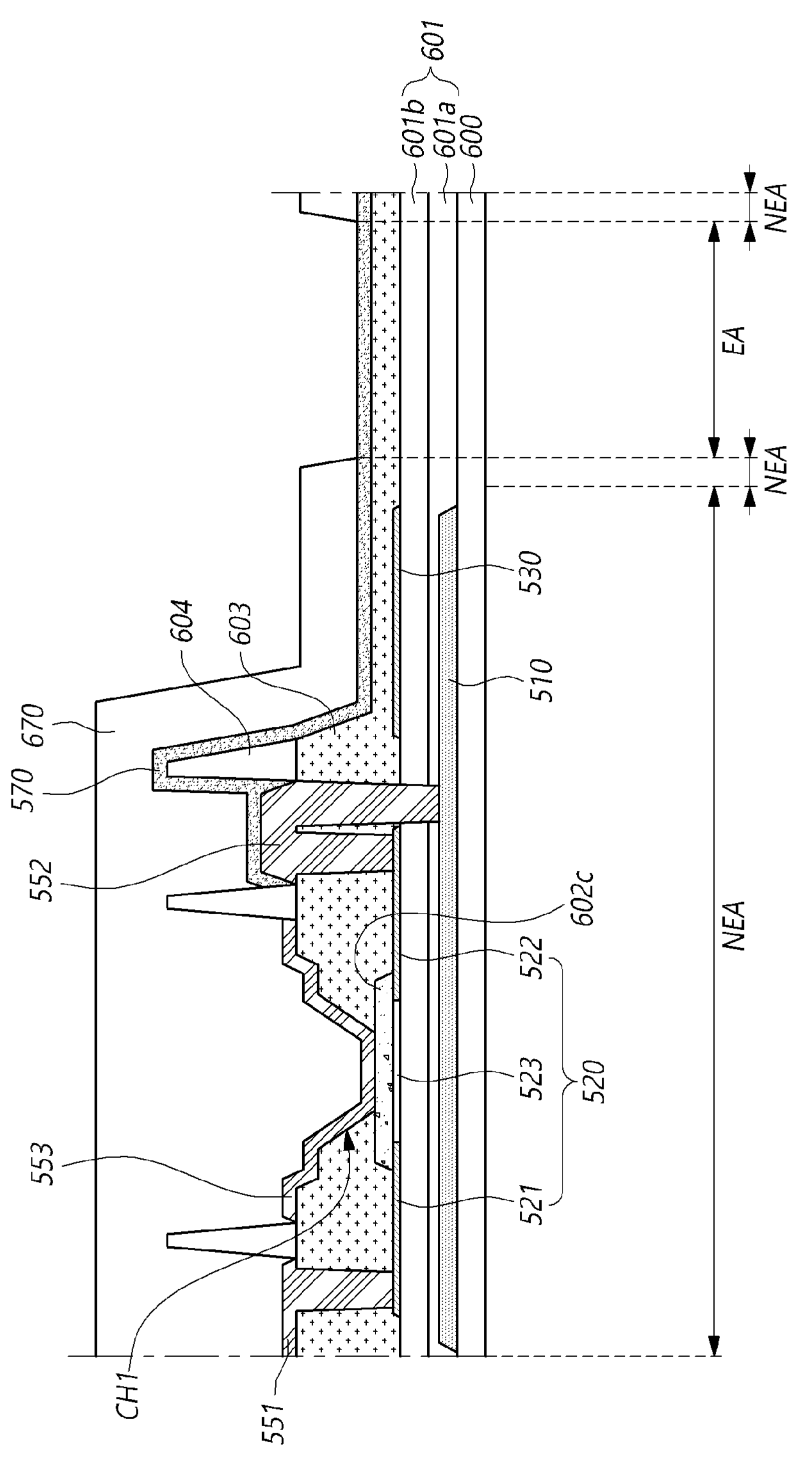

Then, as shown in FIG. 44, the bank 670 may be formed on a portion of the pixel electrode 570 on the first to third electrodes 551, 552, and 563.

A process in which the first electrode 551, the second electrode 552, and the third electrode 563 are formed through the same process, and the pixel electrode 570 is formed through a different process from the first to third electrodes 551, 552, and 563 has been described with reference to FIGS. 41 to 44, but a process of manufacturing the display device according to embodiments is not limited thereto.

Figure 45:
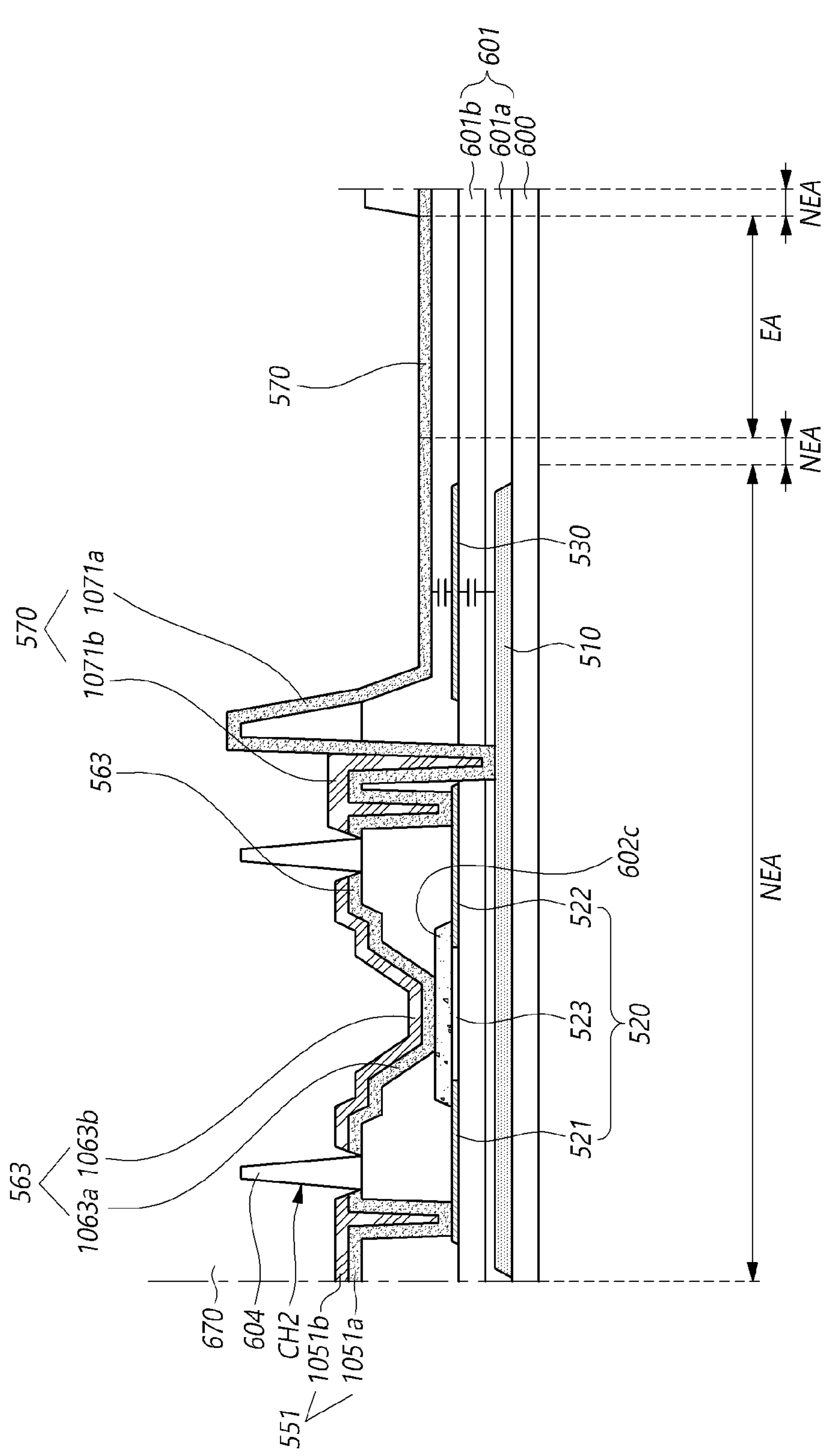
FIG. 45 is a diagram schematically illustrating operations of forming a first electrode, a third electrode, and a pixel electrode in the display device of FIG. 10B.
Figure 46:
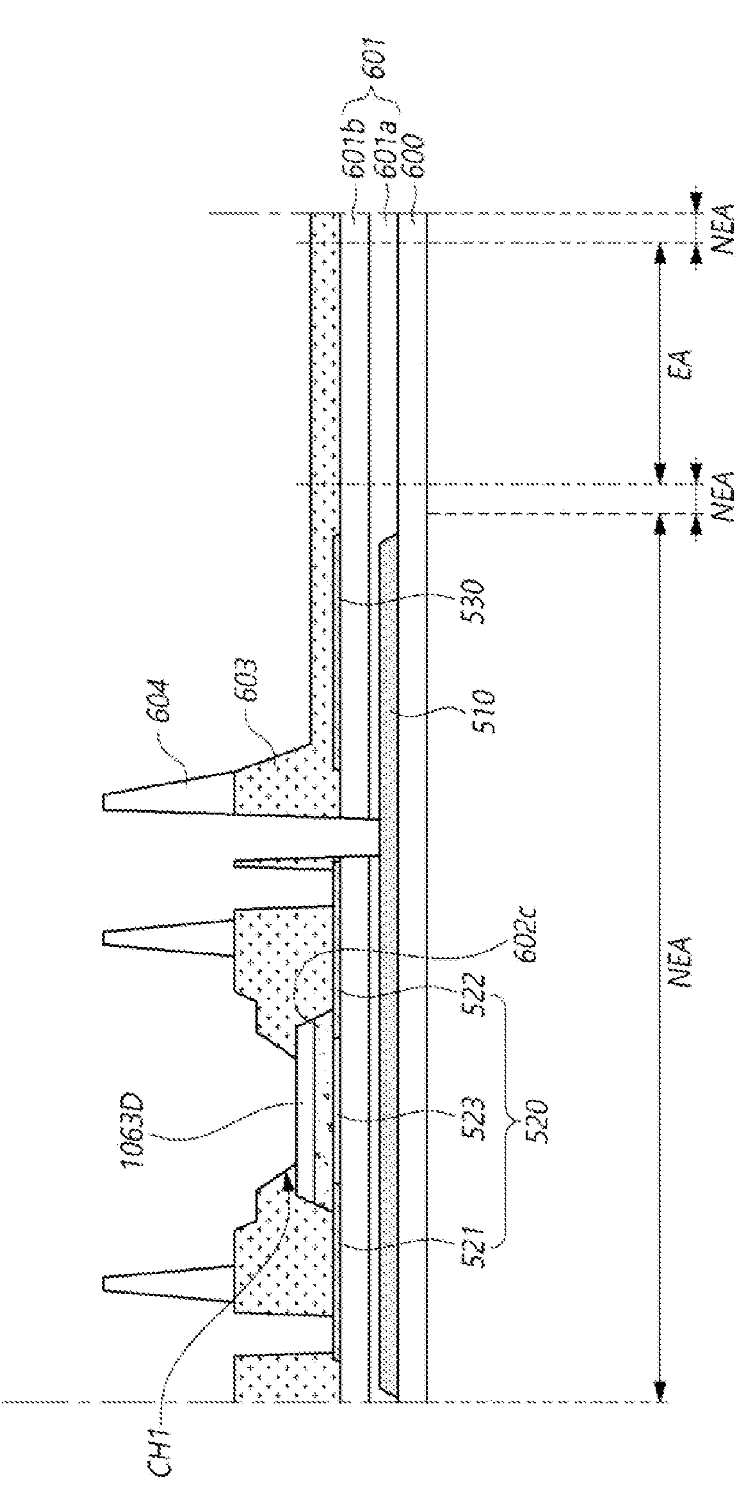
FIGS. 46 and 47 are schematic views illustrating operations of forming a first electrode, a third electrode, and a pixel electrode of the display device shown in FIG. 10D.
Figure 47:
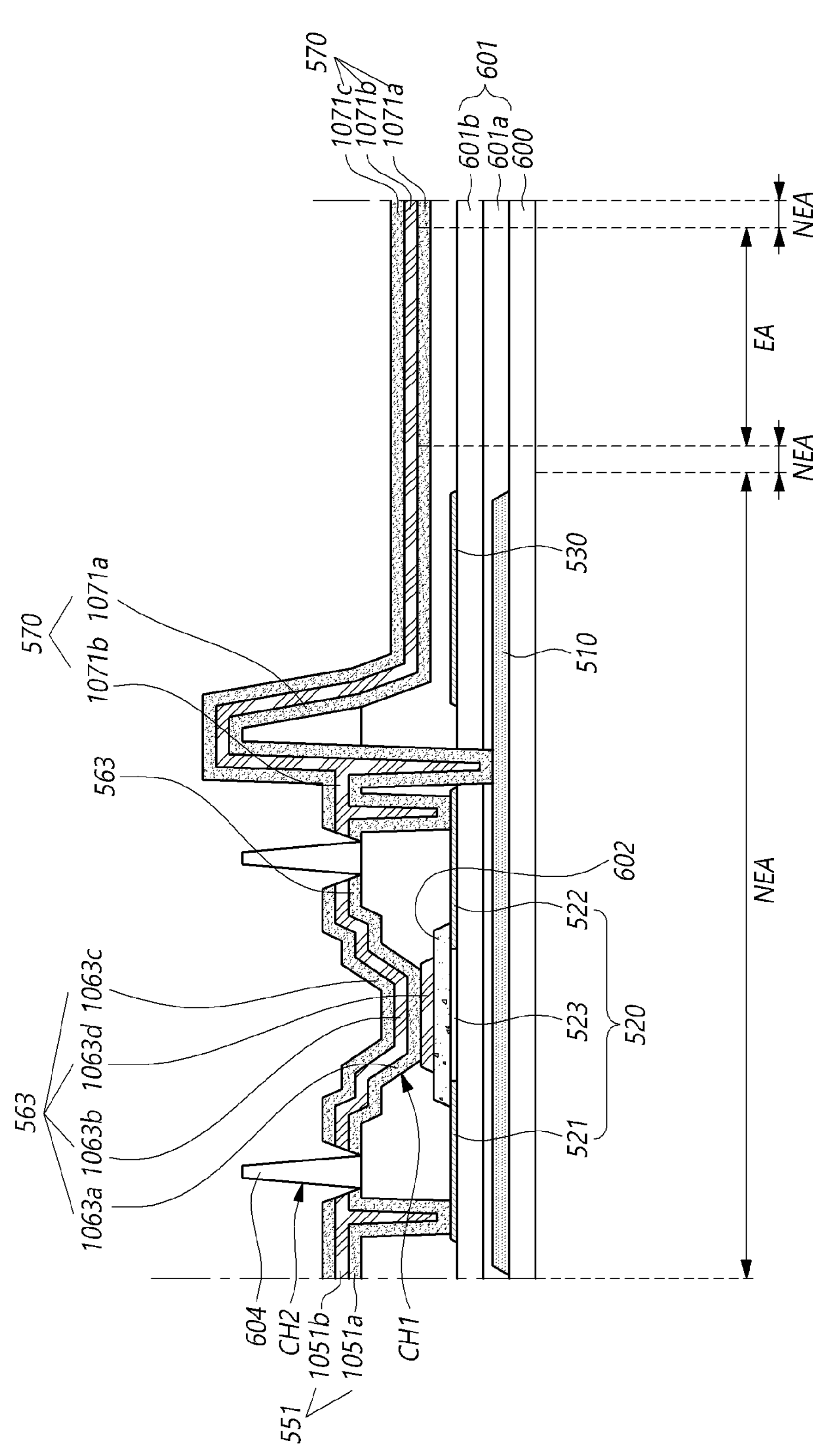

FIG. 45 is a schematic view illustrating operations of forming the first electrode 551, the third electrode 563, and the pixel electrode 570 in the display device of FIG. 10B, and FIGS. 46 and 47 are schematic views illustrating operations of forming the first electrode 551, the third electrode 563, and the pixel electrode 570 in the display device of FIG. 10D.

Figure 41:
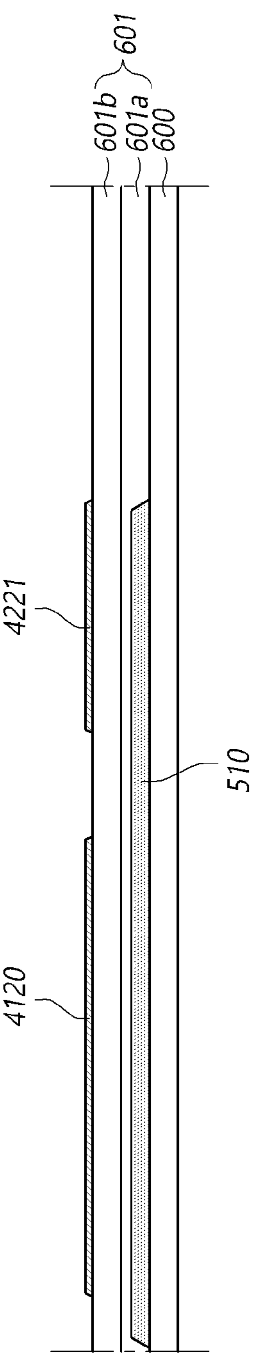
FIGS. 41 to 44 are schematic views illustrating processes of manufacturing the display device shown in FIG. 10A.

Meanwhile, process operations before the first electrode, the third electrode 563, and the pixel electrode 570 are formed in FIG. 45 may be the same as those described with reference to FIGS. 41 to 43.

Referring first to FIG. 45, a transparent conductive material layer may be formed on the substrate 600 on which the first and second insulating films 603 and 604 are formed, and a metal material layer may be formed on the transparent conductive material layer.

Thereafter, the metal material layer may be patterned using a halftone mask. A portion of the patterned metal material layer may be disposed on a portion of an upper surface of the first insulating film 603 and may also be disposed in a region corresponding to a contact hole of the first insulating film 603 exposing a portion of an upper surface of the first region 521 of the first active layer 520 to finally become the second electrode layer 1051*b* of the first electrode 551.

In addition, another portion of the patterned metal material layer may be disposed on a portion of the upper surface of the first insulating film 603 and may also be disposed in a region corresponding to the first hole CH1 of the first insulating film 603 to finally become the second electrode layer 1063*b* of the third electrode 563.

Furthermore, still another portion of the patterned metal material layer may be disposed on a portion of the upper surface of the first insulating film 603 and may also be disposed in regions corresponding to a contact hole of the first insulating film 603 exposing a portion of an upper surface of the second region 522 of the first active layer 520 and a contact hole of the first insulating film 603 and the buffer layer 601 exposing a portion of an upper surface of the LS 510 to finally become the second layer 1071*b* of the pixel electrode 570.

Thereafter, the transparent conductive material layer disposed below the metal material layer may be patterned using the patterned metal material layer and a photoresist pattern as a mask. After the transparent conductive material is patterned, the transparent conductive material may remain below metal material layers (the second electrode layer 1051*b*, the second gate electrode layer 1063*b*, and the second layer 1071*b*) which are patterned and remain in a previous operation.

Specifically, a portion of the patterned transparent conductive material layer may become the first electrode layer 1051*a* of the first electrode 551 disposed below the second electrode layer 1051*b* of the first electrode 551.

Also, another portion of the patterned transparent conductive material layer may become the first gate electrode layer 1063*a* disposed below the second gate electrode layer 1063*b* of the third electrode 563.

In addition, still another portion of the patterned transparent conductive material layer may become the first layer 1071*a* disposed below the second layer 1071*b* of the pixel electrode 570. Referring to FIG. 45, the first layer 1071*a* of the pixel electrode 570 may include a region overlapping the second layer 1071*b* and may be formed to extend to a second active layer 530 and the emission area.

Subsequently, operations of forming the first electrode 551, the third electrode 563, and the pixel electrode 570 of the display device of FIG. 10D will be described below with reference to FIGS. 46 and 47.

Process operations before the first electrode, the third electrode 563, and the pixel electrode 570 are formed in FIGS. 46 and 47 may be the same as those described with reference to FIGS. 41 and 42.

First, referring to FIG. 46, a first metal material layer for forming the additional gate electrode layer 1063*d* may be formed on the substrate 600 on which the gate insulating film 602 is formed.

The first metal material layer may be patterned through a process including wet etching or the like to remain only on the gate insulating film 602 disposed on the channel region 523 of the first active layer 520.

After the additional gate insulating layer 1063*d* is formed in this way, the first and second insulating films 603 and 604 may be formed. Specifically, after a first insulating film material and a second insulating film material may be sequentially deposited on the substrate 600, the second insulating film material may be patterned, and then the first insulating film material may be patterned. A dry etching process may be used to pattern the first insulating film material.

Subsequently, as shown in FIG. 47, the first electrode 551, the first to third gate insulating layers 1063*a*, 1063*b*, and 1063*c* of the third electrode 563, and the pixel electrode 570 may be formed.

Specifically, a first transparent conductive material layer, a second metal material layer, and a second transparent conductive material layer may be sequentially formed on the substrate 600 on which the first and second insulating films 603 and 604 are formed.

Then, the second transparent conductive material layer, the second metal material layer, and the first transparent conductive material layer may be sequentially patterned to form the first electrode 551, the first to third gate insulating layers 1063*a*, 1063*b*, and 1063*c* of the third electrode 563, and the pixel electrode 570 through the same process.

Meanwhile, although a process of forming the first electrode 551, the third electrode 563, and the pixel electrode 570 shown in FIG. 10D is shown in FIGS. 46 and 47, when a process of forming and patterning the second transparent conductive material layer in FIG. 47 is omitted, the first electrode 551 the third electrode 563, and the pixel electrode 570 shown in FIG. 10C may be formed.

The above-described examples of the present disclosure will be briefly described below.

Examples of the present disclosure may provide a display panel and a display device including a first active layer 520 which is disposed on a substrate and includes a channel region 523, a first region 521 positioned at a first side of the channel region 523, and a second region 522 positioned at a second side of the channel region 523, a gate insulating film 602 disposed on the first active layer 520, a first electrode 551 disposed on the gate insulating film 602 and electrically connected to the first region 521, a second electrode 552 disposed on the gate insulating film 602 and electrically connected to the second region 522, a first insulating film 603 which is disposed on the gate insulating film 602 and has a first hole CH1 overlapping at least a portion of the channel region, a second insulating film 604 which is disposed on the first insulating film 603 and has a second hole CH2 overlapping at least a portion of the first hole CH1, and a third electrode 563 disposed in the first hole CH1 and disposed to overlap the channel region 523 in the first hole CH1.

A display device according to embodiments of the disclosure includes a substrate, a first active layer disposed on the substrate and including a channel region, a first region positioned at a first side of the channel region, and a second region positioned at a second side of the channel region, a gate insulating film disposed on the first active layer, a first electrode disposed on the gate insulating film and electrically connected to the first region, a second electrode disposed on the gate insulating film and electrically connected to the second region, a first insulating film disposed on the gate insulating film and having a first hole overlapping at least a portion of the channel region, and a third electrode disposed in the first hole and disposed to overlap the channel region in the first hole.

In addition, a region of the first active layer not overlapping the gate insulating film may be a conductive region.

The first region and the second region may include conductive regions.

The first region may include a first auxiliary region that is a non-conductive region and a second auxiliary region that extends from the first auxiliary region and is a conductive region, and the second region may include a third auxiliary region that is a non-conductive region and a fourth auxiliary region that extends from the third auxiliary region and is a conductive region. The second and fourth auxiliary regions may include regions that do not overlap the first electrode, the second electrode, and the gate insulating film.

The second auxiliary region may be disposed between the first auxiliary region and the channel region, and the fourth auxiliary region may be disposed between the second auxiliary region and the channel region.

The gate insulating film may include a first gate insulating film portion overlapping a portion of the first region, a second gate insulating film portion overlapping a portion of the second region, and a third gate insulating film portion overlapping the entirety of the channel region.

At least a portion of the second auxiliary region, which is disposed at one side of the channel region of the first active layer and is a conductive region, may overlap a region between the first gate insulating film portion and the third gate insulating film portion, and at least a portion of the fourth auxiliary region, which is disposed at the other side of the channel region of the first active layer and is a conductive region, may overlap a region between the second gate insulating film portion and the third gate insulating film portion.

At least a portion of an upper surface of the third gate insulating film portion may overlap the first hole of the first insulating film.

The first insulating film may include at least one stepped portion present in the first hole.

The third electrode may overlap at least a portion of each of the first region and the second region.

Each of the first electrode and the second electrode may be one of a source electrode and a drain electrode, and the third electrode may be a gate electrode.

The display device may include a second insulating film which is disposed on the first insulating film and has a second hole overlapping at least a portion of the first hole, and the third electrode may be disposed inside the first hole and the second hole and disposed on a portion of an upper surface of the second insulating film.

The third electrode may include a first gate electrode layer and a second gate electrode layer, the first gate electrode layer may be disposed on the gate insulating film overlapping the channel region, and the second gate electrode layer may be disposed on the first gate electrode layer and disposed inside the first hole and the second hole and may be disposed on a portion of the upper surface of the second insulating film.

The third electrode may further include an additional gate electrode layer, and the additional gate electrode layer may be disposed between the gate insulating film disposed on the channel region and the first insulating film and may overlap the first hole of the first insulating film.

The third electrode may further include a third gate electrode layer, and the third gate electrode layer may be disposed on the second gate electrode layer.

The first and third gate electrode layers may be made of a transparent conductive material, and the second gate electrode layer may be made of a metal material.

The display device may further include a pixel electrode disposed on the second insulating film, the pixel electrode may include a first pixel electrode layer, and the first pixel electrode layer may include a transparent conductive material.

The pixel electrode may include a second pixel electrode layer disposed on the first pixel electrode layer and a third pixel electrode layer disposed on the second pixel electrode layer.

The first pixel electrode layer may be disposed to be coplanar with the first gate electrode layer of the third electrode, the second pixel electrode layer may be disposed to be coplanar with the second gate electrode layer of the third electrode, and the third pixel electrode layer may be disposed to be coplanar with the third gate electrode layer of the third electrode.

The display device may further include an LS disposed below the first active layer, and the LS may overlap a conductive region of the second active layer spaced apart from the first active layer. The display device may include a pixel electrode overlapping the LS and the conductive region of the second active layer, and the LS, the conductive region of the second active layer, and the pixel electrode may overlap each other to form a storage capacitor.

The pixel electrode may extend to an emission area, and on the pixel electrode in the emission area, the display device may further include an organic layer including an emission layer and a common electrode disposed on the organic layer The first electrode, the second electrode, and the third electrode may be disposed on the first insulating film, the second insulating film may include a contact hole exposing a portion of an upper surface of the second electrode, and the second electrode may be electrically connected to the pixel electrode through the contact hole.

The display device may include a first auxiliary electrode and a second auxiliary electrode disposed on the first active layer, the first auxiliary electrode may be disposed in the first region, the second auxiliary electrode may be disposed in the second region, and the first and second auxiliary electrodes may include a metal material.

The first auxiliary electrode and the second auxiliary electrode may further include a transparent conductive material layer, a transparent conductive oxide layer, an oxynitride layer, or an organic layer disposed between the first active layer and a layer made of the metal material.

The first auxiliary electrode may overlap a portion of the conductive region of the first region of the first active layer, and the second auxiliary electrode may overlap a portion of the conductive region of the second region of the first active layer.

The display device may include a second active layer disposed to be coplanar with the first active layer, a third auxiliary electrode disposed on a portion of an upper surface of the second active layer, a metal layer disposed on the third auxiliary electrode, a pixel electrode disposed on the metal layer, and an LS disposed below the second active layer, and the LS, the third auxiliary electrode, and the metal layer may constitute a first storage capacitor.

The display device may include a fourth auxiliary electrode disposed on the second active layer and spaced apart from the third auxiliary electrode, and a pixel electrode disposed on the fourth auxiliary electrode, and the LS, the fourth auxiliary electrode, and the pixel electrode may constitute a second storage capacitor.

The first storage capacitor and the second storage capacitor may be connected in parallel.

In addition, a display device according to embodiments of the disclosure may include a first active layer disposed on a substrate and including a channel region, a first region positioned at a first side of the channel region, and a second region positioned at a second side of the channel region, a gate insulating film disposed on the first active layer, a first electrode disposed on the gate insulating film and electrically connected to the first region, a second electrode disposed on the gate insulating film and electrically connected to the second region, a first insulating film disposed on the gate insulating film and having a first hole overlapping at least a portion of the channel region, and a third electrode disposed in the first hole and disposed to overlap the channel region in the first hole.

In addition, a method of manufacturing a display panel according to embodiment of the present disclosure may include forming an LS on a substrate, forming a buffer layer on the substrate on which the LS is disposed, depositing an active material on the buffer layer and patterning the active material to form a first active pattern and one or more second active patterns, depositing a gate insulating film material on the first active pattern and the second active pattern and forming a plurality of contact holes in the gate insulating film material and the buffer layer through a first dry etching process to form a gate insulating film, depositing an electrode material on the gate insulating film and patterning the electrode material to form a first electrode and a second electrode, depositing a first insulating film material on the substrate on which the first and second electrodes are formed and patterning the first insulating film material to form holes and contact holes, and depositing a second electrode material on the first insulating film and patterning the second electrode material and to form a third electrode.

In the forming of the gate insulating film, a material of the gate insulating film may be formed into a first gate insulating film portion, a second gate insulating film portion, and a third gate insulating film portion which at least partially overlap an upper surface of a first active layer pattern and may be removed on a second active layer pattern.

The forming of the first electrode and the second electrode may include forming a first photoresist pattern disposed on the electrode material and overlapping a portion of each of the first gate insulating film portion and the first active layer pattern, a second photoresist pattern overlapping a portion of each of the second gate insulating film portion and the first active layer pattern, a third photoresist pattern overlapping a portion of each of the third insulating film portion and the first active layer pattern, patterning the electrode material using the first to third photoresist patterns as a mask to form a first electrode, a second electrode, and an electrode pattern, allowing a portion of the first active layer pattern and the second active layer pattern to have conductivity through a dry etching process and form a first active layer and a second active layer, and removing the first and second photoresist patterns disposed on the first and second electrodes.

A conductive region of the first active layer may include a region between the first gate insulating film portion and the third gate insulating film portion and a region between the second gate insulating film portion and the third gate insulating film portion, and the entirety of the second active layer may have conductivity.

The method may further include, before the deposition of the gate insulating film material for forming the gate insulating film, forming an auxiliary electrode material on a portion of the upper surface of the first active layer pattern and the entirety of an upper surface of the second active layer pattern, and patterning the auxiliary electrode material to form a first auxiliary electrode and a second auxiliary electrode spaced apart from each other on the first active layer pattern and form a third auxiliary electrode and a fourth auxiliary electrode on upper surfaces of two active layer patterns. The first and second active layer patterns may have conductivity in regions in contact with the first to fourth auxiliary electrodes.

The first auxiliary electrode may be disposed in a region between the first gate insulating film portion and the third gate insulating film portion, and the second auxiliary electrode may be disposed in a region between the second gate insulating film portion and the third gate insulating film portion.

The gate insulating film may include a portion surrounding one second active layer.

The patterning of the electrode material disposed on the gate insulating film may include forming the first photoresist pattern disposed on the electrode material and overlapping a portion of each of the first gate insulating film portion and the first active layer pattern, the second photoresist pattern overlapping a portion of each of the second gate insulating film portion and the first active layer pattern, forming the third photoresist pattern overlapping a portion of each of the third insulating film portion and the first active layer pattern, and a fourth photoresist pattern overlapping the gate insulating film disposed on the third auxiliary electrode, patterning the electrode material using the first to fourth photoresist patterns as a mask to form the first electrode, the second electrode, the electrode pattern, and a gate metal layer, removing a portion of the third gate insulating film through a dry etching process, allowing a portion of the first active layer to have conductivity to form the first active layer, and removing the third photoresist pattern disposed on the electrode patter, and removing the first, second, and fourth photoresist patterns.

In a second dry etching process, in the first active layer, a region between the first auxiliary electrode and the third gate insulating film portion and a region between the second auxiliary electrode and the third gate insulating film portion may additionally have conductivity.

The method may further include forming a second insulating film on the first insulating film, and the third electrode may be disposed in a hole formed in the first insulating film and the second insulating film and may be formed to overlap the gate insulating film disposed on a channel region of the first active layer.

The method may further include forming a pixel electrode on the first and second insulating films, and the third electrode and the pixel electrode may each be formed as a single layer and may include different materials.

The pixel electrode may also be formed in a process operation of forming the third electrode.

In still another aspect, embodiments of the present disclosure may provide a method of manufacturing a display panel, the method including forming a light shield on a substrate, forming a buffer layer on the substrate on which the light shield is disposed, forming an active material on the buffer layer and patterning the active material to form a first active pattern and one or more second active patterns, forming a gate insulating film material on the first active pattern and the second active pattern and forming a plurality of contact holes in the gate insulating film material and the buffer layer through a first dry etching process to form a gate insulating film, forming an electrode material on the gate insulating film and patterning the electrode material to form a first electrode and a second electrode, forming a first insulating film material on the substrate on which the first and second electrodes are formed and patterning the first insulating film material to form holes and contact holes, and forming a second electrode material on the first insulating film and patterning the second electrode material and form a third electrode.

According to examples of the present disclosure, there may be provided a display panel, a display device, and a method of manufacturing a display panel in which an electrode disposed on an active layer is disposed to overlap an entire channel region of the active layer and also overlap a portion of each of a first region and a second region disposed at both sides of the channel region of the active layer, thereby preventing the characteristics of a transistor from being degraded due to internal light being incident on the active layer.

According to examples of the present disclosure, there may be provided a display panel, a display device, and a method of manufacturing a display panel in which a thickness of an insulating film is designed such that a distance between electrodes of the transistor is increased, thereby preventing driving characteristics from being degraded due to an increase in parasitic capacitance.

According to examples of the present disclosure, there may be provided a display panel, a display device, and a method of manufacturing a display panel which include a plurality of storage capacitor electrodes and a plurality of storage capacitors connected in parallel to include a high-capacity storage capacitor.

The above description has been presented to enable any person skilled in the art to make and use the technical idea of the present disclosure, and has been provided in the context of a particular application and its requirements. Various modifications, additions and substitutions to the described examples will be readily apparent to those skilled in the art, and the general principles defined herein may be applied to other examples and applications without departing from the spirit and scope of the present disclosure. The above description and the accompanying drawings provide an example of the technical idea of the present disclosure for illustrative purposes only.

That is, the disclosed examples are intended to illustrate the scope of the technical idea of the present disclosure.

Claim language or other language reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

What is claimed is:

1. A display panel comprising:

a substrate;

a first active layer on the substrate and including a channel, a first region positioned at a first side of the channel, and a second region positioned at a second side of the channel;

a gate insulating film on the first active layer;

a first electrode on the gate insulating film and electrically connected to the first region;

a second electrode on the gate insulating film and electrically connected to the second region;

a first insulating film on the gate insulating film and including a first hole overlapping at least a portion of the channel;

a third electrode overlapping the first hole; and a light shield below the first active layer, wherein:

the light shield overlaps a conductive region of a second active layer spaced apart from the first active layer;

the display panel includes a pixel electrode overlapping the light shield and the conductive region of the second active layer; and the light shield, the conductive region of the second active layer, and the pixel electrode overlap each other to form a storage capacitor.

2. The display panel of claim 1, wherein a region of the first active layer not overlapping the gate insulating film is a conductive region.

3. The display panel of claim 2, wherein the first region and the second region include conductive regions.

4. The display panel of claim 1, wherein the gate insulating film includes:

a first gate insulator overlapping a portion of the first region;

a second gate insulator overlapping a portion of the second region; and a third gate insulator overlapping an entirety of the channel-region.

5. The display panel of claim 4, wherein at least a portion of an upper surface of the third gate insulator overlaps the first hole.

6. The display panel of claim 1, wherein the first insulating film includes at least one stepped portion in the first hole.

7. The display panel of claim 1, wherein the third electrode overlaps at least a portion of each of the first region and the second region.

8. The display panel of claim 1, wherein:

each of the first electrode and the second electrode is one of a source electrode and a drain electrode; and the third electrode is a gate electrode.

9. The display panel of claim 1, further comprising:

a second insulating film on the first insulating film and having a second hole overlapping at least a portion of the first hole, wherein the third electrode is inside the first hole and the second hole and covers a portion of an upper surface of the second insulating film.

10. The display panel of claim 9, wherein:

the third electrode includes a first gate electrode layer, a second gate electrode layer, and a third gate electrode layer;

the first gate electrode layer is on the gate insulating film overlapping the channel;

the second gate electrode layer is on the first gate electrode layer, in the first hole and the second hole, and covers the upper surface of the second insulating film; and the third gate electrode layer is on the second gate electrode layer.

11. The display panel of claim 10, wherein:

the first gate electrode layer and the third gate electrode layer are made of a metal material; and the second gate electrode layer is made of a transparent conductive material.

12. The display panel of claim 10, wherein:

the pixel electrode is on the second insulating film; and the pixel electrode is coplanar with the second gate electrode layer.

13. The display panel of claim 9, wherein:

the first electrode, the second electrode, and the third electrode are on the first insulating film;

the second insulating film includes a contact hole exposing a portion of an upper surface of the second electrode; and the second electrode is electrically connected to the pixel electrode through the contact hole.

14. The display panel of claim 1, wherein:

the pixel electrode extends to an emission area of the display panel; and in the emission area, the display panel further includes an organic layer including an emission layer and a common electrode on the pixel electrode.

15. The display panel of claim 1, wherein the pixel electrode is electrically connected to the second electrode.

16. The display panel of claim 1, further comprising:

a first auxiliary electrode and a second auxiliary electrode on the first active layer;

wherein:

the first auxiliary electrode is on the first region;

the second auxiliary electrode is on the second region; and the first auxiliary electrode and the second auxiliary electrode include a metal material or a transparent conductive material.

17. The display panel of claim 16, wherein the first active layer includes conductive regions between the first region and the channel and between the second region and the channel.

18. A display panel comprising:

a substrate;

a first active layer on the substrate and including a channel, a first region positioned at a first side of the channel, and a second region positioned at a second side of the channel;

a gate insulating film on the first active layer;

a first electrode on the gate insulating film and electrically connected to the first region;

a second electrode on the gate insulating film and electrically connected to the second region;

a first insulating film on the gate insulating film and including a first hole overlapping at least a portion of the channel;

a third electrode overlapping the first hole;

a first auxiliary electrode and a second auxiliary electrode on the first active layer;

a second active layer that is coplanar with the first active layer;

a third auxiliary electrode on a portion of an upper surface of the second active layer;

a metal layer on the third auxiliary electrode;

a pixel electrode on the metal layer; and a light shield below the second active layer, wherein:

the first auxiliary electrode is on the first region;

the second auxiliary electrode is on the second region;

the first auxiliary electrode and the second auxiliary electrode include a metal material or a transparent conductive material; and the light shield, the third auxiliary electrode, and the metal layer constitute a first storage capacitor.

19. The display panel of claim 18, further comprising:

a fourth auxiliary electrode on the second active layer and spaced apart from the third auxiliary electrode, wherein:

the pixel electrode is on the fourth auxiliary electrode; and the light shield, the fourth auxiliary electrode, and the pixel electrode constitute a second storage capacitor.

20. The display panel of claim 19, wherein the first storage capacitor and the second storage capacitor are connected in parallel.

21. A display device comprising:

a substrate;

a first active layer on the substrate;

a gate insulating film on the first active layer;

a first electrode on the gate insulating film and electrically connected to the first active layer;

a second electrode disposed on the gate insulating film and electrically connected to the first active layer;

an insulating film having a first thickness in a non-emission area and a second thickness in an emission area, wherein the insulating film overlaps the gate insulating film in a first region and the first thickness has a larger value than the second thickness;

a third electrode positioned in a hole within the insulating film and partially overlapping the first active layer in the hole; and a light shield below the first active layer, wherein:

the light shield overlaps a conductive region of a second active layer spaced apart from the first active layer;

the display device further includes a pixel electrode overlapping the light shield and the conductive region of the second active layer; and the light shield, the conductive region of the second active layer, and the pixel electrode overlap each other to form a storage capacitor.

* * * * *